US012642054B2

(12) United States Patent
Leeser et al.

(10) Patent No.: US 12,642,054 B2
(45) Date of Patent: May 26, 2026

(54) MULTI-STATION TOOL WITH ROTATABLE TOP PLATE ASSEMBLY

(71) Applicant: Lam Research Corporation, Fremont, CA (US)

(72) Inventors: Karl Frederick Leeser, West Linn, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 339 days.

(21) Appl. No.: 18/250,510

(22) PCT Filed: Oct. 26, 2021

(86) PCT No.: PCT/US2021/056719
§ 371 (c)(1),
(2) Date: Apr. 25, 2023

(87) PCT Pub. No.: WO2022/093873
PCT Pub. Date: May 5, 2022

(65) Prior Publication Data
US 2023/0420289 A1 Dec. 28, 2023

Related U.S. Application Data

(60) Provisional application No. 63/198,582, filed on Oct. 28, 2020.

(51) Int. Cl.
*H01L 21/687* (2006.01)
*H01L 21/67* (2006.01)
(Continued)

(52) U.S. Cl.
CPC ...... *H10P 72/7618* (2026.01); *H10P 72/0441* (2026.01); *H10P 72/0462* (2026.01);
(Continued)

(58) Field of Classification Search
CPC ......... H01L 21/68764; H01L 21/67126; H01L 21/6719; H01L 21/68735; H01L 21/68742; H01L 21/68771
(Continued)

(56) References Cited

U.S. PATENT DOCUMENTS

| 5,667,592 A | 9/1997 | Boitnott et al. |
| 10,763,088 B2 * | 9/2020 | Uemura ............ H01J 37/32834 |
| | | 118/715 |

(Continued)

FOREIGN PATENT DOCUMENTS

| JP | S6366494 A | 3/1988 |
| JP | 2006093201 A | 4/2006 |

(Continued)

OTHER PUBLICATIONS

International Search Report and Written Opinion dated Feb. 21, 2022, in Application No. PCT/US2021/056719.

(Continued)

*Primary Examiner* — Parviz Hassanzadeh
(74) *Attorney, Agent, or Firm* — Weaver Austin Villeneuve & Sampson LLP

(57) ABSTRACT

Semiconductor processing tools with multi-station processing chambers are provided that include a rotational bearing mechanism that allows a top plate assembly thereof to be rotated during maintenance and service operations. In some implementations, a vertical displacement mechanism may be provided that may be used to transition the top plate assembly between a first configuration and a second configuration, with the top plate assembly being rotatable in at least the second configuration.

20 Claims, 28 Drawing Sheets

(51) Int. Cl.
    *H10P 72/00*       (2026.01)
    *H10P 72/76*       (2026.01)

(52) U.S. Cl.
    CPC ...... *H10P 72/7611* (2026.01); *H10P 72/7612*
        (2026.01); *H10P 72/7621* (2026.01)

(58) Field of Classification Search
    USPC ......................................................... 118/730
    See application file for complete search history.

(56)              References Cited

U.S. PATENT DOCUMENTS

| | | | | |
|---|---|---|---|---|
| 2003/0176074 A1* | 9/2003 | Paterson | ........... | H01J 37/32458 |
| | | | | 438/709 |
| 2006/0099053 A1* | 5/2006 | Saito | ................. | H01L 21/67126 |
| | | | | 414/217 |
| 2009/0139453 A1* | 6/2009 | Chen | ................... | H01J 37/3244 |
| | | | | 118/23 I |
| 2015/0311042 A1* | 10/2015 | Son | .................... | H01L 21/6719 |
| | | | | 118/723 R |
| 2018/0033674 A1 | 2/2018 | Jeong et al. | | |
| 2020/0087774 A1 | 3/2020 | Keigler et al. | | |
| 2023/0154766 A1* | 5/2023 | Lee | .................... | H01L 21/6719 |
| | | | | 118/715 |

FOREIGN PATENT DOCUMENTS

| | | | |
|---|---|---|---|
| JP | 2012074480 A | 4/2012 | |
| KR | 20150101785 A | 9/2015 | |
| KR | 101796647 B1 | 11/2017 | |
| TW | 200532051 A | 10/2005 | |
| TW | 201428129 A | 7/2014 | |

OTHER PUBLICATIONS

International Preliminary Report on Patentability dated May 11, 2023 in PCT Application No. PCT/US2021/056719.
JP Office Action dated Aug. 19, 2025 in JP Application No. 2023-524556, with English Translation.
TW Office Action dated Nov. 13, 2024 in TW Application No. 110139622 with English translation.
JP Office Action dated Feb. 17, 2026 in JP Application No. 2023524556, with English Translation.
KR Office Action dated Mar. 31, 2026 in KR Application No. 10-2025-7028548, with English Translation.

* cited by examiner

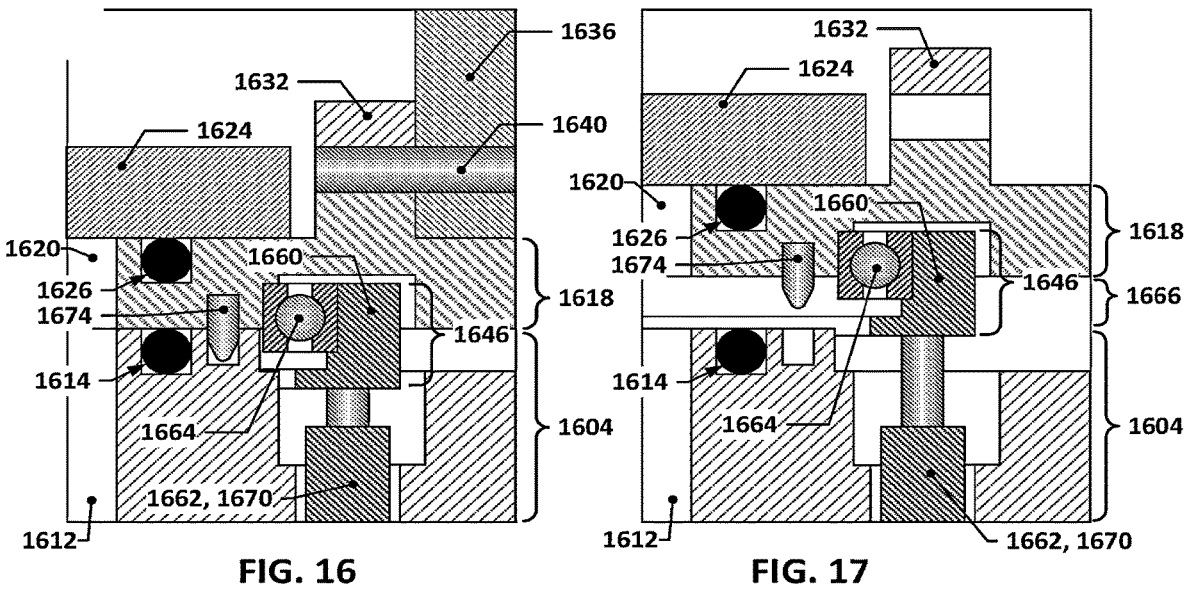
FIG. 16
FIG. 17
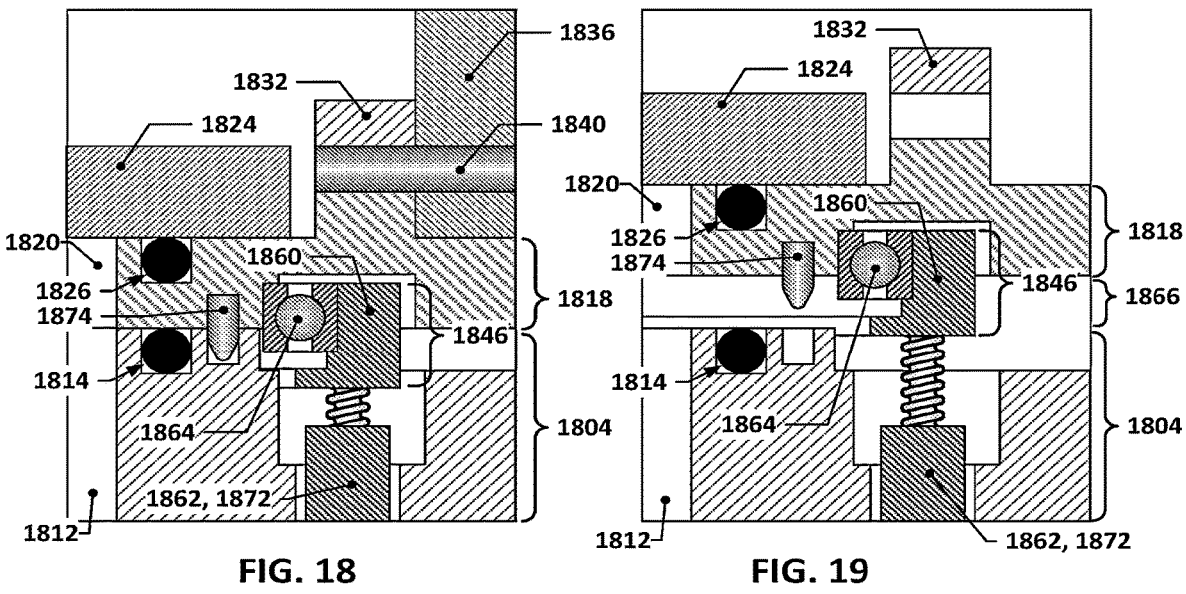
FIG. 18
FIG. 19

MULTI-STATION TOOL WITH ROTATABLE TOP PLATE ASSEMBLY

RELATED APPLICATION(S)

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor processing tools commonly include one or more semiconductor processing chambers that provide an isolated environment within which to process semiconductor wafers. In some semiconductor processing tools, multiple semiconductor wafers may be processed within a single chamber. In such semiconductor processing tools, such a chamber may include a plurality of wafer processing stations, each having its own wafer support and, for example, gas distributor positioned thereabove.

One common architecture for such multi-station chambers is the quad-station module (QSM), which features four wafer processing stations arranged in a square pattern within a single, large chamber. A rotational indexer is typically provided in such QSM tools to allow wafers to be moved from station to station within the processing chamber. In some such QSM tools, features may be provided that allow for some degree of isolation between wafer stations, e.g., inert gas curtains may be provided in between wafer stations to reduce the chances of processing gases migrating from one wafer station to another.

QSM tools typically include a large top plate assembly that is used to seal a large opening in the top of the QSM chamber housing; the top plate assembly typically covers the opening and all four wafer stations and provides support for systems such as the gas distributors (also referred to as showerheads in the industry), valving, sensors, and various other pieces of equipment. QSM tools also typically include a top assembly, which may be a large equipment bay that is positioned above the top plate assembly and is able to be translated vertically through the use of linear actuators. The top plate assembly in such QSM tools is often able to be releasably connected with the top assembly to allow the top plate assembly to be lifted clear of the chamber housing to facilitate access to the interior of the chamber housing, e.g., for maintenance, cleaning, calibration, and other activities.

SUMMARY

Details of one or more implementations of the subject matter described in this specification are set forth in the accompanying drawings and the description below. Other features, aspects, and advantages will become apparent from the description, the drawings, and the claims.

The present inventors realized that some multi-station tools may be somewhat challenging to service due to their size and the potential inaccessibility of some portions of the tools. For example, some multi-station tools may actually feature a plurality of multi-station processing chambers, e.g., three QSM processing chambers that are arranged about a central hub, and some portions of the multi-station chambers may be less accessible than other portions. For example, in the three QSM configuration discussed above, the three QSM processing chambers may each be positioned along a different edge of a generally square transfer chamber that may be used to transfer wafers between each of the QSM processing chambers. The fourth edge of the transfer chamber may be adjacent to, for example, an equipment front end module or other system used to introduce and remove semiconductor wafers into/from the multi-station tool. Equipment for each QSM processing chamber that is located closer to the transfer chamber may thus generally be further from the outer boundary of the multi-station tool, and thus be more difficult to reach, while equipment that is located further from the transfer chamber may generally be closer to the outer boundary of the multi-station tool.

The accessibility of equipment, or lack thereof, for such processing chamber may present challenges during maintenance or service operations, in particular with respect to equipment that is located on the top plate assembly. Equipment that is positioned on the top plate assembly closer to an edge of a multi-station processing chamber that is not readily accessible from the sides may thus generally only be easily accessible from above, but the vertical space above such a top plate assembly may be limited, in some cases, by the vertical clearance that may exist between the top plate assembly and, for example, the top assembly.

The present inventors realized that by incorporating additional features into a multi-station tool, it would be possible to allow the top plate assembly to be easily rotated during maintenance and service operations to bring equipment that might normally be located in difficult-to-access locations to locations that are more easily accessed, thereby facilitating maintenance and service operations.

While various implementations of multi-station tools with rotatable top plate assemblies will be evident from the above discussion and the discussion below, the present disclosure includes at least the following specific implementations, which are provided for clarity but are not intended to be limiting.

In some implementations, a semiconductor processing apparatus is provided that may include a chamber housing having an opening in an upper surface thereof, the opening being defined by an interior edge of the chamber housing that extends around the opening. The semiconductor processing apparatus may further include a plurality of pedestals positioned at different locations within an interior volume of the chamber housing, a top plate assembly that is sized to cover the opening and configured to be able to be transitioned between at least a first configuration and a second configuration, and a rotational bearing mechanism configured to support the top plate assembly at least when the top plate assembly is in the second configuration. The top plate assembly, in the first configuration, may be engaged with the chamber housing so as to seal the opening, and, in the second configuration, may be positioned further from the chamber housing than in the first configuration, supported by the rotational bearing mechanism, and able to rotate about a vertical axis between at least a first rotational position and a second rotational position.

In some such implementations, the top plate assembly may include a top plate with a plurality of apertures therethrough and each pedestal may align with a corresponding different one of the apertures when the top plate assembly is in the first rotational position.

In some further such implementations, the semiconductor processing apparatus may further include a plurality of gas distribution assemblies, each gas distribution assembly mounted to the top plate so as to seal one of the apertures and having a plurality of gas distribution ports located on a surface thereof facing toward the pedestals when the top plate assembly is in either the first configuration or the second configuration and also in the first rotational position.

In some implementations of the semiconductor processing apparatus, the plurality of pedestals may include four pedestals arranged in a square pattern.

In some implementations of the semiconductor processing apparatus, at least a center of each pedestal in the plurality of pedestals may overlap with the opening when viewed from above and each pedestal may be configured to support a wafer during semiconductor processing operations performed within the chamber housing.

In some implementations of the semiconductor processing apparatus, the rotational bearing mechanism may include a first portion and a second portion that are rotatable relative to each other, the semiconductor processing apparatus may further include one or more vertical displacement mechanisms configured to exert, either directly or indirectly, a total upward force on the top plate assembly that is greater than the weight of the top plate assembly during transition of the top plate assembly from the first configuration to the second configuration, and the first portion, the second portion, and the one or more vertical displacement mechanisms may be compressively loaded by the top plate assembly at least when the top plate assembly is in the second configuration.

In some such implementations of the semiconductor processing apparatus, the one or more vertical displacement mechanisms may include one or more springs.

In some alternative such implementations of the semiconductor processing apparatus, the one or more springs are a plurality of compression springs that are distributed around the opening at locations outside of the opening.

In some alternative such implementations of the semiconductor processing apparatus, the one or more springs may include a circumferential wave spring that encircles the opening.

In some alternative such implementations of the semiconductor processing apparatus, the one or more vertical displacement mechanisms may include one or more screw features.

In some alternative such implementations of the semiconductor processing apparatus, the one or more vertical displacement mechanisms may include a plurality of linear actuators.

In some implementations of the semiconductor processing apparatus, the apparatus may further include a detent system including one or more engagement mechanisms and one or more receiver features. One of a) the one or more engagement mechanisms and b) the one or more receiver features may be fixedly mounted with respect to the top plate assembly and the other of a) of the one or more engagement mechanisms and b) the one or more receiver features may be fixedly mounted with respect to the chamber housing. Each engagement mechanism may be configured to transition between an engaged configuration and a disengaged configuration, and the one or more engagement mechanisms and the one or more receiver features may be positioned such that when the top plate assembly is in the first rotational position, at least one of the one or more engagement mechanisms i) is configured to be able to be transitioned from the disengaged configuration to the engaged configuration, ii) is engaged with one of the one or more receiver features when in the engaged configuration, and iii) prevents the top plate assembly from rotating relative to the chamber housing while engaged with the receiver feature of the one or more receiver features.

In some implementations of the semiconductor processing apparatus, the apparatus may further include a top assembly, one or more vertical lift actuators, one or more locking actuators, and one or more lift features. The one or more lift features may be part of the top plate assembly, the one or more vertical lift actuators may be configured to vertically translate the top assembly between at least a seated position and a first elevated position, the one or more locking actuators may be positioned so as to be releasably engageable with the one or more lift features when the top assembly is in the seated position, and the top plate assembly may translate with the top assembly when the top assembly is translated from the seated position to the first elevated position by the one or more vertical lift actuators and the one or more locking features are engaged with the one or more lift features.

In some such implementations of the semiconductor processing apparatus, the apparatus may further include a support structure that is part of the top plate assembly and extends upward from the top plate assembly. The apparatus may also further include a bearing seat that is part of the top assembly. In such implementations, the one or more vertical lift actuators may be further configured to also vertically translate the top assembly between the first elevated position and a second elevated position higher than the first elevated position, the rotational bearing mechanism may be located in between the bearing seat and an uppermost end of the support structure, the rotational bearing mechanism may be compressively loaded by the bearing seat and the support structure during translation of the top assembly between the first elevated position and the second elevated position, and the top plate assembly may be in the second configuration when the top assembly is at the second elevated position and not supporting the top plate assembly.

In some implementations, a semiconductor processing apparatus is provided that includes a chamber housing having a seal interface on a bottom surface thereof. The apparatus may further include a bottom plate assembly that is positioned beneath the chamber housing, sized to cover the seal interface, and configured to be able to be transitioned between at least a first configuration and a second configuration. The apparatus may also include a plurality of pedestals positioned at different locations at least partially within an interior volume of the chamber housing when the bottom plate assembly is in the first configuration, as well as a rotational bearing mechanism that is configured to support the bottom plate assembly at least when the bottom plate assembly is in the second configuration. In such implementations, the bottom plate assembly, in the first configuration, may be engaged with the seal interface of the chamber housing, and, in the second configuration, may be positioned further from the chamber housing than in the first configuration, supported by the rotational bearing mechanism, and able to rotate about a vertical axis between at least a first rotational position and a second rotational position.

In some such implementations, the bottom plate assembly may support the plurality of pedestals.

In some additional such implementations, the apparatus may further include a plurality of gas distribution assemblies, each gas distribution assembly having a plurality of gas distribution ports located on a surface thereof facing toward, and centered above, a corresponding one of the pedestals when the bottom plate assembly is in at least the first rotational position.

In some implementations, the plurality of pedestals may include four pedestals arranged in a square pattern.

In some implementations, the rotational bearing mechanism may include a first portion and a second portion that are rotatable relative to each other, and the semiconductor processing apparatus may further include one or more vertical displacement mechanisms configured to exert, either directly or indirectly, a total upward force on the bottom plate assembly that is greater than the weight of the bottom plate assembly during transition of the bottom plate assembly from the first configuration to the second configuration, and the first portion, the second portion, and the one or more vertical displacement mechanisms may be compressively loaded by the bottom plate assembly in both the first configuration and the second configuration.

In some such implementations, the one or more vertical displacement mechanisms may include one or more springs.

In some alternative such implementations, the one or more springs may be a plurality of compression springs that are distributed around the bottom plate assembly at locations outside of a region defined by the seal interface.

In some other alternative such implementations, the one or more springs may include a circumferential wave spring that encircles the seal interface.

In some other alternative such implementations, the one or more vertical displacement mechanisms include one or more screw features.

In some other alternative such implementations, the one or more vertical displacement mechanisms may include a plurality of linear actuators.

In some implementations of the apparatus, the apparatus may further include a detent system including one or more engagement mechanisms and one or more receiver features. One of a) the one or more engagement mechanisms and b) the one or more receiver features may be fixedly mounted with respect to the bottom plate assembly and the other of a) of the one or more engagement mechanisms and b) the one or more receiver features may be fixedly mounted with respect to the chamber housing. Each engagement mechanism may be configured to transition between an engaged configuration and a disengaged configuration, and the one or more engagement mechanisms and the one or more receiver features may be positioned such that when the bottom plate assembly is in the first rotational position, at least one of the one or more engagement mechanisms i) is configured to be able to be transitioned from the disengaged configuration to the engaged configuration, ii) is engaged with one of the one or more receiver features when in the engaged configuration, and iii) prevents the bottom plate assembly from rotating relative to the chamber housing while engaged with the receiver feature of the one or more receiver features.

In some implementations of the apparatus, the apparatus may further include a rotational bearing mechanism support structure and one or more bottom plate vertical lift mechanisms. The rotational bearing mechanism may be interposed between the bottom plate and the rotational bearing mechanism support structure, the rotational bearing mechanism support structure may be interposed between the rotational bearing mechanism and the one or more bottom plate vertical lift mechanisms, and the one or more bottom plate vertical lift mechanisms may be configured to translate at least the rotational bearing mechanism support structure and the rotational bearing mechanism between positions associated with the first configuration and the second configuration.

In some implementations, a semiconductor processing apparatus may be provided that includes a chamber housing having an opening in an upper surface thereof, the opening being defined by an interior edge of the chamber housing that extends around the opening. The apparatus may further include a pedestal positioned within an interior volume of the chamber housing, a top plate assembly that is sized to cover the opening and that is configured to be able to be transitioned between at least a first configuration and a second configuration, and a rotational bearing mechanism configured to support the top plate assembly at least when the top plate assembly is in the second configuration. The top plate assembly, in the first configuration, may be engaged with the chamber housing so as to seal the opening, and, in the second configuration, may be positioned further from the chamber housing than in the first configuration, supported by the rotational bearing mechanism, and able to rotate about a vertical axis between at least a first rotational position and a second rotational position.

In some implementations of the apparatus, the top plate assembly may include a plurality of gas distribution ports located on a surface thereof facing toward the pedestal when the top plate assembly is in either the first configuration or the second configuration and also in the first rotational position.

In some implementations of the apparatus, the rotational bearing mechanism may include a first portion and a second portion that are rotatable relative to each other, the semiconductor processing apparatus may further include one or more vertical displacement mechanisms configured to exert, either directly or indirectly, a total upward force on the top plate assembly that is greater than the weight of the top plate assembly during transition of the top plate assembly from the first configuration to the second configuration, and the first portion, the second portion, and the one or more vertical displacement mechanisms may be compressively loaded by the top plate assembly at least when the top plate assembly is in the second configuration.

In some such implementations of the apparatus, the one or more vertical displacement mechanisms include one or more springs.

In some alternative such implementations of the apparatus, the one or more springs may be a plurality of compression springs that are distributed around the opening at locations outside of the opening.

In some such implementations of the apparatus, the one or more springs may include a circumferential wave spring that encircles the opening.

In some such implementations of the apparatus, the one or more vertical displacement mechanisms may include one or more screw features.

In some such implementations of the apparatus, the one or more vertical displacement mechanisms may include a plurality of linear actuators.

In some implementations of the apparatus, the apparatus may further include a detent system including one or more engagement mechanisms and one or more receiver features. One of a) the one or more engagement mechanisms and b) the one or more receiver features is fixedly mounted with respect to the top plate assembly and the other of a) of the one or more engagement mechanisms and b) the one or more receiver features is fixedly mounted with respect to the chamber housing. Each engagement mechanism may be configured to transition between an engaged configuration and a disengaged configuration, and the one or more engagement mechanisms and the one or more receiver features may be positioned such that when the top plate assembly is in the first rotational position, at least one of the one or more engagement mechanisms i) is configured to be able to be transitioned from the disengaged configuration to the engaged configuration, ii) is engaged with one of the one or more receiver features when in the engaged configuration, and iii) prevents the top plate assembly from rotating relative to the chamber housing while engaged with the receiver feature of the one or more receiver features.

In some implementations, a semiconductor processing apparatus may be provided that includes a center chamber structure, a wafer handling robot positioned within the center chamber structure, and a plurality of satellite chamber structures arranged around the center chamber structure. Each satellite chamber structure may be connected with the center chamber structure via a corresponding passage sized to allow a wafer to be passed from the center chamber structure and into that satellite chamber structure by the wafer handling robot. Each satellite chamber structure may also have a corresponding opening. The semiconductor processing apparatus may also include a top plate assembly that extends over the satellite chamber structures and is configured to be transitionable between at least a first configuration and a second configuration and a rotational bearing mechanism configured to support the top plate assembly at least when the top plate assembly is in the second configuration. The top plate assembly, in the first configuration, may be engaged with each of the satellite chamber structures so as to seal the openings thereof, and the top plate assembly, in the second configuration, may be positioned further from the satellite chamber structures than in the first configuration, supported by the rotational bearing mechanism, and able to rotate about a vertical axis between at least a first rotational position and a second rotational position.

In some implementations of the semiconductor processing apparatus, the top plate assembly may include a top plate and may have a plurality of apertures therethrough, and each aperture may align with a corresponding different one of the satellite chamber structures when the top plate assembly is in the first rotational position.

In some implementations of the semiconductor processing apparatus, the apparatus may further include a plurality of gas distribution assemblies, each gas distribution assembly mounted to the top plate so as to seal one of the apertures and having a plurality of gas distribution ports located on a surface thereof facing towards an interior volume of a corresponding one of the satellite chamber structures when the top plate assembly is in either the first configuration and the first rotational position or in the second configuration and the first rotational position.

In some implementations of the semiconductor processing apparatus, the apparatus may further include a plurality of gas distribution assemblies, each gas distribution assembly having a stem that extends through one of the apertures and a gas distributor with a plurality of gas distribution ports located within a volume defined, at least in part, by a corresponding one of the satellite chamber structures and the top plate assembly when the top plate assembly is in either the first configuration and the first rotational position or in the second configuration and the first rotational position.

In some implementations of the semiconductor processing apparatus, there may be four satellite chamber structures arranged in a non-orthogonal X configuration centered on the center chamber structure.

In some implementations of the semiconductor processing apparatus, there may be four satellite chamber structures arranged in a + configuration centered on the center chamber structure.

In some implementations of the semiconductor processing apparatus, there may be more than four satellite chamber structures arranged around the center chamber structure.

In some implementations of the semiconductor processing apparatus, the rotational bearing mechanism includes a first portion and a second portion that are rotatably connected, the semiconductor processing apparatus may further include one or more vertical displacement mechanisms configured to exert, either directly or indirectly, a total upward force on the top plate assembly that is greater than the weight of the top plate assembly during transition of the top plate assembly from the first configuration to the second configuration, and the first portion, the second portion, and the one or more vertical displacement mechanisms may be compressively loaded by the top plate assembly at least when the top plate assembly is in the second configuration.

In some implementations of the semiconductor processing apparatus, the one or more vertical displacement mechanisms may include one or more springs. In some such implementations of the semiconductor processing apparatus, the one or more springs may be a plurality of compression springs that are distributed along the rotational bearing mechanism.

In some implementations of the semiconductor processing apparatus, the one or more springs may include a circumferential wave spring that is concentric with an axis of rotation of the rotational bearing mechanism.

In some implementations of the semiconductor processing apparatus, the one or more vertical displacement mechanisms may include one or more screw features.

In some implementations of the semiconductor processing apparatus, the one or more vertical displacement mechanisms may include a plurality of linear actuators.

In some implementations of the semiconductor processing apparatus, the apparatus may further include a detent system including one or more engagement mechanisms and one or more receiver features. One of a) the one or more engagement mechanisms and b) the one or more receiver features may be fixedly mounted with respect to the top plate assembly and the other of a) of the one or more engagement mechanisms and b) the one or more receiver features may be fixedly mounted with respect to the center chamber structure. Each engagement mechanism may be configured to transition between an engaged configuration and a disengaged configuration, and the one or more engagement mechanisms and the one or more receiver features may be positioned such that when the top plate assembly is in the first rotational position, at least one of the one or more engagement mechanisms i) is configured to be able to be transitioned from the disengaged configuration to the engaged configuration, ii) is engaged with one of the one or more receiver features when in the engaged configuration, and iii) prevents the top plate assembly from rotating relative to the center chamber structure while engaged with the receiver feature of the one or more receiver features.

In some implementations of the semiconductor processing apparatus, the apparatus may further include a top assembly, one or more vertical lift actuators, one or more locking actuators, and one or more lift features. The one or more lift features may be part of the top plate assembly, the one or more vertical lift actuators may be configured to vertically translate the top assembly between at least a seated position and a first elevated position, the one or more locking actuators may be positioned so as to be releasably engageable with the one or more lift features when the top assembly is in the seated position, and the top plate assembly may translate with the top assembly when the top assembly is translated from the seated position to the first elevated position by the one or more vertical lift actuators and the one or more locking features are engaged with the one or more lift features.

In some implementations of the semiconductor processing apparatus, the apparatus may further include a support structure that is part of the top plate assembly and extends upward from the top plate assembly, and a bearing seat that is part of the top assembly. The one or more vertical lift actuators may be further configured to also vertically translate the top assembly between the first elevated position and a second elevated position higher than the first elevated position, the rotational bearing mechanism may be located in between the bearing seat and an uppermost end of the support structure, the rotational bearing mechanism may be compressively loaded by the bearing seat and the support structure during translation of the top assembly between the first elevated position and the second elevated position, and the top plate assembly may be in the second configuration when the top assembly is at the second elevated position and not supporting the top plate assembly.

BRIEF DESCRIPTION OF THE DRAWINGS

FIG. 11 shows the rotational bearing mechanism as it would be when the top plate assembly is sealed to the chamber housing, and FIG. 12 shows the rotational bearing mechanism as it would be when the top plate assembly is able to be rotated.

FIG. 13 shows the rotational bearing mechanism as it would be when the top plate assembly is sealed to the chamber housing, and FIG. 14 shows the rotational bearing mechanism as it would be when the top plate assembly is able to be rotated.

FIGS. 16 and 17 depict a detail view of yet another example rotational bearing mechanism that may be used in some implementations; FIG. 16 shows the rotational bearing mechanism as it would be when the top plate assembly is sealed to the chamber housing, and FIG. 17 shows the rotational bearing mechanism as it would be when the top plate assembly is able to be rotated.

FIGS. 18 and 19 depict a detail view of an example rotational bearing mechanism that may be used in some implementations; FIG. 18 shows the rotational bearing mechanism as it would be when the top plate assembly is sealed to the chamber housing, and FIG. 19 shows the rotational bearing mechanism as it would be when the top plate assembly is able to be rotated.

It will be appreciated that the Figures discussed herein are merely intended to provide a reference for discussion and are not intended to limit the present disclosure. Other implementations not specifically depicted herein but evident from the totality of the disclosure are also intended to be within the scope of the disclosure.

DETAILED DESCRIPTION

As discussed earlier, semiconductor processing tools with multi-station processing chambers may be equipped with rotational bearing mechanisms to facilitate top plate assembly rotation during maintenance and service operations. To facilitate discussion, a general example architecture for multi-station processing chambers is discussed with respect to FIGS. 1 through 4 before discussion of the rotational bearing mechanisms that may be used to improve such multi-station processing chambers.

Figure 1:
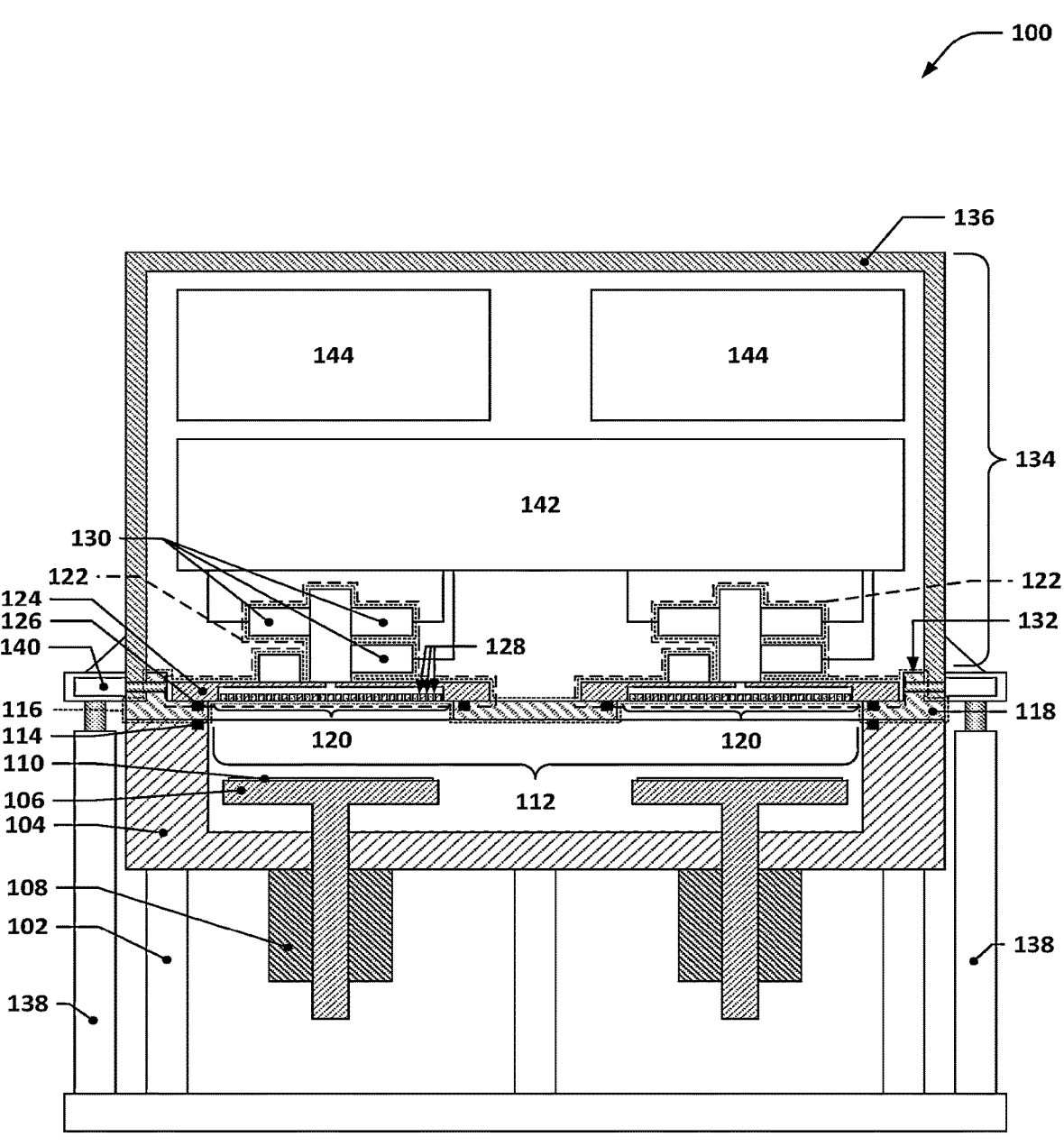
FIG. 1 a diagram of an example multi-station processing chamber.

FIG. 1 a side-view diagram of an example multi-station processing chamber. In FIG. 1, semiconductor processing tool 100 is shown which has a multi-station processing chamber that is provided, at least in part, by a chamber housing 104 and a top plate assembly 116. The chamber housing 104 may be supported by a base 102 that may elevate the chamber housing 104 off of the ground. The chamber housing 104, in this example, includes four processing stations, each having a corresponding wafer support 106 that may be sized to accommodate a wafer 110 that may be placed on top of that wafer support 106. It is to be understood that while the examples herein focus on semiconductor processing tools that feature wafer supports, e.g., that may be used to support, for example, circular semiconductor wafers (such as 200 mm, 300 mm, or 450 mm diameter wafers), it will be understood that the concepts disclosed herein may also be extended to chambers that are used to process other types of substrates, e.g., rectangular or other non-circular substrates, such as flat panel display substrates. In recognition of this, the term "pedestal" may be used herein to refer to any structure that provides support to a workpiece being processed in a semiconductor processing chamber, regardless of whether that structure is designed to support a workpiece that is a circular wafer or whether that structure is designed to support a workpiece of a different shape. It will also be understood that any reference to "wafer support" (or "wafer support actuator") made herein in the context of the discussion in the detailed description also includes within its scope equivalent implementations in which "wafer support" (or "wafer support actuator") is replaced with "pedestal" (or "pedestal actuator").

In some implementations, the wafer supports 106 may be supported, for example, via wafer support actuators 108, which may be configured to cause the wafer supports 106 to move up and down vertically during wafer loading and/or semiconductor processing operations. In other implementations, the wafer supports 106 may be fixedly mounted relative to the chamber housing 104. There may also, as mentioned earlier, be a rotational indexer or other system (not shown) provided within the chamber housing 104 to facilitate transfer of the wafers 110 between the wafer supports 106.

The chamber housing 104 may have an interior volume that is accessible via an opening 112 that may be sealed during use by the top plate assembly 116. The opening may be sized such that at least a center of each wafer support 106 in the plurality of wafer supports 106 overlaps with the opening 112 when viewed from above; in many implementations, the entirety of each wafer support 106 or at least a large portion thereof, e.g., at least the portions of the wafer supports 106 that directly contact wafers 110, may be completely overlapped by the opening 112 when viewed from above.

The top plate assembly 116 may include a top plate 118 that has a plurality of apertures 120 that are arranged in a manner that corresponds with how the wafer supports 106 are arranged within the chamber housing 104. Thus, each aperture 120 may generally be positioned over a corresponding one of the wafer supports 106. The apertures 120 may, in turn, be sealed by another structure, e.g., a gas distribution assembly 122. Each gas distribution assembly 122 may, for example, have a gas distribution plate 124 that may, for example, have one or more internal plenums that each provide processing gas(es) to a plurality of gas distribution ports 128 that then direct the processing gas(es) towards the wafer 110 that is positioned therebeneath. The internal plenum(s) of the gas distribution plate 124, which may also be referred to as a showerhead in the industry, may be provided processing gas(es) via one or more valves 130 that may be part of the gas distribution assembly 122.

It will be understood that in some alternative implementations, the apertures 120 may be sealed by structures other than the gas distribution assemblies 122. For example, in some implementations, the multi-station processing chamber may be used for ultraviolet curing operations and the apertures 120 may instead be sealed by UV-transparent windows. In other implementations, the multi-station processing chamber may be used for heat-treating wafers and the apertures 120 may be sealed by heater units. In yet other implementations, the apertures 120 may be sealed by a remote plasma source, e.g., a remote plasma source having a plasma dome. Generally speaking, the apertures 120 may each be configured to have a shape and size that is defined, at least in part, by a corresponding structure, e.g., gas distribution assembly, window, plasma dome, heater assembly, etc., that is mounted to the top plate 118 and used to seal that aperture.

It is also possible for the top plate assembly 116 to be constructed so as to generally be unitary in construction, e.g., the top plate assembly 116 may include a top plate 118 that has no apertures 120 in it and is instead generally contiguous across the entire span of the top plate assembly 116. In such implementations, the top plate 118 may, for example, include the features provided in the gas distribution plate 124. Given the typical size of a top plate 118, e.g., 36" to 48" across, and the cost of manufacture of unitary versions thereof, it is frequently the case that the top plate 118 includes apertures 120, thereby allowing the more complicated features, such as may be found in the gas distribution plate 124, to be separately manufactured and then assembled to the top plate 118 to provide the top plate assembly 116. In other such implementations, features other than, or in addition to, the gas distribution plate features may be included in such a top plate 118.

In order to provide adequate sealing, a seal 114 may be provided that encircles the interior edge of the chamber housing that defines the opening 112 and that may contact the top plate assembly 116 when the top plate assembly 116 is placed on top of the chamber housing 104. The seal 114 may, for example, be an elastomeric seal, e.g., an O-ring, that may be compressed between the top plate assembly 116 and an upper surface of the chamber housing 104. Similarly, if apertures 120 are provided in the top plate 118, each aperture 120 may be encircled by a corresponding seal 126 which may, in similar fashion, be compressed between the top plate 118 and the gas distribution plate 124 (or other structure).

The top plate assembly 116 may be held in place by any of a number of mechanisms. For example, in some implementations, threaded fasteners may be used to clamp the top plate assembly 116 to the chamber housing 104. In other implementations, however, the top plate assembly 116 may be clamped against the chamber housing 104 through another mechanism.

For example, in FIG. 1, a top assembly 134 is provided that includes additional equipment, e.g., radio frequency (RF) generators 144 and gas distribution system 142, which may be fluidically connected to the valves 130 via one or more gas lines. The top assembly 134 may also include a top assembly housing 136, which may partially or wholly enclose the volume above the top plate assembly 116 and which may, for example, provide structural support to the additional equipment; the top assembly housing may also be an open framework or other support structure that similarly supports the additional equipment. Regardless, the top assembly 134 and the additional equipment within may be configured to be vertically translatable, e.g., by vertical lift actuators 138 (which may be hydraulic actuators, screw drives, or other systems able to move the top assembly 134 up and down vertically). The top assembly 134 may also be releasably engageable with the top plate assembly 116, e.g., via locking actuators 140 that may be actuated so as to cause a locking pin or other feature to releasably engage with a lift feature 132. In this example, the lift features 132 are features that have horizontal holes in them; when the top assembly 134 is properly positioned, the locking actuators 140 may be actuated so as to cause the locking pins of those actuators to extend radially inward and into the horizontal holes, thus pinning the top plate assembly 116 to the top assembly 134. It will be understood that any suitable releasable locking mechanism and lift features may be used to provide for such releasable engagement between the top plate assembly 116 and the top assembly 134. Moreover, the locking actuators 140 may be electronically controlled or manually operated, e.g., the locking actuators may be threaded fasteners that are manually extended or retracted into corresponding lift features. In other implementations, the locking actuators and lift features may, for example, be provided by a latch mechanism in which one portion of the latch serves as the locking actuator and the other serves as the lift feature.

In some implementations, the top assembly 134 may be caused to push down on the top plate assembly 116, thereby causing the top plate assembly 116 to seal against the seal 114. Such downward force may be provided, for example, through loads transmitted via the lift features 132 and locking actuators 140, or by, for example, loads transmitted through contact between the underside of the top assembly housing 136 or other portion of the top assembly 134. In most typical semiconductor processing operations, the interior volume of the chamber housing 104 may be kept at a sub-atmospheric level, e.g., by pumping gases out of the interior volume of the chamber housing 104 to draw a vacuum. As a result, once a sufficient vacuum is drawn, atmospheric pressure on the top plate assembly may generally act to compress the top plate assembly 116 against the seal 114 (for example, if the top plate 118 is circular and 3 feet in diameter, atmospheric pressure would exert nearly 15,000 pounds of clamping force on the top plate assembly 116 if a complete vacuum is drawn within the chamber housing 104), thereby ensuring that there is little or no leakage of gas past the seal 114 and into the interior of the chamber housing 104. Even relatively low pressure differentials, e.g., 1 psi, may be sufficient to generate sufficient clamping force on the top plate assembly 116 to ensure a generally gas-tight seal via seal 114.

Figure 2:
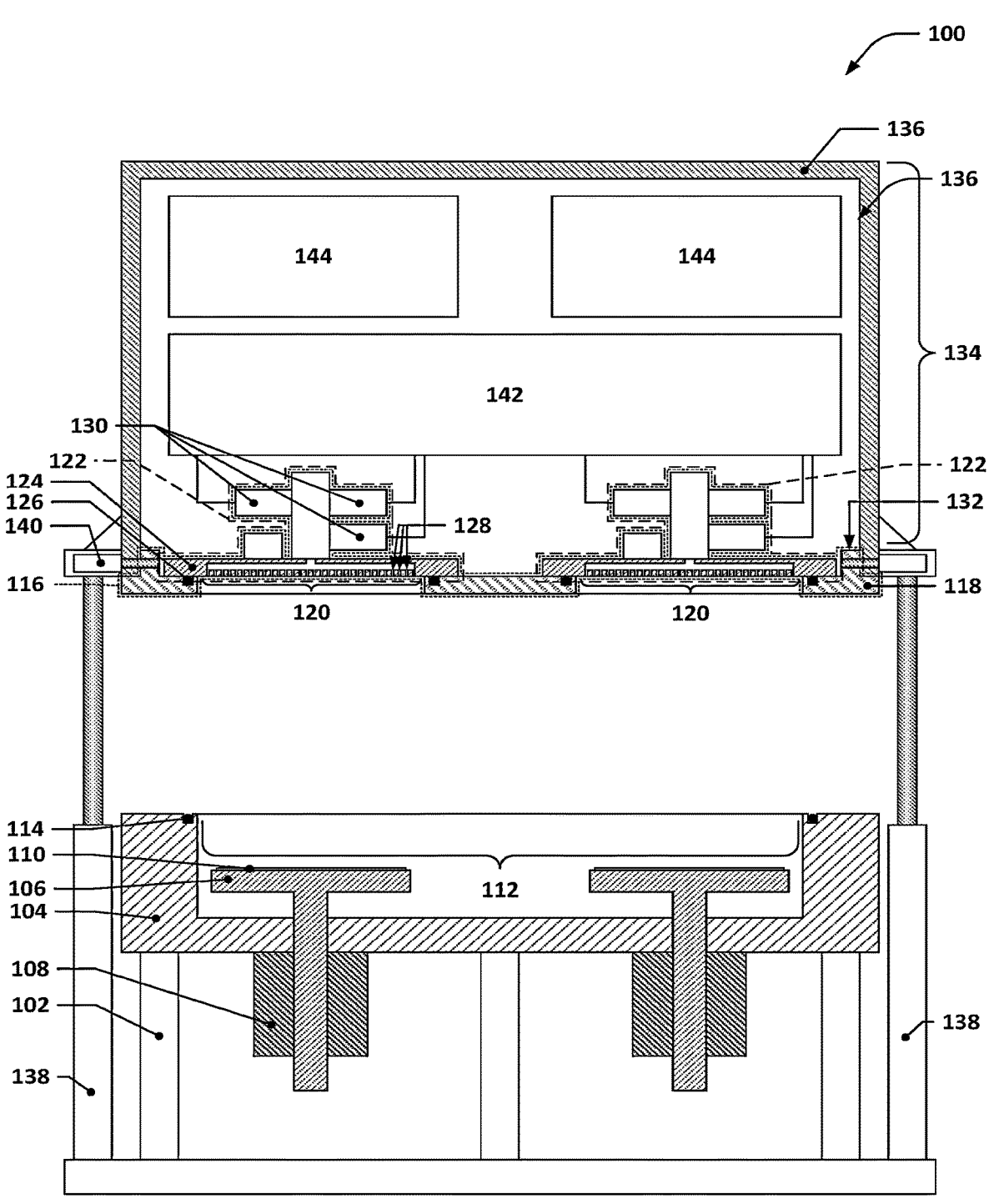
FIG. 2 depicts the example multi-station processing chamber of FIG. 1 with the top assembly and top plate assembly in a raised position.

During maintenance or service operations of multi-station processing chambers with top assemblies as shown in FIG. 1, the top assembly 134 may be used as a lifting device to allow the top plate assembly 116 to be easily lifted clear of the chamber housing 104. For example, the locking actuators 140 may be actuated so as to engage with the lift features 132 in the top plate assembly 116, thereby allowing the top plate assembly 116 to be raised and lowered in tandem with the top assembly 134 by the vertical lift actuators 138. Once the top plate assembly 116 is no longer secured to the chamber housing 104, e.g., through removal of whatever clamping mechanism may have secured it in place and/or through equalization of pressure between the interior of the chamber housing 104 and the ambient pressure pushing against the top plate assembly 116 from the exterior, the vertical lift actuators 138 may be actuated to lift the top assembly 134 and the top plate assembly 116 off of the top of the chamber housing 104, thereby allowing access to the interior of the chamber housing 104. Such a configuration is shown in FIG. 2, in which the top assembly 134 and the top plate assembly 116 have both been vertically translated upwards as a unit by the vertical lift actuators 138.

It may also be desirable to allow for the top assembly 134 to be vertically lifted without lifting the top plate assembly 116, e.g., to allow for servicing of or access to the components or systems located on the top of the top plate assembly 116, such as the valves 130 or the gas distribution assemblies 122.

Figure 3:
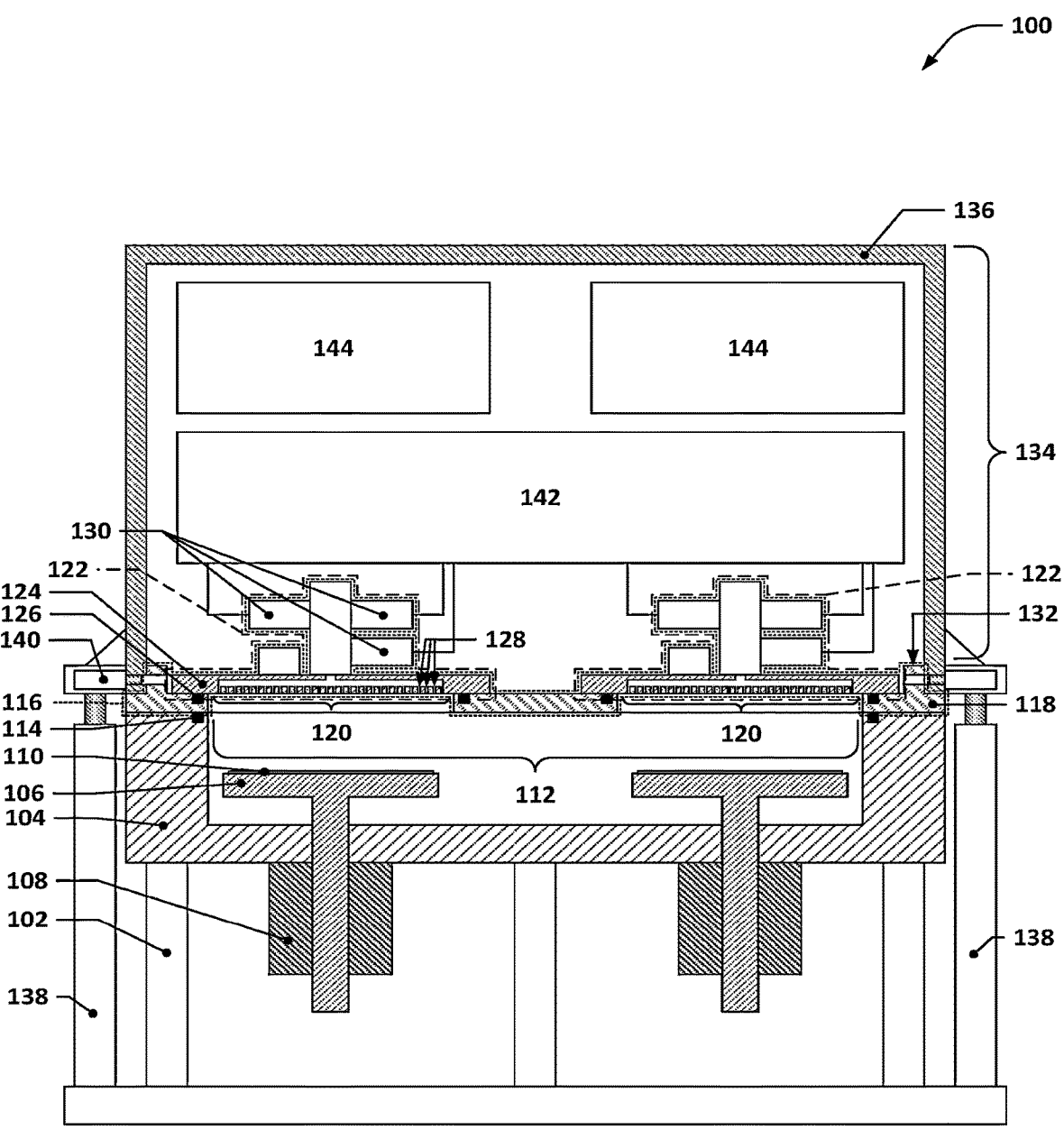
FIG. 3 depicts the example multi-station processing chamber of FIG. 1 with the top assembly and top plate assembly lowered and the top assembly disengaged from the top plate assembly.
Figure 4:
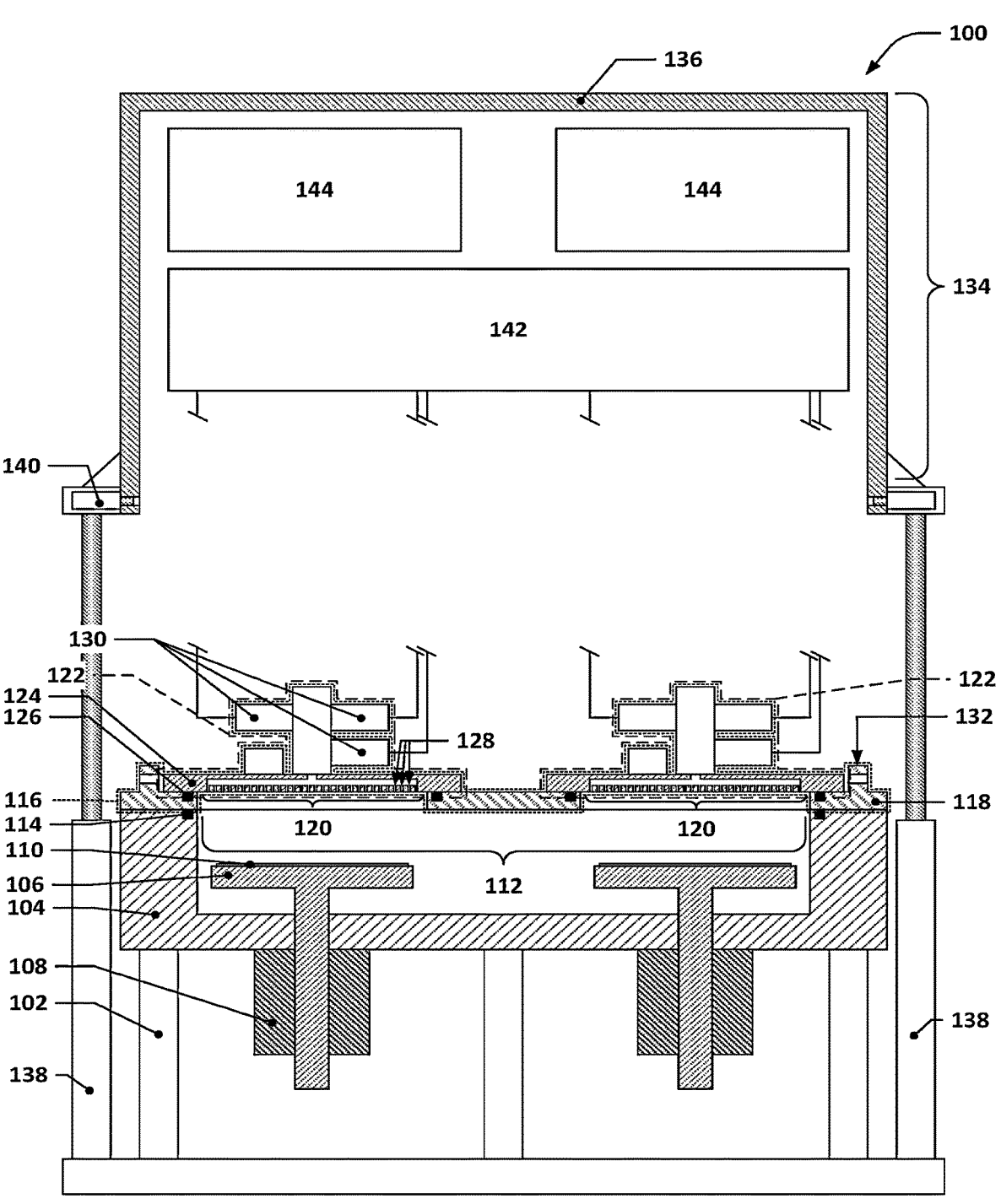
FIG. 4 depicts the example multi-station processing chamber of FIG. 1 with the top assembly raised and the top plate assembly still in place on the chamber housing.

In order to place the multi-station chamber into such a configuration, the locking actuators 140 may be disengaged from the lift features 132 while the top plate assembly is resting on the chamber housing 104, as shown in FIG. 3, and the top assembly 134 then subsequently raised to an elevated position, as shown in FIG. 4. In some implementations, certain hardware connections between the top assembly 134 and the top plate assembly 116 may need to be disconnected prior to transitioning the top assembly 134 to the elevated position. For example, gas lines that connect the valves 130 to the gas distribution system(s) 142 may need to be disconnected (as shown by the diagonal break lines separating the gas lines connecting the gas distribution system 142 to the gas distribution assembly 122 in FIG. 4) prior to moving the top assembly 134 separately from the top plate assembly 116. The top assembly 134 may, for example, have openings or doors in the sides of it that allow for access to such components to be disconnected by technicians prior to elevating the top assembly 134.

The above discussion has focused on a multi-station processing chamber that has four stations, e.g., similar to one of a QSM-type tool's multi-station processing chambers, as those are likely the most commonly encountered multi-station chambers. It will be recognized, however, that the techniques discussed herein may be implemented for other tools or equipment featuring other types of multi-station processing chambers, such as five- and six-station processing chambers. Some such multi-station chambers may feature multiple stations that are equidistantly spaced in a circular array about a common center point. In some such multi-station chambers, a rotational indexer or carousel may be provided that is configured to rotated about this common center point so as to cause wafers placed at each station to be shifted, en masse, to the next station. In some other multi-station chambers, the stations may not necessarily be arranged in locations that form a circular array, e.g., they may have different angular spacing between one another and/or different radial spacing from a common center point. In such implementations, alternate mechanisms may be used to move the wafers to and from the various stations, e.g., a robot arm or multiple robot arms. The above discussion provides context for the following discussion of various example multi-station processing chambers that may be equipped with a rotational bearing mechanism—it will be understood that the concepts discussed below may be used in the context of at least any of the above-discussed multi-station chamber implementations.

Figure 5:
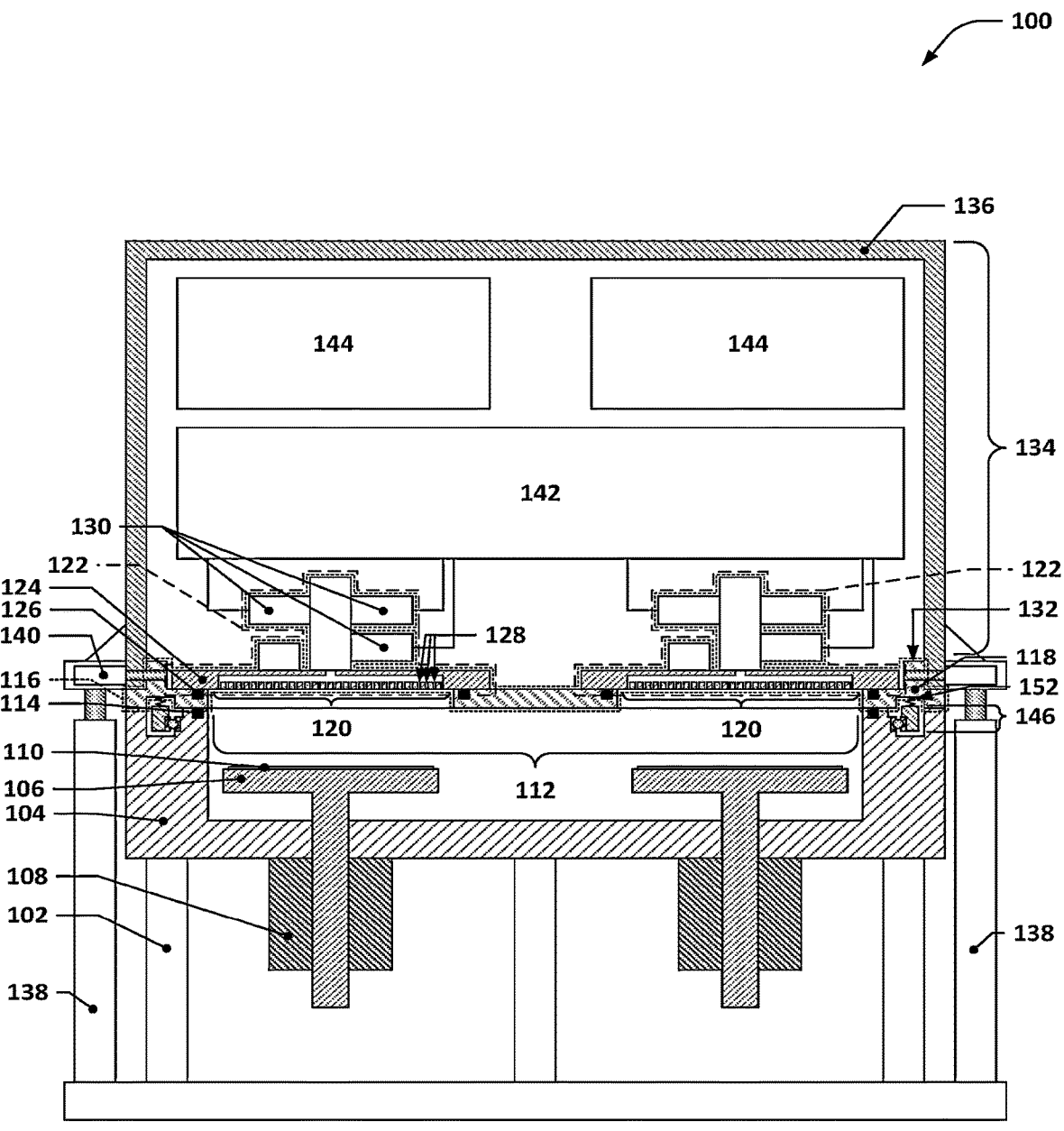
FIG. 5 depicts an example multi-station processing chamber with a rotational bearing mechanism that allows the top plate assembly to be rotated during maintenance and service operations.
Figure 6:
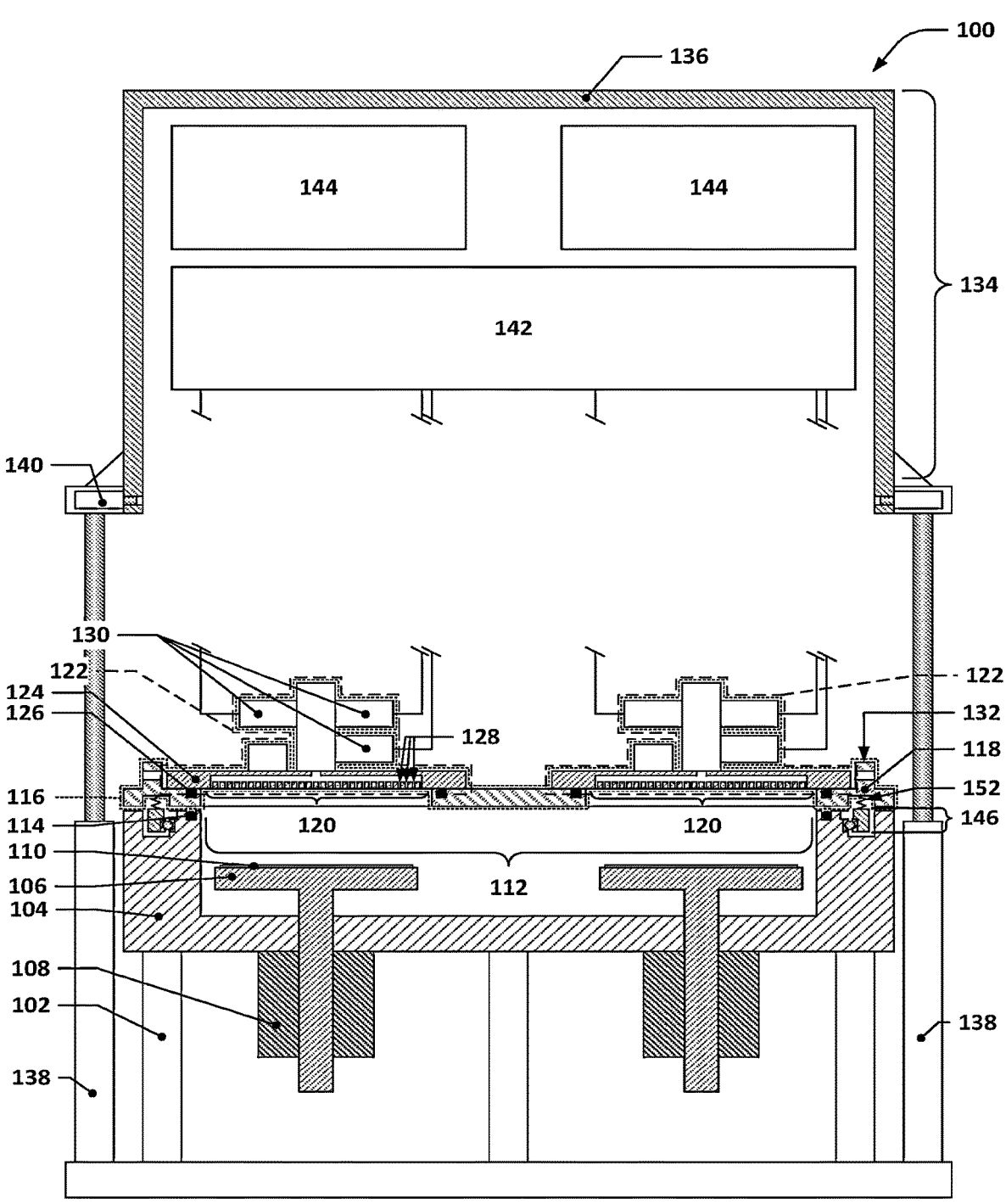
FIG. 6 depicts the example multi-station processing chamber of FIG. 5 with the top assembly in a raised position and the top plate assembly in a rotatable configuration.

FIG. 5 depicts an example multi-station processing chamber with a rotational bearing mechanism that allows the top plate assembly to be rotated about a vertical axis during maintenance and service operations. FIG. 6 depicts the example multi-station processing chamber of FIG. 5 with the top assembly in a raised position and the top plate assembly in a rotatable configuration.

As can be seen in FIGS. 5 and 6, a rotational bearing mechanism 146 has been added to the semiconductor processing tool 100; aside from modifications made to the top plate 118 and the chamber housing 104 to accommodate the rotational bearing mechanism 146, the remainder of the semiconductor processing tool 100 remains the same as in FIGS. 1 through 4. The rotational bearing mechanism 146 is designed to allow the top plate assembly 116 to be rotated between at least a first rotational position and a second rotational position relative to the chamber housing 104 at least after the top plate assembly 116 is elevated from a first configuration—in which the top plate assembly 116 is engaged with the chamber housing 104 so as to seal the opening 112 (see FIG. 5)—to a second configuration (see FIG. 6). In the second configuration, the top plate assembly 116 may be positioned at a distance further from the chamber housing 104 than in the first configuration and may be entirely or largely supported by the rotational bearing mechanism 146; the rotational bearing mechanism 146 may then provide a low-friction rotational mechanism that allows the top plate assembly 116 to be rotated in place.

Figure 7:
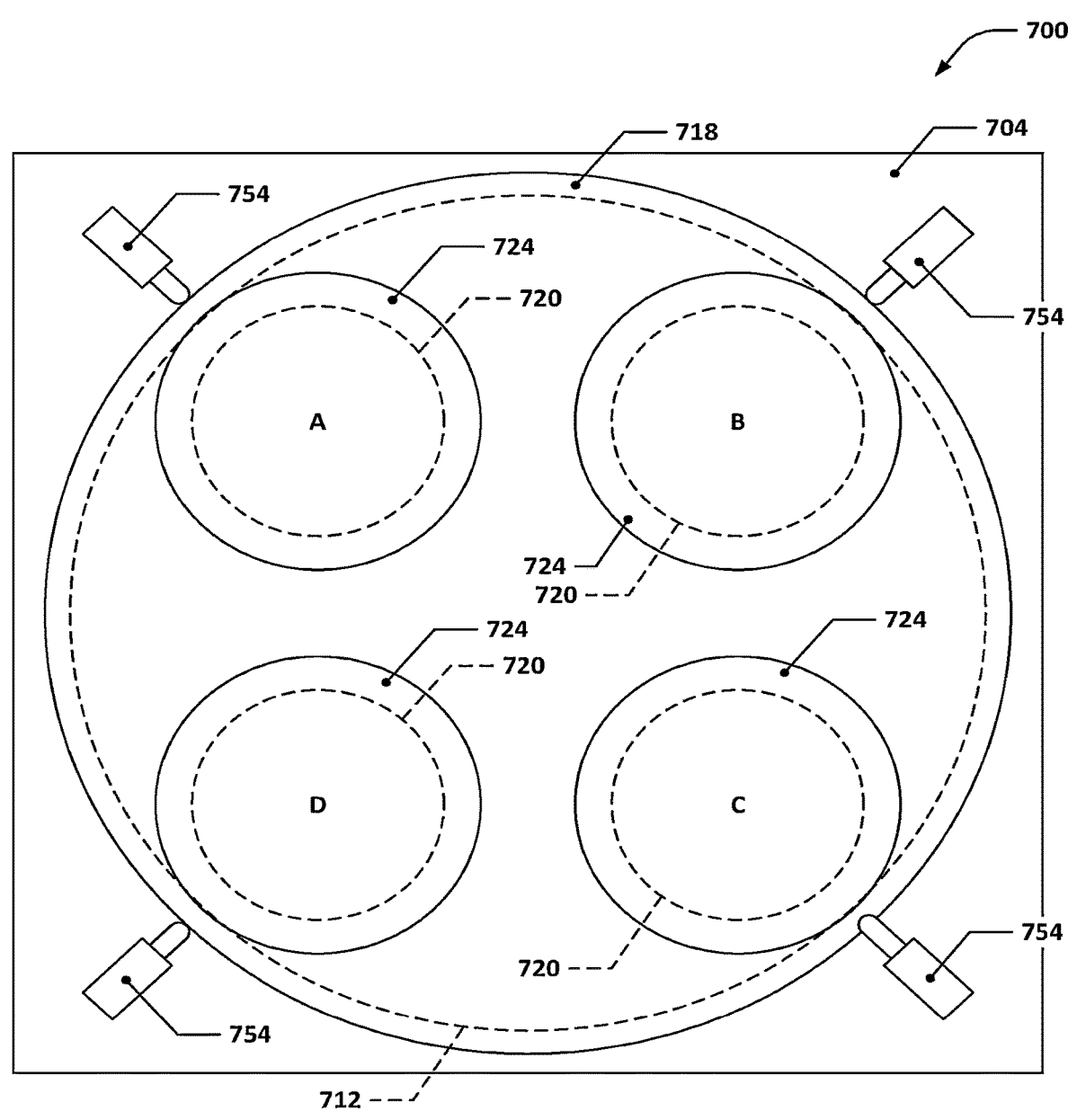
FIG. 7 depicts a top view diagram of a portion of a multi-station processing chamber with the chamber housing and top plate assembly shown.
Figure 8:
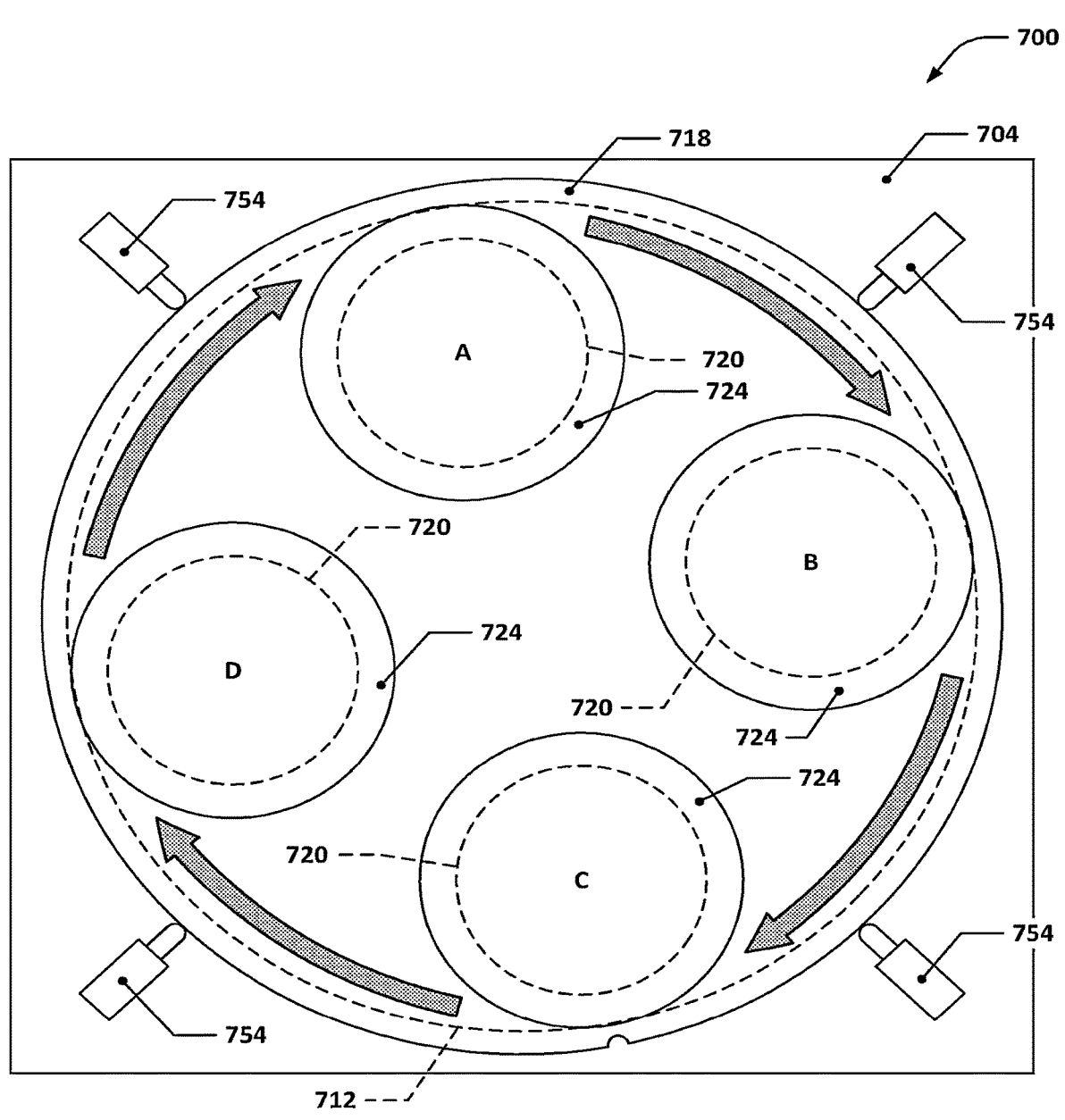
FIG. 8 depicts another top view diagram of the portion of the multi-station processing chamber of FIG. 7 but with the top plate assembly partially rotated.
Figure 9:
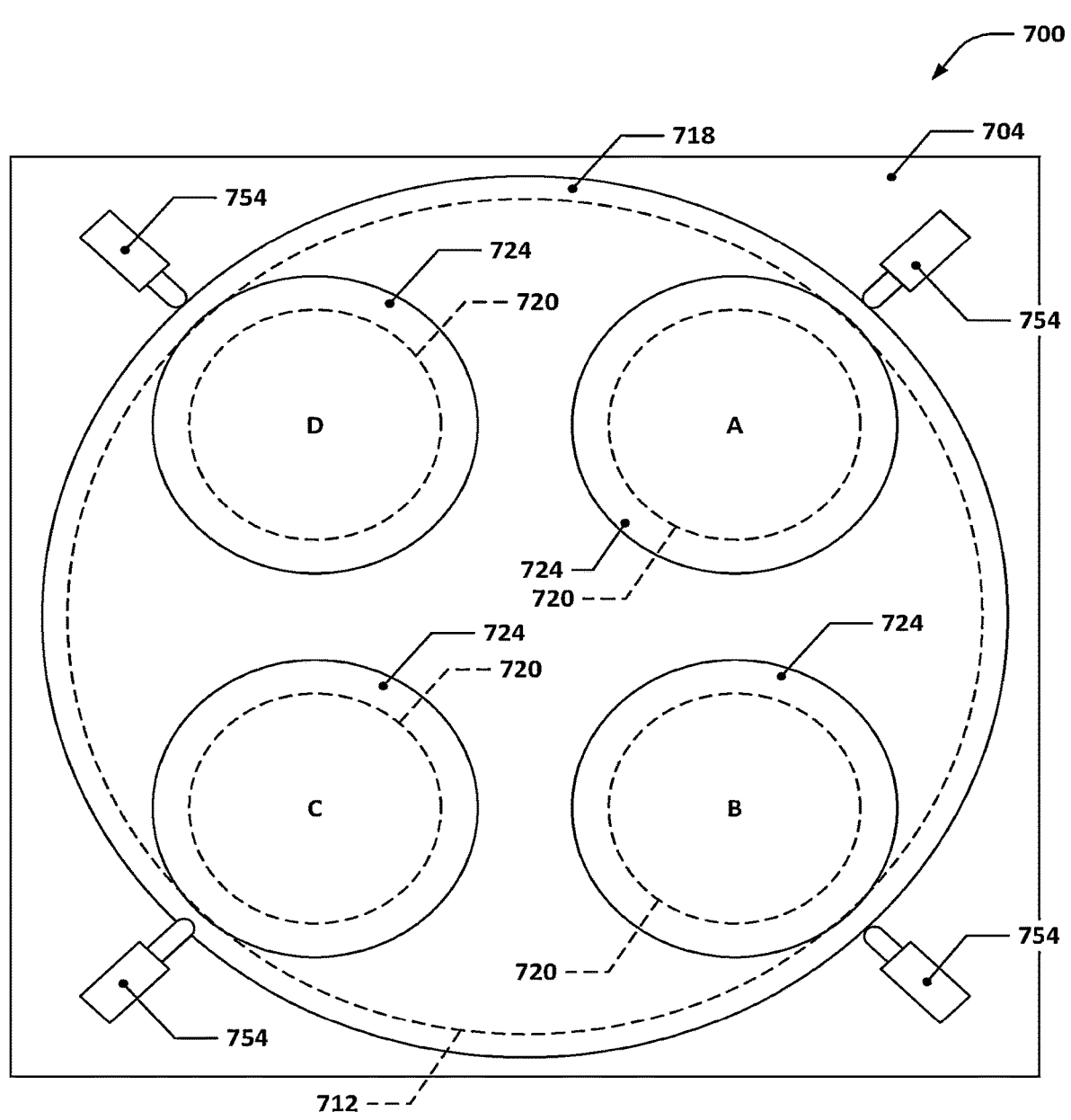
FIG. 9 depicts yet another top view diagram of the portion of the multi-station processing chamber of FIG. 7 with the top plate assembly further partially rotated.

Such rotational motion is illustrated in FIGS. 7-9, which depict top view diagrams of a portion of a multi-station processing chamber with the chamber housing and top plate assembly shown. As can be seen in FIG. 7, a chamber housing 704 is shown with a top plate 718 positioned on top. The top plate 718 has four apertures 720 (indicated by dashed circles) that are each covered by a separate gas distribution plate 724 (the different apertures 720/gas distribution plates 724 are indicated by A/B/C/D indicators). The depicted processing tool optionally may include a detent system that includes one or more engagement mechanisms 754 and one or more receiver features (not separately called out in FIG. 7, but shown as receiving a portion of the lower right engagement mechanism 754) that may be used to help position and align the top plate 718 in one or more particular rotational orientations relative to the chamber housing 704. Also visible in FIG. 7 is a dashed outline indicating an opening 712 in the chamber housing 704 that is covered by the top plate 718.

When the top plate 718 is in a first configuration, e.g., similar to that shown in FIG. 5, the top plate 718 may rest on top of the chamber housing 704 and/or seal (not shown, but similar to seal 114) that encircles the opening 712 and either be rotationally locked in place or otherwise generally non-rotatable (or not easily rotatable) due to friction. When the top plate 718 is in a second configuration, e.g., similar to that shown in FIG. 6, the top plate 718 may be positioned somewhat further from the chamber housing 704, e.g., closer to the viewer with respect to the orientation of FIG. 6 as with respect to FIG. 5, than in the first configuration. This allows the top plate 718 to then be rotated relative to the chamber housing 794, as shown in FIGS. 8 and 9; in FIG. 9, the top plate 718 has been rotated by 90° relative to the chamber housing 704. Such rotation, for example, may allow the gas distribution plate 724 (B) to be moved to the position formerly occupied by the gas distribution plate 724 (C); further rotation, e.g., by another 90° may cause the gas distribution plate 724 (B) to move to the position formerly occupied by the gas distribution plate 724(D) and for the gas distribution plate 724 (A) to move to the position formerly occupied by the gas distribution plate 724 (C).

If a detent system is used with the top plate 718, the engagement mechanism(s) 754 may be provided by any device(s) or system(s) that may be configured to be able to be transitioned between an "engaged" state and a "disengaged" state—for example, a spring-loaded detent or plunger, a pin that may be translated along its own axis, a rotating latch, etc. may all be suitable for use as an engagement mechanism. Engagement mechanisms may be configured to interface with a receiver feature, such as receiver feature 756 shown in FIG. 8 (the same feature is also present in FIGS. 7 and 9, but not distinctly visible since one of the engagement mechanisms 754 is engaged with it in those Figures). The engagement mechanism 754 in this example is a spring-loaded detent and the receiver feature 756 is a recess or notch in the outer perimeter of the top plate 718 that is sized to as to receive the tip of the detent plunger when aligned therewith. When an engagement mechanism is interfaced with a corresponding receiver feature, the two devices in concert may act to prevent rotation of the top plate 718 relative to the chamber housing 704. It is to be understood that the engagement mechanism(s) 754 and the receiver feature(s) may be fixed with respect to the chamber housing 704 and the top plate 718, respectively and as shown in FIGS. 7-9, or vice-versa. It is also to be understood that there may be as few as one of each of the engagement mechanism 754 and the receiver feature 756, e.g., enough to cause the top plate 718 to be easily rotated into a particular reference position, e.g., the normal position that the top plate 718 would be in during processing operations, with the top plate 718 being generally freely rotatable through all other positions.

Figure 10:
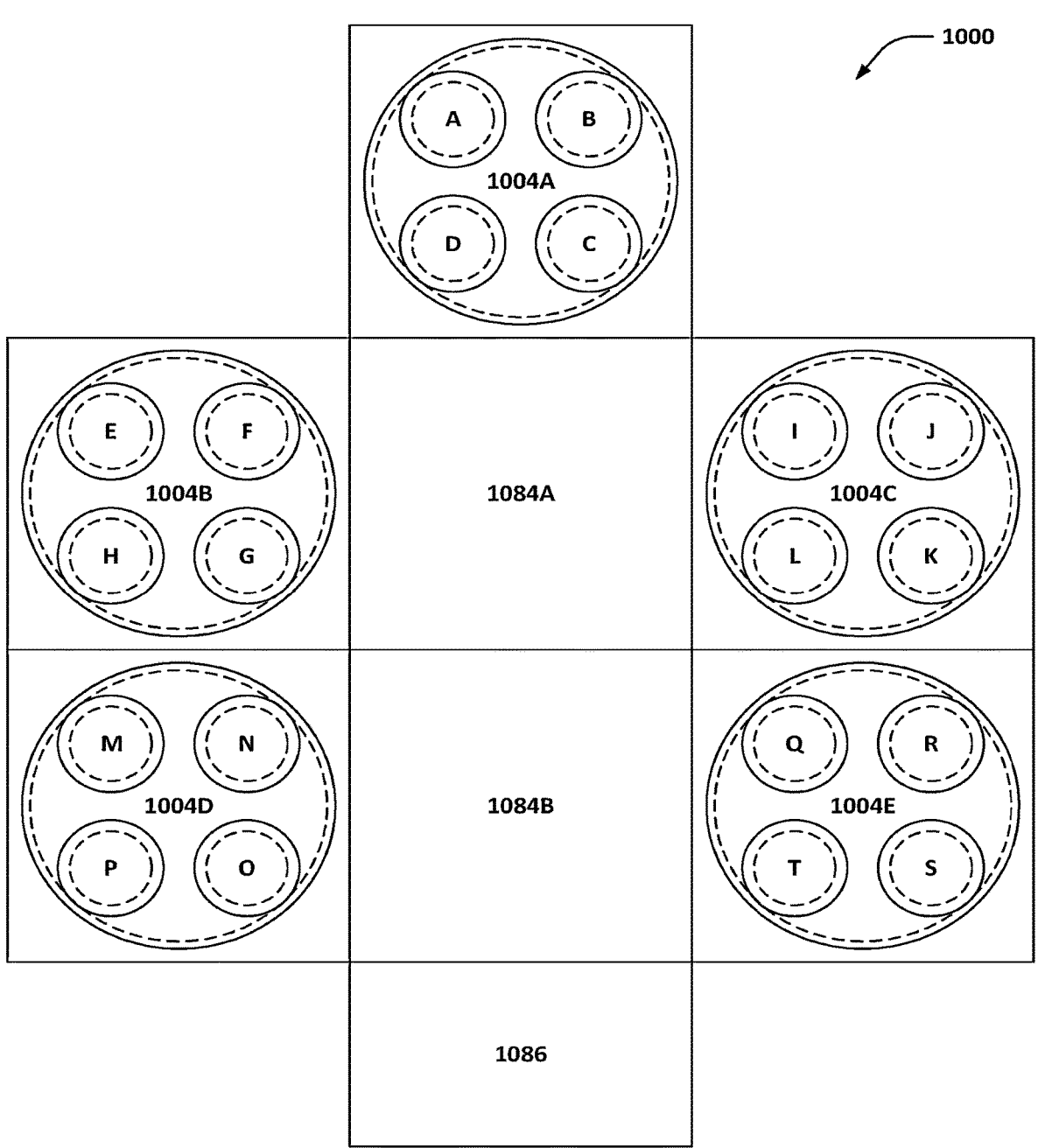
FIG. 10 depicts a schematic of a multi-station semiconductor processing tool with five multi-station processing chambers.

As discussed, a rotatable top plate assembly may provide advantages during service and maintenance operations. To give a better sense of such advantages, FIG. 10 is provided which depicts a schematic of a multi-station semiconductor processing tool 1000 with five multi-station chamber housings 1004A/B/C/D/E. The chamber housings each contain four wafer processing stations, e.g., 1004A has stations A/B/C/D, 1004B has stations E/F/G/H, 1004C has stations I/J/K/L, 1004D has stations M/N/O/P, and 1004B has stations Q/R/S/T. The various chamber housings 1004 may be connected together via, for example, transfer chambers 1084A/B, which may have wafer handling robots located inside that may be controlled to transfer wafers from one chamber housing 1004 to another. An equipment front end module (EFEM) may be provided to allow for wafers to be introduced to and removed from the semiconductor processing tool 1000.

Due to the size of the semiconductor processing tool 1000 (which may, for example, be on the order of 10 to 12 feet across or more), the equipment positioned above stations G/L/N/Q, in particular, may be particularly difficult to access during maintenance since the equipment for at least one other station is interposed between those stations and the closest exterior perimeter edge of the tool 1000. However, if the chamber housings 1004A/B/C/D/E are paired with rotational bearing mechanisms as described herein, the top plate assemblies thereof may be rotated to bring, for example, the equipment over station G into a position over station H, E, or F, there by allowing for easier access thereto. Similar rotations may be performed to provide enhanced accessibility to stations L/N/Q as well. The rotation functionality provided by the rotational bearing mechanisms discussed herein may also provide accessibility advantages even when there are non-adjacent multi-station processing chambers in a semiconductor processing tool (such as is the case with the chamber housing 1004A). There may be other equipment present that makes it difficult to gain access to all sides of a processing chamber housing 1004, for example, or specialized equipment may be needed to perform servicing, and the specialized equipment may only be able to be brought adjacent to the outermost edge of a processing chamber.

Various configurations of rotational bearing mechanisms may be used in multi-station processing tools with rotatable top plate assemblies. The following discussion addresses several examples of such potential rotational bearing mechanisms.

Figures 11, 12, 13, 14:
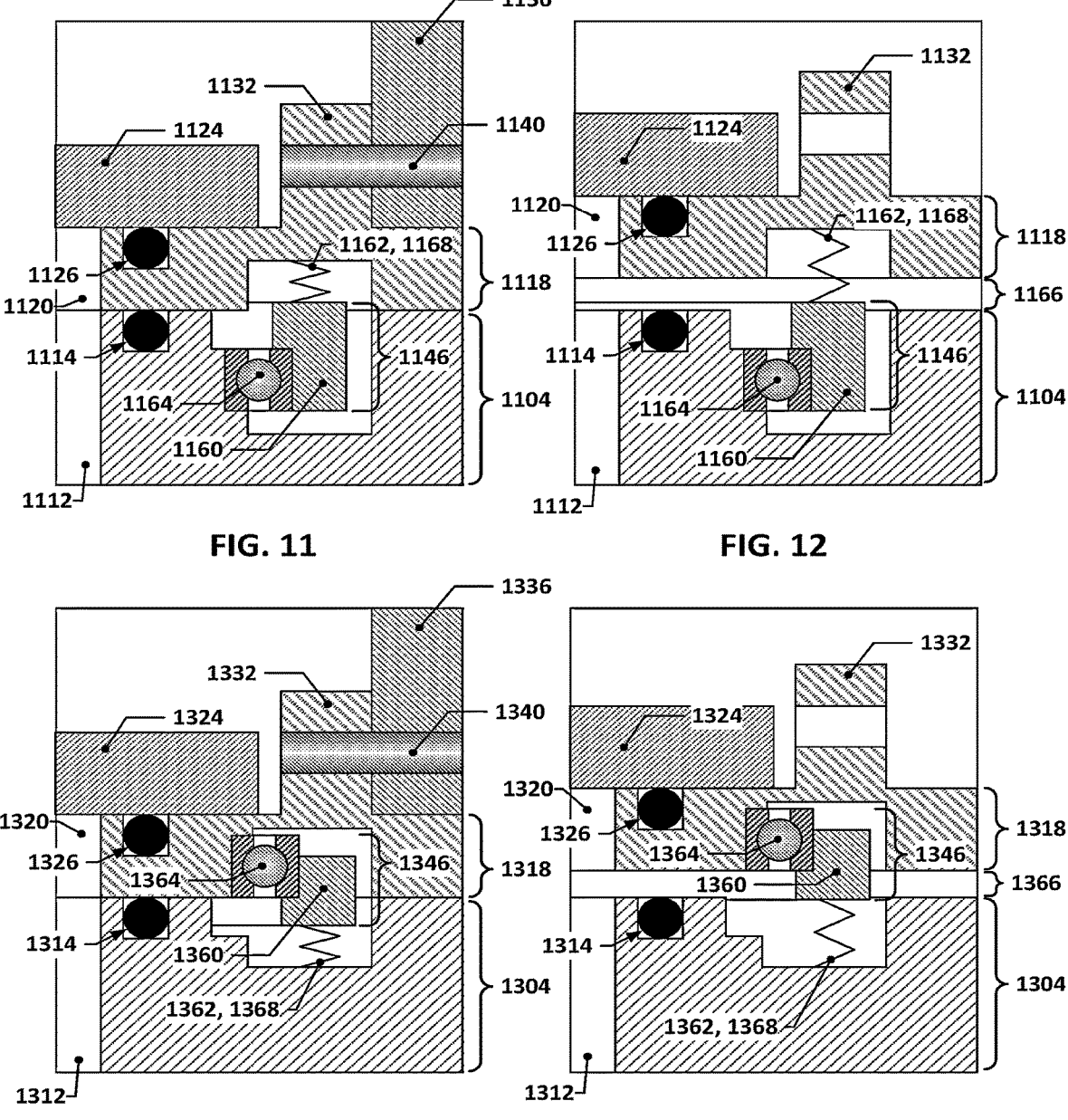
FIGS. 11 and 12 depict a detail view of an example rotational bearing mechanism that may be used in some implementations.
FIGS. 13 and 14 depict a detail view of another example rotational bearing mechanism that may be used in some implementations.

FIGS. 11 and 12 depict a detail view of a portion of an example rotational bearing mechanism that may be used in some implementations; FIG. 11 shows the rotational bearing mechanism as it would be when the top plate assembly is sealed to the chamber housing, e.g., in a first configuration, and FIG. 12 shows the rotational bearing mechanism as it would be when the top plate assembly is able to be rotated, e.g., in a second configuration. It will be understood that the detail views depicted, as with the detail views 13 through 19, are section views that depict only a portion of such example rotational bearing mechanisms, and that the actual rotational bearing mechanisms shown would generally encircle the opening of the respective chamber housing.

In FIG. 11, a portion of a chamber housing 1104 is depicted that is located adjacent to an interior of the chamber housing 1104, e.g., where an opening 1112 meets the chamber housing 1104 and where a seal 1114 that encircles the opening 1112 is located. Also visible in FIG. 11 is a portion of a top plate 1118 that has a lift feature 1132 which allows the top plate 1118 to be releasably engaged with a locking actuator 1140 (only the extended pin of which is visible in FIG. 11) in order to secure the top plate 1118 to, for example, a top assembly housing 1136 (only a portion of which is shown). The top plate 1118 may also be interfaced with one or more gas distribution plates 1124 (again, only a portion of such a gas distribution plate 1124 is shown), each of which may seal cover a respective aperture 1120 and contact a seal 1126 that provides a gas-tight interface between the respective gas distribution plate 1124 and the top plate 1118. Such features are all analogous to similar features discussed with respect to the processing tool 100 discussed with respect to FIGS. 1-4 and FIGS. 5 and 6.

Also visible in FIGS. 11 and 12 are a rotational bearing mechanism 1146, which may include a bearing 1164 and, optionally, a support ring 1160. The bearing 1164 may, for example, be a large-diameter bearing, such as a ball bearing, tapered thrust bearing, or needle thrust bearing, that is suitably large enough to encircle the opening 1112 and the seal 1114 and that is selected to have a load rating large enough to support the entire weight of the top plate assembly that the top plate 1118 is part of. The bearing 1164 (and the rotational bearing mechanism generally) may have a first portion and a second portion that are rotatable relative to each other (there may also, of course, be additional elements-such as the ball or roller elements within the bearing that are rotatable relative to both the first and second portions) and that are each intended to be generally fixed in position with respect to corresponding larger structures that are intended to be rotatable relative to each other using the bearing 1164. For example, in FIG. 11, the first portion of the bearing 1164 may be the bearing race shown to the left of the depicted ball bearing and may be fixed in position, e.g., through a press fit or friction loading, relative to the chamber housing 1104, while the second portion of the bearing 1164 may be generally fixed in position, e.g., via friction loading or some other mechanism, relative to the top plate 1118.

The rotational bearing mechanism 1146 may also, as noted, optionally include a support ring 1160. The support ring 1160 may, for example serve to effectively expand the diameter of the bearing 1164 to allow for a larger area to be provided for loading the bearing 1164 axially, i.e., along the axis of rotation of the bearing 1164. For example, in the implementation of FIGS. 11 and 12, a vertical displacement mechanism 1162 is provided that is in the form of a set of springs 1168, e.g., die springs, that are interposed between the support ring 1160 and the top plate 1118 and which are spaced apart along the circumference of the support ring 1160. For example, there may be three, four, five, six, seven, eight, etc. springs 1168 that are spaced apart along the circumference of the support ring 1160. Alternatively, if the bearing 1164 has a second portion that is sufficiently wide enough radially to provide a surface that the springs 1168 can contact and be supported by, then the springs 1168 may simply rest on the second portion directly and a support ring 1160 or equivalent structure may not be needed. In effect, the support ring 1160 may act as an extension of the second portion of the rotational bearing mechanism 1146.

The vertical displacement mechanism 1152 may be a mechanism that is able to cause the top plate 1118 (and top plate assembly that it is part of) to be vertically displaced between the first configuration, i.e., in which the top plate 1118 is resting atop the chamber housing 1104, and the second configuration, i.e., in which the top plate 1118 is displaced vertically upward from the chamber housing 1104 as compared with the first configuration. This transition results in a vertical gap 1166 coming into existence (see FIG. 12) between the chamber housing 1104 and the top plate 1118. For example, as discussed above, the vertical displacement mechanism 1152 of FIGS. 11 and 12 is provided through the use of a plurality of springs 1168 that are interposed between the top plate 1118 and the chamber housing 1104. The springs 1168 are selected to be of a sufficient stiffness and length that when the top plate assembly is supported entirely (or almost entirely) by the springs 1168, the compressed length of the springs 1168 under such loading conditions is still sufficient to cause the top plate 1118 to be positioned in the second configuration, thereby permitting the top plate assembly to be rotated using the rotational bearing mechanism 1146. When sufficient additional downward force is applied to the top plate 1118, the springs 1168 may be further compressed such that the top plate assembly is caused to transition from the second configuration to the first configuration. For example, if the top assembly housing 1136 is lowered using the vertical lift actuators (not shown, but see similar structures in FIGS. 1-6) such that the top assembly housing 1136 or the top assembly presses against an upward-facing surface of the top plate assembly or top plate 1118 (or, optionally/alternatively, such that the locking actuator(s) 1140 can be engaged with the lift features 1132), further downward movement of the top assembly may act to push the top plate 1118 downward, thereby further compressing the springs 1168, and causing the top plate 1118 to seal against the seal 1114.

In some implementations that utilize springs 1168, the springs 1168 may be selected such that the total force exerted by the springs 1168 when compressed to the lengths that such springs are in when the top plate 1118 is in the first configuration, e.g., compressed to a first length, is greater than the total weight of the top plate assembly but less than the cross-sectional area of the opening 1112 multiplied by standard atmospheric pressure, e.g., ~14.7 psi. Similarly, when the top plate assembly and top plate 1118 are in the second configuration, the total force exerted by the springs 1168 when compressed to the lengths that such springs are in when the top plate 1118 is in the second configuration, e.g., compressed to a second length that is longer than the first length, may be generally equal to the total weight of the top plate assembly (including the top plate 1118).

Thus, in the implementation of FIGS. 11 and 12, when the external loading on the top plate 1118 that keeps the top plate 1118 in place during normal operations is removed, e.g., when the pressure within the chamber housing 1104 and the ambient pressure outside of the chamber housing 1104 are equalized and/or the top plate assembly is raised so as to no longer press down on the top plate 1118, the springs 1168 may act to push the top plate 1118 vertically upward from the first configuration to the second configuration, thereby permitting easy rotation of the top plate 1118 relative to the chamber housing 1104 using the rotational bearing mechanism 1146. This may allow for easier servicing or removal of components mounted to the top plate 1118, e.g., the gas distribution plates 1124 and/or components associated therewith, such as valves, sensors, fittings, etc., by allowing those components to be rotated into a different location than the location they are typically located in for easier access by technicians or tools.

It will be apparent that there are many different ways in which a rotational bearing mechanism and a vertical displacement mechanism may be implemented, all of which are intended to fall within the scope of this disclosure. Some additional such implementations are discussed below.

For example, FIGS. 13 and 14 depict a detail view of another example rotational bearing mechanism that may be used in some implementations. FIG. 13 shows the rotational bearing mechanism as it would be when the top plate assembly is sealed to the chamber housing, and FIG. 14 shows the rotational bearing mechanism as it would be when the top plate assembly is able to be rotated.

The components of FIGS. 13 and 14 are generally analogous to corresponding components sharing the same last two numbers of their callouts in FIGS. 11 and 12; for discussion and description of such elements, the reader is referred to the earlier discussion of such analogous components with respect to FIGS. 11 and 12 unless the discussion below specifically contradicts the earlier discussion.

In the implementation of FIGS. 13 and 14, the rotational bearing mechanism 1346 and vertical displacement mechanism 1352 are effectively flipped upside down as compared with in FIGS. 11 and 12. Thus, the springs 1368 are interposed between the support ring 1360 and the chamber housing 1304 instead of between the support ring 1360 and the top plate 1318 and the bearing 1364 is interposed between the support ring 1360 and the top plate 1318 instead of between the support ring 1360 and the chamber housing 1304. In operation, the implementation of FIGS. 13 and 14 may function generally similar to how the implementation of FIGS. 11 and 12 functions, although the implementation of FIGS. 11 and 12 may be slightly preferable in that the rotational bearing mechanism 1146 and vertical displacement mechanism 1162 may be supported from below by the chamber housing 1104, thereby eliminating any possibility that such components could come loose and fall down when the top plate 1118 is in the second configuration—in contrast, the implementation of FIGS. 13 and 14 may potentially connect the rotational bearing mechanism 1346 and potentially also the vertical lift mechanism 1362 to the top plate 1318, thereby presenting as risk that such components might become loose and fall off of the top plate 1318. Such possibilities may be mitigated or eliminated through the inclusion of design features designed to prevent them, but this may add additional cost as compared with the implementation of FIGS. 11 and 12. Both approaches are viable, however.

Figure 15:
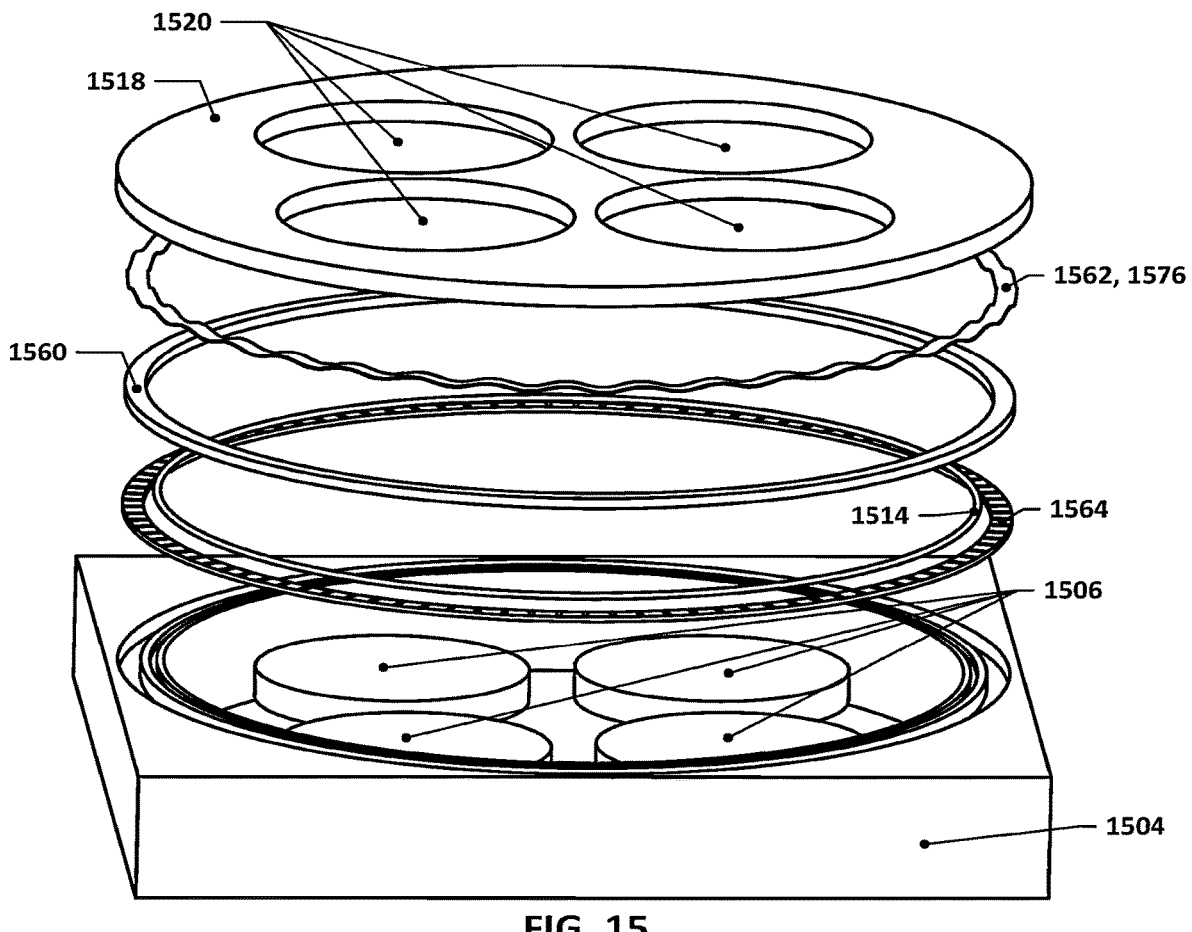
FIG. 15 depicts an exploded perspective view of another example rotational bearing mechanism that may be used in some implementations.

FIG. 15 depicts an exploded perspective view of another example rotational bearing mechanism that may be used in some implementations. The implementation of FIG. 15 is similar to that shown in FIGS. 11 and 12, and although many of the components shown in FIGS. 11 and 12 are not shown in FIG. 15, it may be assumed that such components, e.g., gas distributor plates, seals, etc., may also be included in the implementation of FIG. 15.

In FIG. 15, the vertical displacement mechanism 1562 is provided by a single, circumferential wave spring 1576 that rests on top of a support ring 1560 that, in turn, rests on a large bearing 1564, e.g., a low-profile needle thrust bearing, that encircles a seal 1514. The wave spring 1576 is made of a strip of material that is annular in shape but which has a "wavelike" or sinusoidal (or otherwise periodic) circumferential profile. Each "wave" in the wave spring may act like a single leaf of a leaf spring, with the "waves" acting, in effect, as a circular array of leaf springs that act, in concert, to provide a circumferentially applied upward force on the top plate 1518 (similar to how the springs 1168 and 1368 apply upward force on the top plate in a circumferentially distributed manner). In effect, the wave spring 1576 may function as a single, large diameter spring, but one that has a much higher spring stiffness than could be achieved with a single traditional coil spring that fits within the same envelope and has the same nominal diameter. The wave spring 1576, while shown as a single-layer wave spring, may also be a multi-layer wave spring, e.g., with multiple windings that are arranged so that the waves in each layer align with the waves in adjacent layers, i.e., such that each winding is generally in continuous contact with adjacent windings (or an adjacent winding). Such multi-layer wave springs may allow for increased spring stiffness in the wave spring.

For context, the top plate 1518 is also shown with apertures 1520 and wafer supports 1506, although, as mentioned above, other components shown for other variants are omitted from FIG. 15 to avoid overcrowding the drawing; such components may also be included in the implementation shown in FIG. 15 if desired, however.

The implementations shown in FIGS. 5 through 15 all feature rotational bearing mechanisms paired with vertical displacement mechanisms that are passive in nature, i.e., not requiring any external control or input in order to cause the top plate assembly to transition from the first configuration to the second configuration once the top plate assembly is no longer clamped in place via a pressure differential or via an externally applied downward force applied to the top plate assembly by, for example, the top assembly or another clamping mechanism.

It will be appreciated, however, that rotational bearing mechanisms may also be paired with vertical displacement mechanisms that are active in nature, e.g., hydraulic, pneumatic, screw-driven, geared, or otherwise requiring some form of control input, e.g., supply of electrical, pneumatic, or hydraulic power, in order to transition the top plate assembly from the first configuration to the second configuration. Some example such implementations are depicted in FIGS. 16 through 19.

FIGS. 16 and 17 depict a detail view of yet another example rotational bearing mechanism that may be used in some implementations. FIG. 16 shows the rotational bearing mechanism as it would be when the top plate assembly is sealed to the chamber housing, and FIG. 17 shows the rotational bearing mechanism as it would be when the top plate assembly is able to be rotated.

The components of FIGS. 16 and 17 are generally analogous to corresponding components sharing the same last two numbers of their callouts in FIGS. 11-14; for discussion and description of such elements, the reader is referred to the earlier discussion of such analogous components with respect to FIGS. 11 through 14 unless the discussion below specifically contradicts the earlier discussion.

As can be seen in FIG. 16, a vertical displacement mechanism 1662 is provided that includes a plurality of linear actuators, e.g., piston-driven actuators 1670, e.g., hydraulically or pneumatically driven actuators, that are positioned at spaced-apart locations around the opening 1612. The piston-driven actuators 1670 may be caused to be actuated by, for example, a controller (not shown) or other control mechanism so as to cause the piston-drive actuators to transition between a retracted state and an extended state. When in the retracted state, the piston-driven actuators 1670 may have a length that allows the top plate 1618 to contact the seal 1614 and to be clamped against the top of the chamber housing 1604. When in the extended state (as shown in FIG. 17), the piston-driven actuators 1670 may have a length that causes the top plate 1618 to be lifted clear of the chamber housing 1604 to cause a vertical gap 1666 to come into being between the top plate 1618 and the chamber housing 1604, thereby allowing the top plate assembly to be rotated relative to the chamber housing 1604 via the rotational bearing mechanism 1646.

The implementation of FIG. 16 also features an alignment pin 1674, which may, for example, be fixed in place with respect to one or the other of the chamber housing 1604 and the top plate 1618 and may be size to engage, with little or no slop, with a correspondingly sized alignment hole in the other of the chamber housing 1604 and the top plate 1618. If desired, multiple such alignment pins 1674 may be used to constrain the potential location of the top plate 1618 relative to the chamber housing 1604 and ensure that the two components precisely align with each other when the top plate 1618 is in the first configuration. The alignment pins 1674 may, for example, have a rounded and/or tapered end that protrudes from a surface of the component that they are affixed to compensate for minor rotational or translational misalignments that may occur between the top plate 1618 and the chamber housing 1604 when the top plate 1618 is in the second configuration. For example, as the top plate 1618 is transitioned from the second configuration to the first configuration, the alignment pins 1674 may engage with an edge of the alignment holes and then cause the top plate 1618 to shift slightly so that the alignment pins 1674 are completely aligned with the alignment holes as the top plate is lowered into the first configuration. In some implementations, the alignment holes may alternatively or additionally have rounded or beveled edges to provide a similar result. It will be understood that the alignment pins 1674 may be used in conjunction with the engagement mechanisms and receiver features discussed earlier or may be used in isolation, e.g., without the use of a detent system having one or more engagement mechanisms and one or more receiver features.

FIGS. 18 and 19 depict a detail view of another example rotational bearing mechanism that may be used in some implementations. FIG. 18 shows the rotational bearing mechanism as it would be when the top plate assembly is sealed to the chamber housing, and FIG. 19 shows the rotational bearing mechanism as it would be when the top plate assembly is able to be rotated.

As with the components of FIGS. 16 and 17, the components of FIGS. 18 and 19 are generally analogous to corresponding components sharing the same last two numbers of their callouts in FIGS. 11-17; for discussion and description of such elements, the reader is referred to the earlier discussion of such analogous components with respect to FIGS. 11 through 17 unless the discussion below specifically contradicts the earlier discussion.

In the implementation depicted in FIGS. 18 and 19, the vertical displacement mechanism 1862 takes the form of a linear actuator that uses a screw feature, such as linear screw drive 1872, which may be actuated so as to cause the linear screw element to travel up or down vertically, thereby raising or lowering the top plate 1818 such that a vertical gap 1866 is formed (or removed) between the top plate 1818 and the chamber housing 1804. In another, related implementation, manually driven jacking screws may be used in place of the depicted screw drives.

It will be understood that the various examples of rotational bearing mechanisms discussed above, or similar such rotational bearing mechanisms, may generally be used in placed of the rotational bearing mechanisms that are discussed with respect to the various example semiconductor processing chamber configurations discussed herein.

In the above examples, the rotational bearing mechanisms are all interposed between the top plate assembly and the chamber housing, but some implementations may utilize a rotational bearing mechanism that is interposed, in effect, between the top plate and a portion of the top assembly.

Figure 20:
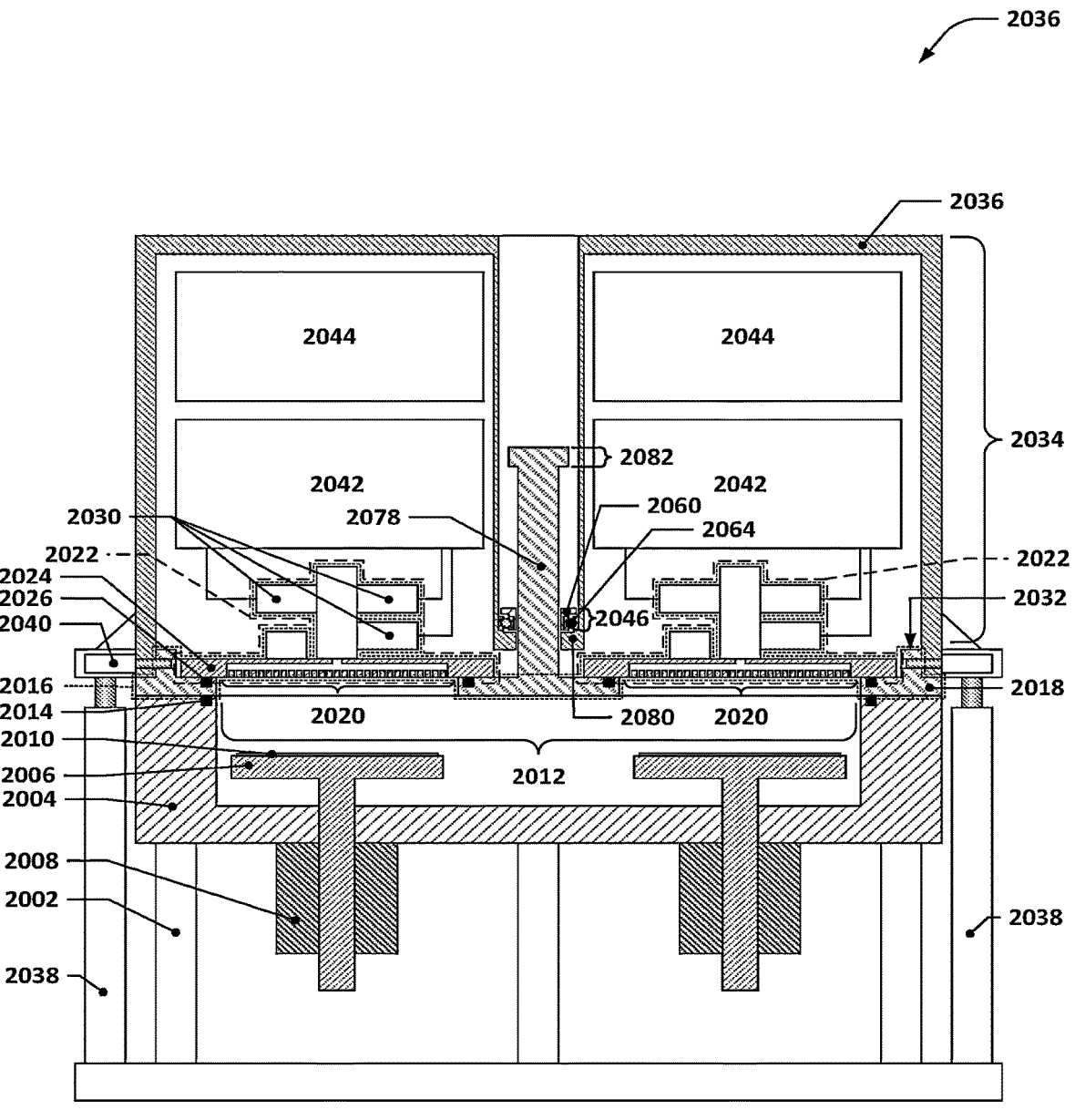
FIG. 20 depicts a side view of another example multi-station processing chamber featuring a different example rotational bearing mechanism.

FIG. 20 depicts a side view of another example multi-station processing chamber featuring a different example rotational bearing mechanism.

As with the components of FIGS. 5 and 6, the components of FIG. 20 are generally analogous to corresponding components sharing the same last two numbers of their callouts in FIGS. 5 and 6; for discussion and description of such elements, the reader is referred to the earlier discussion of such analogous components with respect to FIGS. 5 and 6 unless the discussion below specifically contradicts the earlier discussion.

In the implementation depicted in FIG. 20, the top plate 2018 or top plate assembly 2016 may have a support structure 2078 that protrudes upward from, for example, the approximate center of the top plate 2018 or top plate assembly 2016. The support structure 2078 may be positioned, in some implementations, so as to be at the center of mass of the top plate assembly 2016.

The top assembly housing 2036 may also have a corresponding structure that extends downward towards the support structure 2078. This corresponding structure may have a bearing seat 2080 at one end that may encircle the support structure 2078. The support structure 2078 may thus be described as being generally coaxial with the corresponding structure of the top assembly housing 2036, thereby allowing the support structure 2078 to telescope inwards or outward relative to the corresponding structure.

In the implementation shown in FIG. 20, a rotational bearing mechanism 2046 with a bearing 2058 is interposed between an uppermost portion 2082 of the support structure and a bearing seat 2080 of the corresponding structure. Generally speaking, the uppermost portion 2082 of the support structure and the bearing seat 2080 may each be sized such that the rotational bearing mechanism 2046 is, in effect, trapped between the uppermost portion 2082 and the bearing seat 2080. The gap between the uppermost portion 2082 of the support structure 2078 and the bearing seat 2080 minus the vertical height of the rotational bearing mechanism 2046 may generally represent the amount of relative vertical travel that may occur between the support structure 2078 and the corresponding structure having the bearing seat 2080 before the rotational bearing mechanism 2046 comes into contact with both the bearing seat 2080 and the upper portion 2082 of the support structure, thereby preventing further vertical relative motion between the support structure 2078 and the corresponding structure. FIG. 20 depicts the multi-station processing chamber of FIG. 20 with the top plate in the first configuration, i.e., in contact with the chamber housing 2004, and with the top assembly 2034 in a seated position, e.g., positioned as it might be during normal processing operations.

Figure 21:
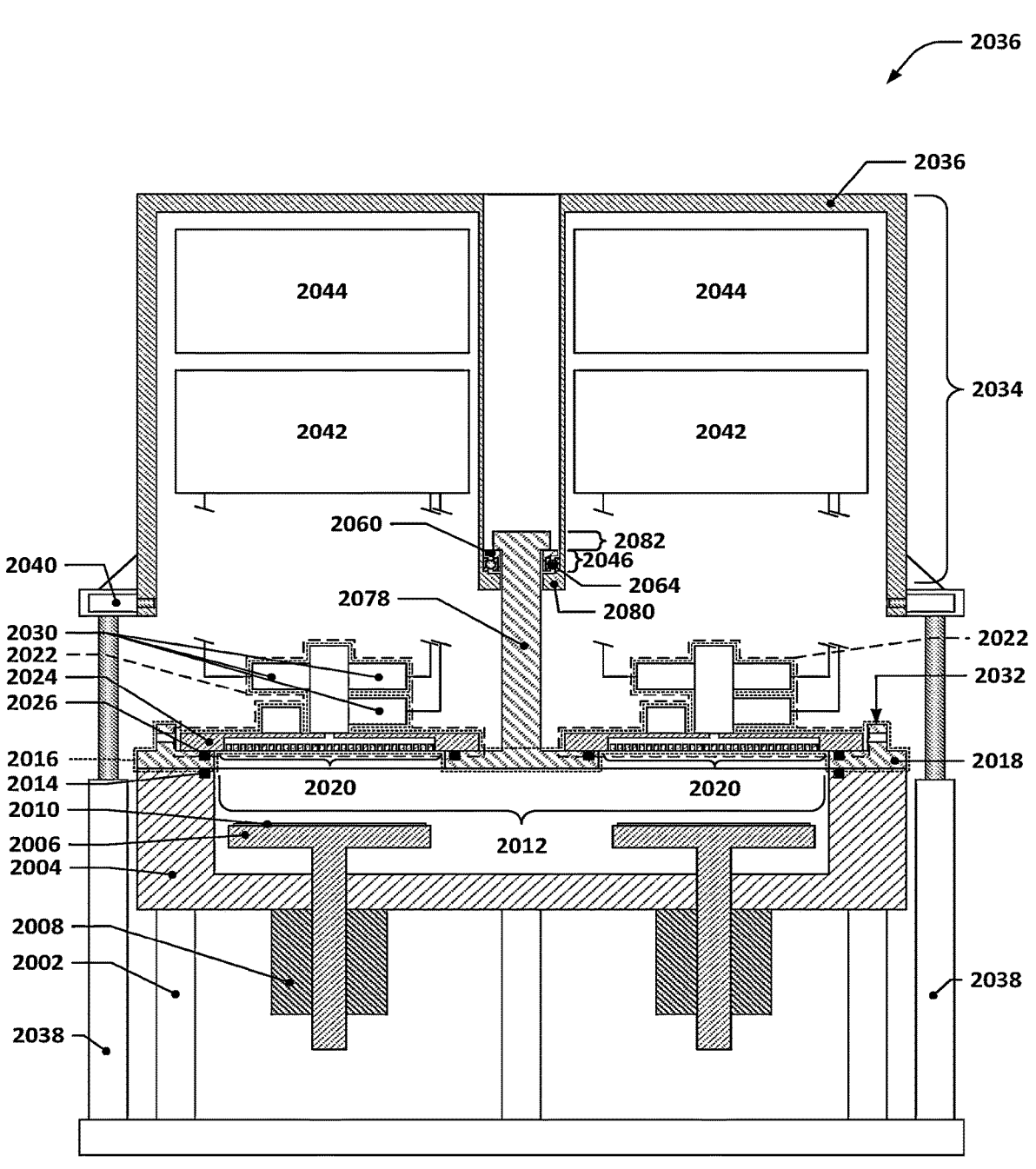
FIG. 21 depicts the example multi-station processing chamber of FIG. 20 with the top assembly raised to a first elevated position.

FIG. 21, in contrast, depicts the example multi-station processing chamber of FIG. 20 with the top assembly 2034 raised to a first elevated position. In the first elevated position, the top assembly 2034 has been raised sufficiently that the rotational bearing mechanism 2046, which may include a bearing 2064 and optionally a support ring 2060, is in contact with both the bearing seat 2080 and the upper portion of the corresponding structure of the top assembly housing 2036. It will be understood that the top plate assembly 2016 may remain stationary in the first configuration during the transition of the top assembly 2034 from the seated position to the first elevated position. It will be understood that any connections between equipment in the top assembly 2034 and the top plate assembly 2016 may be disconnected prior to movement of the top assembly 2034 relative to the top plate assembly 2016, as discussed earlier with respect to earlier Figures depicting similar movement.

Figure 22:
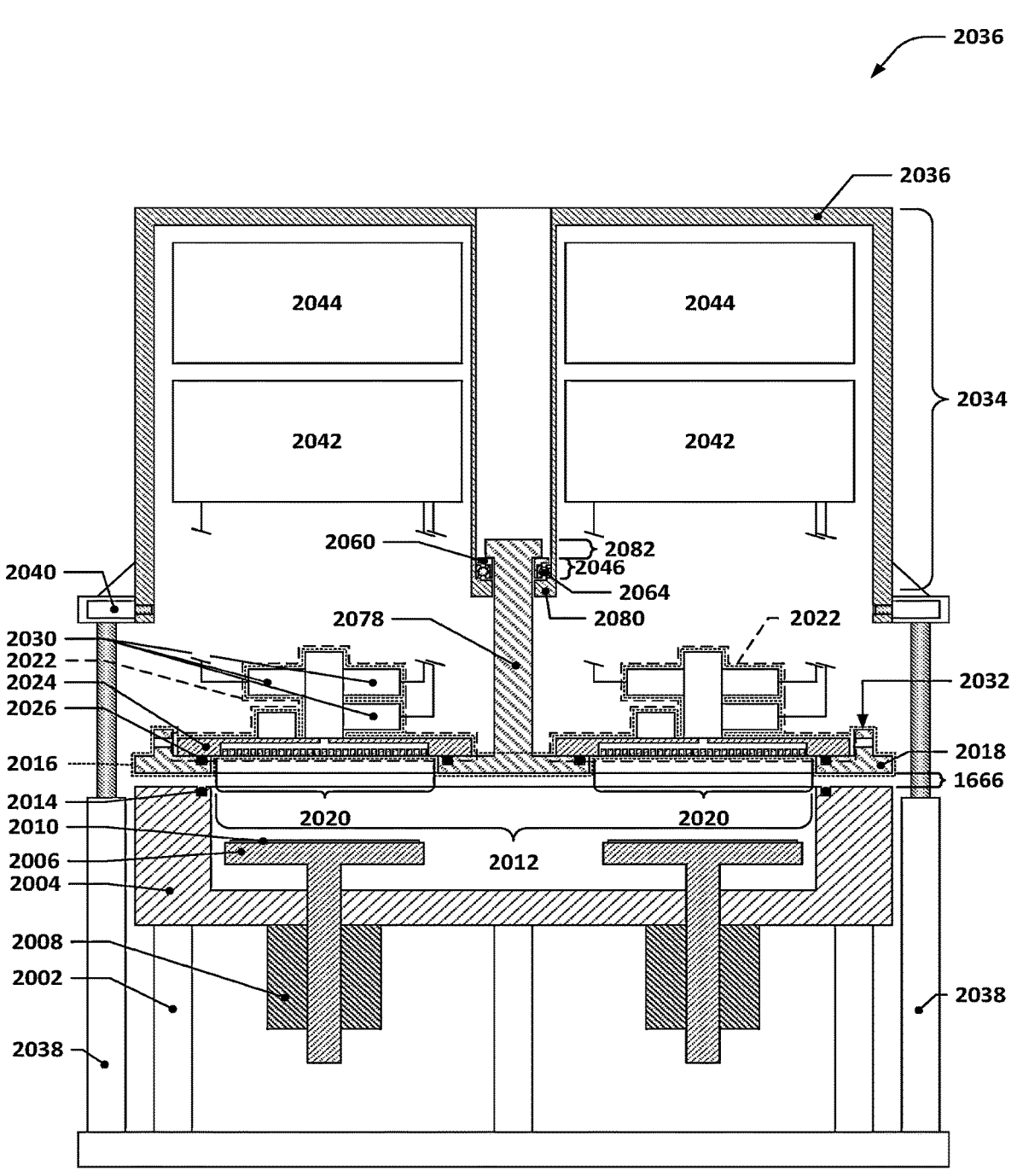
FIG. 22 depicts the example multi-station processing chamber of FIG. 20 with the top assembly raised to a second elevated position.

FIG. 22 depicts the example multi-station processing chamber of FIG. 20 with the top assembly raised to a second elevated position. In transitioning the top assembly 2034 from the first elevated position to the second elevated position, the corresponding structure, via the rotational bearing mechanism 2046, may exert an upward force on the support structure 2078, thereby lifting the top plate assembly 2016 clear of the chamber housing, i.e., to the second configuration, as shown in FIG. 22, thereby causing a vertical gap 2066 to be created between the top plate 2018 and the chamber housing 2004.

Once the top plate assembly 2016 is in the second configuration, the bearing 2064 may permit the top plate assembly 2016 to be rotated in place, similar to the earlier example implementations discussed herein.

It will be understood that variations on such implementations may also be practiced, e.g., the support structure 2078 may instead extend downward from the top assembly housing 2036 and the corresponding structure may instead extend upward from the top plate 2018, for example. Other variations may also be apparent from the examples discussed herein and are similarly considered to be within the scope of this disclosure.

For example, in the above examples, the chamber housing remains fixed at all times, with the top assembly and/or the top plate assembly being raised or lowered in order to place the tool in various states, e.g., such as a state in which the top plate assembly may be rotated relative to the chamber housing. The concepts discussed above may, however, also be implemented in tools in which the chamber housing is capable of vertical movement.

Figure 23:
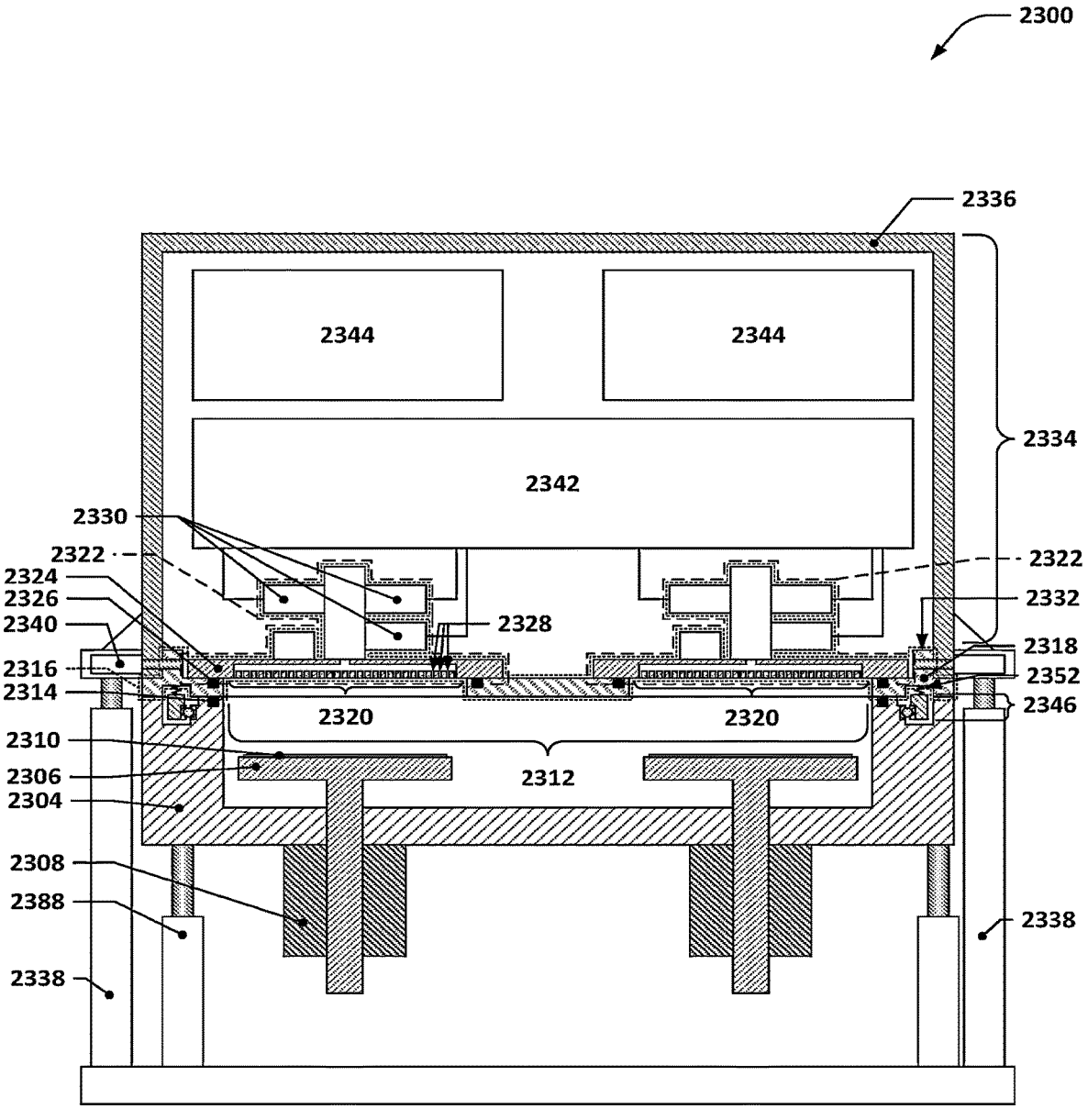
FIG. 23 depicts another example multi-station processing chamber with a rotational bearing mechanism that allows the top plate assembly to be rotated during maintenance and service operations.

For example, FIG. 23 depicts another example multi-station processing chamber with a rotational bearing mechanism that allows the top plate assembly to be rotated during maintenance and service operations. The implementation shown in FIG. 23 is very similar to that shown in FIGS. 5 and 6, and it will be understood that for brevity, a description of all of the various components shown is not provided. The reader is instead referred to the description of such components provided with regard to FIGS. 5 and 6 for descriptions of such components. It will be generally understood that for elements in FIG. 23 that have callouts that share the same last two digits as the callouts for corresponding elements in FIGS. 5 and 6, the description provided for such elements with regard to FIGS. 5 and 6 is equally applicable to the corresponding elements with the same last two digits in their callouts in FIG. 23 unless the context indicates otherwise.

As can be seen in FIG. 23, the base 102 of FIG. 5 has been replaced with a base that features housing lift actuators 2388. The housing lift actuators 2388 may be, for example, hydraulic, gear-driven, or screw-driven actuators that support the chamber housing 2304 and that may be actuated in order to raise or lower the chamber housing 2304. In FIG. 23, the housing lift actuators 2388 are actuated to a state that causes the chamber housing 2304 to press against the underside of the top plate assembly 2316.

The multi-station semiconductor processing tool 2300 shown in FIG. 23 has, similar to the corresponding semiconductor processing tool 100 of FIGS. 5 and 6, a top assembly 2334 that may be moved vertically through the operation of vertical lift actuators 2338. Thus, the top plate assembly 2316 of FIG. 23 may be clamped between the top assembly 2334 and the chamber housing 2304 to be placed into a first configuration in which the interface between the chamber housing 2304 and the top plate assembly 2316 is sealed, but may also be transitioned to a second configuration in which the top plate assembly 2316 is no longer clamped between the chamber housing 2304 and the top assembly 2334 and may thus be rotated relative to the chamber housing 2304 (assuming any other connections, e.g., gas lines, electrical connections, or the like that may hinder such rotational movement have been disconnected or otherwise addressed). The transitioning of the top plate assembly 2316 may be accomplished through moving the top assembly 2334 upward relative to the chamber housing 2304 using the vertical lift actuators 2338, moving the chamber housing 2304 downward relative to the top assembly 2334 using the housing lift actuators 2388, or causing the top assembly 2334 to move upward using the vertical lift actuators 2338 and the chamber housing 2304 to move downward using the housing lift actuators 2388 simultaneously. It will also be understood that in systems in which the chamber housing 2304 is able to be moved vertically, e.g., by housing lift actuators 2388 or other suitable system, the top assembly 2334 (if even present) may be fixed in place, e.g., not supported by an actuation system such as vertical lift actuators 2338. In such implementations, the top assembly 2334 may simply be fixed in place and the chamber housing 2304 may instead be moved up and down relative to the top assembly 2334.

Figure 24:
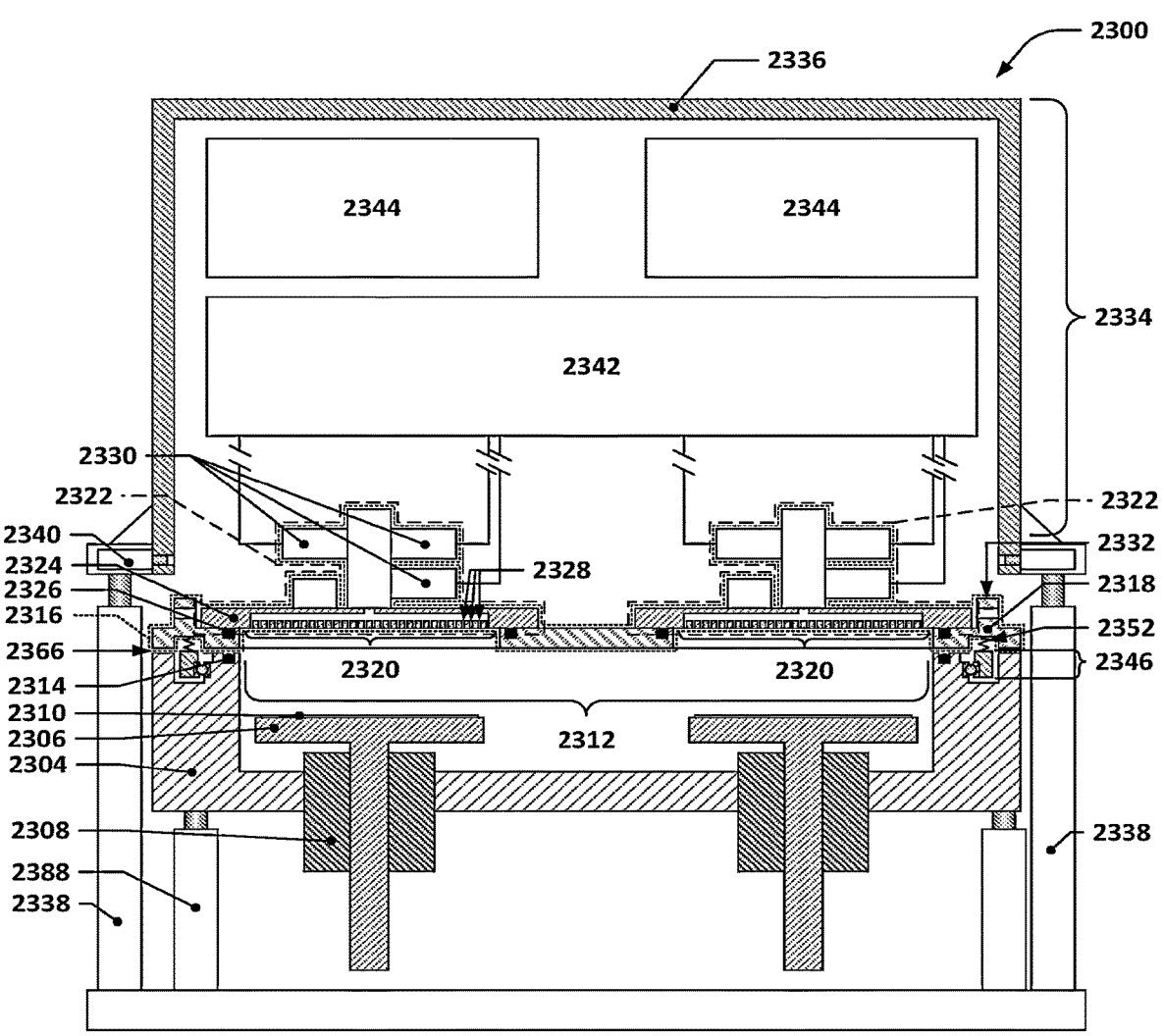
FIG. 24 depicts the example multi-station processing chamber of FIG. 23 with the chamber lowered to a position that allows the top plate assembly to be rotated.

FIG. 24 depicts the example multi-station processing chamber of FIG. 23 with the chamber housing 2304 lowered to a position that allows the top plate assembly 2316 to be rotated. As can be seen, the housing lift actuators 2388 have been actuated so as to lower the chamber housing 2304 relative to the top assembly 2334.

This removes the compression loading that previously compressed the vertical displacement mechanism 2352 and kept the top plate assembly 2316 pressed against the top of the chamber housing 2304 and the seal 2326. With the compression loading removed, the vertical displacement mechanism 2352 (in this case, a spring) is free to exert an upward force on the top plate assembly 2316, thereby lifting it clear of contact with the chamber housing 2304 and allowing it to be rotated relative to the chamber housing 2304 via the rotational bearing mechanism 2346.

Figure 25:
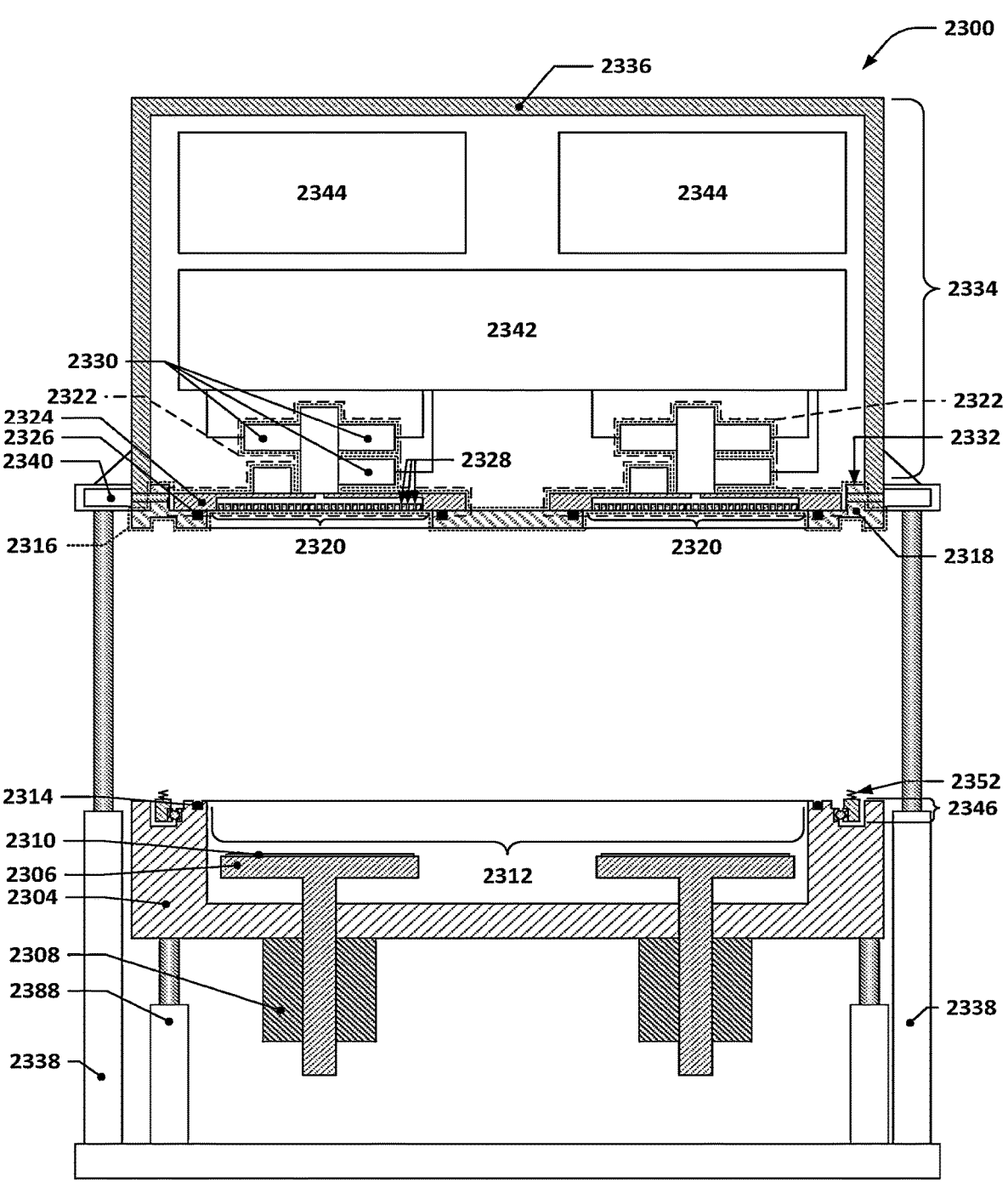
FIG. 25 depicts the example multi-station processing chamber of FIG. 23 with the top plate assembly lifted off of the chamber.

FIG. 25 depicts the example multi-station processing chamber of FIG. 23 with the top plate assembly lifted off of the chamber. In this respect, the multi-station semiconductor processing tool 2300 operates in a manner similar to the previously discussed examples, although it is to be noted that the chamber housing 2304 may, through virtue of operation of the housing lift actuators 2388, also be moved downward while the top assembly 2334 (and the top plate assembly 2316) are moved upward, thereby providing potentially more clearance between the top plate assembly 2316 and the chamber housing 2304 to allow for easier access to the interior of the semiconductor processing tool 2300.

It is also to be understood that while the above discussion has focused entirely on examples in which rotational bearing mechanisms may be used to facilitate rotational movement of a top plate assembly relative to a chamber housing, similar structures and concepts may be used to provide for relative rotational movement between a separable bottom plate of a semiconductor processing tool and a chamber housing. For example, while the example chamber housings of FIGS. 1 through 6 feature an integral bottom plate, i.e., one that is part of the chamber housing 104 itself, other types of multi-station semiconductor processing tools may feature chamber housings in which the "floor" of the chamber housing is, itself, removable, much like a top plate. In such semiconductor processing systems, it may similarly be desirable to be able to facilitate rotation of such a bottom plate (and the components mounted thereto, which may together form a bottom plate assembly) in order to bring portions of the bottom plate assembly that are in difficult-to-access locations into locations that are more easily accessed.

Figure 26:
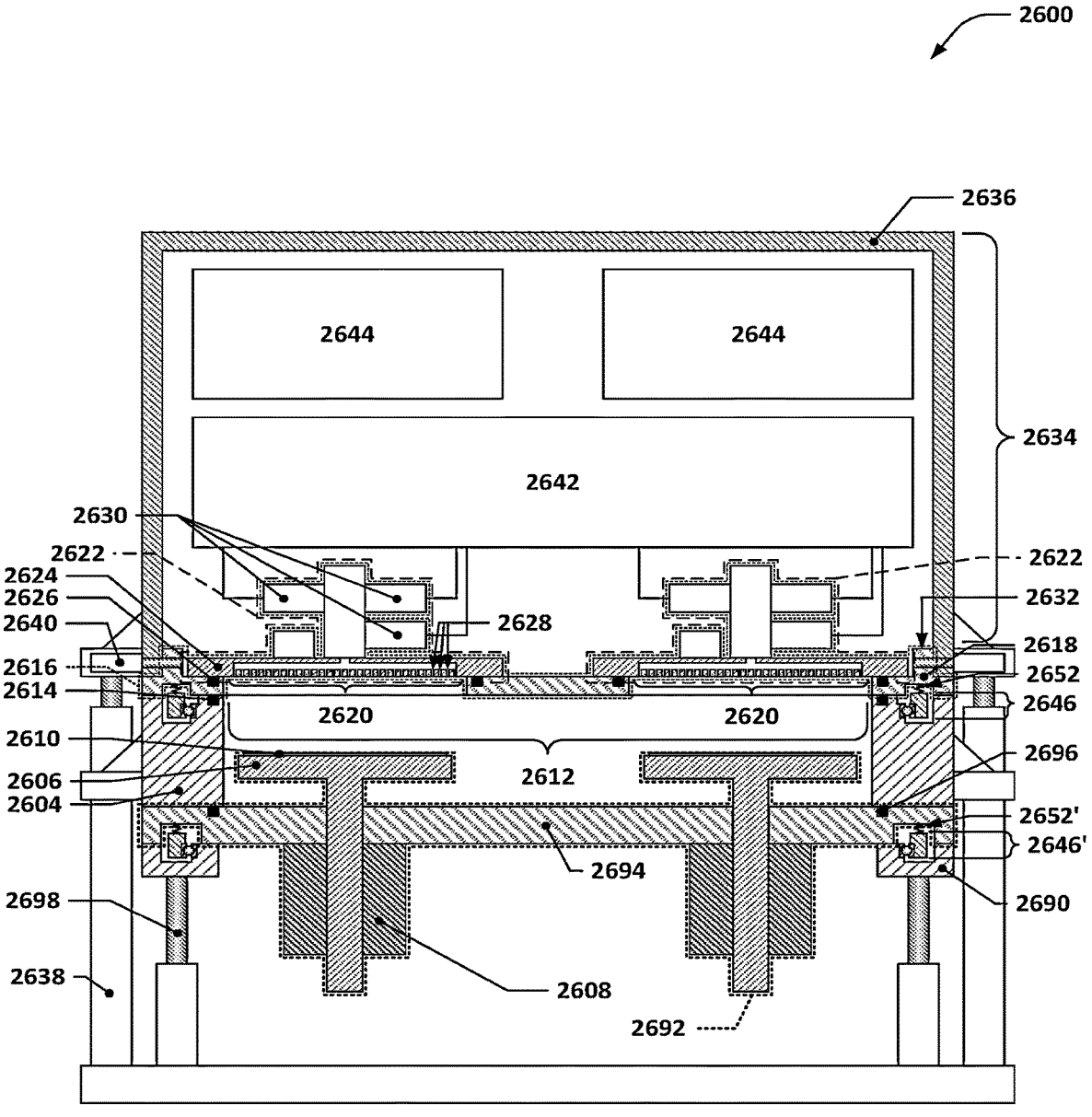
FIG. 26 depicts an example multi-station processing chamber with a bottom plate assembly and a rotational bearing mechanism that allows the bottom plate assembly to be rotated during maintenance and service operations.

FIG. 26 depicts an example multi-station processing chamber with a bottom plate assembly and a rotational bearing mechanism that allows the bottom plate assembly to be rotated during maintenance and service operations.

The implementation shown in FIG. 26 is very similar to that shown in FIGS. 5 and 6 (and other Figures discussed herein), and it will be understood that for brevity, a description of all of the various components shown is not provided. The reader is instead referred to the description of such components provided with regard to FIGS. 5 and 6 for descriptions of such components. It will be generally understood that for elements in FIG. 26 that have callouts that share the same last two digits as the callouts for corresponding elements in FIGS. 5 and 6, the description provided for such elements with regard to FIGS. 5 and 6 is equally applicable to the corresponding elements with the same last two digits in their callouts in FIG. 26 unless the context indicates otherwise.

In the depicted example, the multi-station semiconductor processing tool 2600, in addition to including a bottom plate assembly 2692, also features a rotatable top plate assembly 2616, similar to earlier examples discussed herein. It will be understood, however, that some such implementations may omit such a top plate assembly and may instead provide access to the interior of the chamber housing 2604 via the bottom plate assembly 2692.

In FIG. 26, the bottom plate assembly 2692 supports the wafer supports 2606 and the wafer support actuators 2608 and includes a seal 2696 that may be compressed between the bottom plate assembly 2692 and the chamber housing 2604 in order to seal (or partially seal) the interior volume of the chamber housing 2604.

As can be seen, the semiconductor processing tool 2600 in this example includes bottom plate vertical lift mechanisms 2698 that may be used to support a rotational bearing mechanism support structure 2690 that provides support to rotational bearing mechanism 2646', which is similar in structure and/or function to the rotational bearing mechanism 2646 provided for the top plate assembly 2616 in this example.

The rotational bearing mechanism 2646' in this example is coupled with a vertical displacement mechanism 2652' that, in this example, includes one or more springs. When the bottom plate 2694 is pressed into contact with the underside of the chamber housing 2604, the spring(s) of the vertical displacement mechanism 2652' are compressed, thereby allowing the rotational bearing mechanism support structure 2690 to come into contact with the underside of the bottom plate 2694. This provides a direct, non-compliant load path from the bottom plate vertical lift mechanism 2698 to the bottom plate 2694, thereby allowing for the bottom plate 2694 to be pressed against the underside of the chamber housing 2604 without, for example, overloading the rotational bearing mechanism 2646' (the spring(s) of the vertical displacement mechanism 2652' may be selected such that the force they exert on the rotational bearing mechanism 2646' is low enough that the rotational bearing mechanism 2646' is not overloaded, but also such that the spring force is sufficient to lift the bottom plate 2694 (with all the hardware it supports) out of contact with the rotational bearing mechanism support structure 2690, thus allowing the bottom plate assembly 2692 to rotate relative to the chamber housing 2604 when the bottom plate assembly 2692 is, for example, transitioned between a first configuration in which it is clamped between the chamber housing 2604 and the rotational bearing mechanism support structure 2690, thus sealing the interface between the chamber housing 2604 and the bottom plate 2694, and a second configuration in which the bottom plate 2694 is no longer clamped between the chamber housing 2604 and the bottom plate 2694 and is able to rotate relative to the chamber housing 2604 (after any other impediments to such rotation other than the now-absent clamping force are removed or addressed)).

Figure 27:
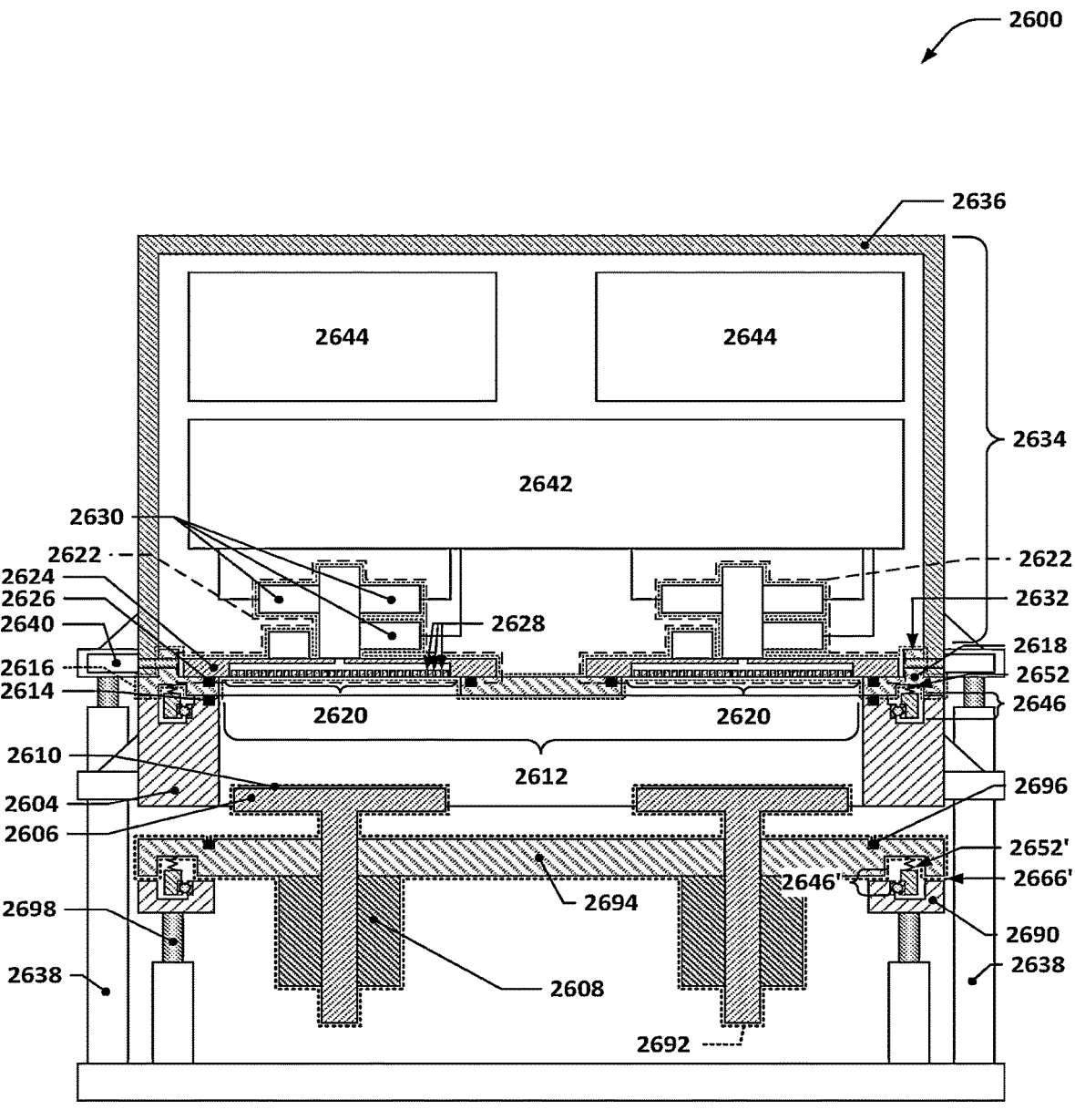
FIG. 27 depicts the example multi-station processing chamber of FIG. 26 with the bottom plate assembly lowered to a position that allows the bottom plate assembly to be rotated relative to the chamber housing.

FIG. 27 depicts the example multi-station processing chamber of FIG. 26 with the bottom plate assembly lowered to a position, e.g., to the second configuration, that allows the bottom plate assembly to be rotated relative to the chamber housing. In FIG. 27, the bottom plate vertical lift mechanisms 2698, which may be provided by one or more hydraulic, screw, or gear-driven actuators, for example, have been actuated so as to lower the rotational bearing mechanism support structure 2690 and the bottom plate assembly 2692 from the first configuration, in which the bottom plate 2694 is sealed against the chamber housing 2604, such that the bottom plate assembly 2692 no longer contacts the underside of the chamber housing 2604, e.g., such that the bottom plate assembly is in the second configuration. Once free of the compressive force produced by the rotational bearing mechanism support structure 2690 and the underside of the chamber housing 2604, the vertical displacement mechanism(s) 2652' may act to lift the bottom plate assembly 2692 clear of the rotational bearing mechanism support structure 2690, thus leaving the rotational bearing mechanism 2646' as the main or only structure that supports the bottom plate assembly 2692. Accordingly, the bottom plate assembly 2692 may be rotated in place using the rotational bearing mechanism 2646' when in such a configuration.

It will be understood that any of the various concepts discussed above with respect to rotatable top plate assemblies may also generally be implemented as well in a similar manner in the context of rotatable bottom plate assemblies, and that this disclosure encompasses such alternate implementations as well.

Additionally, it will be understood that the seals discussed herein may be of any suitable type and are not limited to the elastomeric O-ring seal mentioned earlier. The seals that are used to seal between the chamber housing and the top plate and/or the bottom plate, or between the top plate and the gas distribution plate, for example, may be elastomeric O-rings, gaskets, spring-energized seals, metal seals, crushable seals, etc. Additionally, sealing technologies may be used other than those shown. For example, multiple circumferential seals may be provided at each seal interface and, in some instances, may be provided in the form of differentially pumped seal arrangements.

It will also be understood that while the above discussion has focused extensively on multi-station processing chamber implementations, the various rotational bearing mechanism concepts discussed herein may also be applied in the context of single-station processing chambers. While single-station processing chambers typically feature much smaller top plate assemblies (or equivalents) that do not suffer as much from potentially limited access, it may still be advantageous to include rotational bearing mechanisms, as described herein, in single-station chambers or semiconductor processing tools.

Figure 28:
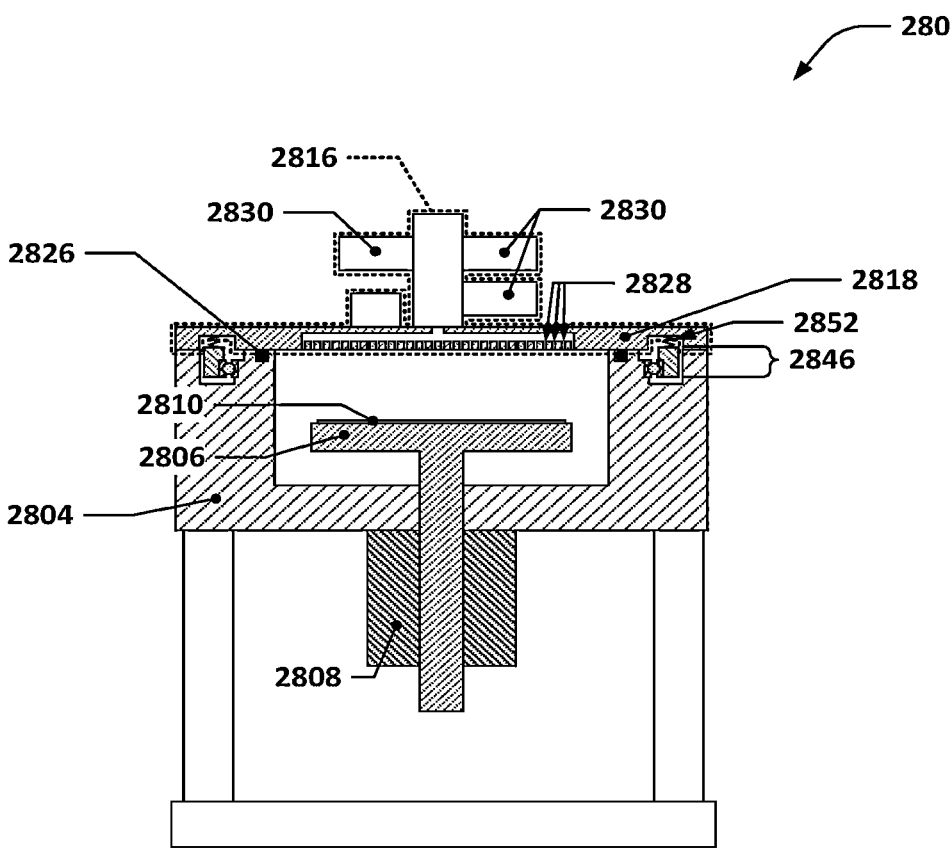
FIG. 28 depicts an example single-station processing chamber that features a rotational bearing mechanism that may be used to rotate a top plate assembly relative to the chamber housing.

FIG. 28 depicts an example single-station processing chamber that features a rotational bearing mechanism that may be used to rotate a top plate assembly relative to the chamber housing. As can be seen in FIG. 28, a semiconductor processing system 2800 is shown that has a chamber housing 2804 that has within it a single wafer support 2806 that is supported within the chamber housing 2804 by a wafer support actuator 2808 and which may be used to support a wafer 2810 within the chamber housing 2804 during processing operations.

In this example, a top plate 2818 is provided that also serves, in effect, as a gas distribution plate (such as gas distribution plate 124 in earlier examples). The top plate 2818 includes an internal plenum that is fluidically connected with a plurality of gas distribution ports 2828 distributed across an underside of the top plate 2818 that allow processing gases to flow from the internal plenum, through the gas distribution ports 2828, and across the wafer 2810. The top plate 2818 may be part of a larger top plate assembly 2816 that may include, for example, various components, such as valves 2830 and other hardware.

While not shown in this example, the top plate 2818 may be held in place on the chamber housing 2804 by way of, for example, a plurality of fasteners, such as threaded fasteners. For example, a plurality of screws or bolts may be inserted through holes in the top plate 2818 and threaded into threaded holes provided in the chamber housing 2804 and then tightened in order to draw the top plate 2818 into contact with the chamber housing 2804 and seal 2826.

When the clamping load on the top plate 2818 is removed, e.g., such as may be the case when the threaded fasteners are removed, a vertical displacement mechanism 2852 may cause the top plate 2818 to be lifted clear of the chamber housing 2804, thus permitting the top plate 2818 to no longer be constrained from rotational motion by way of contact with the chamber housing 2804.

In some further implementations, the concepts discussed herein may be implemented in the context of multi-station semiconductor processing tools that have separate processing chamber structures, e.g., semiconductor processing tools in which each wafer processing station is located within a volume that is able to be sealed off from the other processing stations during wafer processing operations. Such semiconductor processing tools may, for example, feature a center chamber that houses a wafer handling robot and one or more satellite chambers, each of which is connected with the center chamber by a corresponding passage that is sized to allow a wafer to be transferred between the center chamber and the corresponding satellite chamber. Each passage may be equipped with a slit valve or other similar device to allow the corresponding satellite chamber to be sealed off from the center chamber (and thus from fluidic communication with any of the other satellite chambers via the center chamber).

Figure 29:
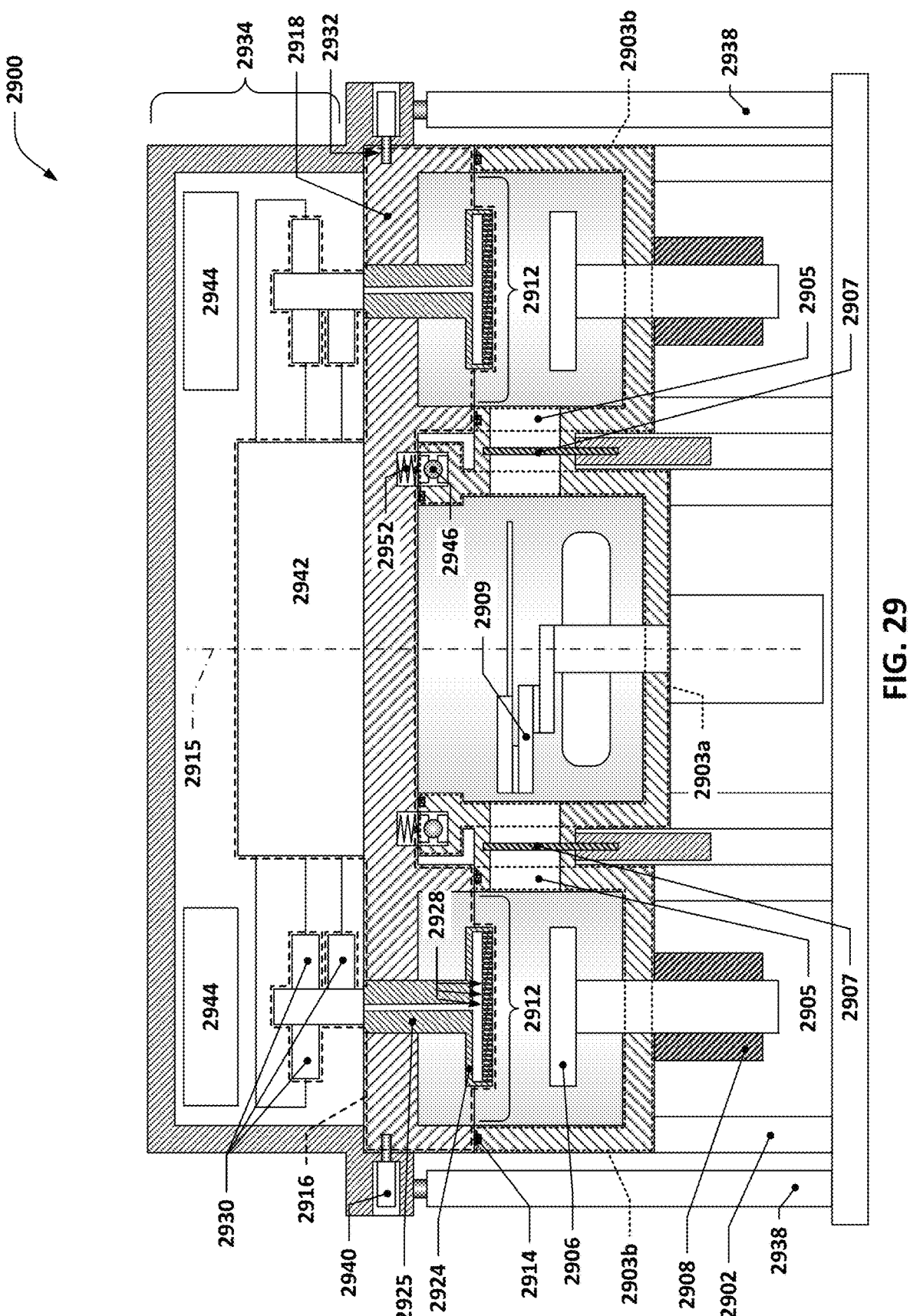
FIG. 29 depicts an example of a semiconductor processing tool having a center chamber structure and a plurality of satellite chamber structures.

FIG. 29 depicts an example of a semiconductor processing tool 2900 having a center chamber structure 2903a and a plurality of satellite chamber structures 2903b. The satellite chamber structures 2903b may each have an opening 2912 that allows access to the interior of that satellite chamber structure 2903b when not sealed.

The center chamber structure 2903a may act as a central hub that may house a wafer handling robot 2909 (which may have one or more robot arms-only one is pictured, but additional such arms may be provided as well). The wafer handling robot 2909 may be configured to be able to rotate so as to face any of passages 2905. Each passage 2905 may connect the center chamber structure 2903a with a corresponding one of the satellite chamber structures 2903b and be sized so as to allow a semiconductor wafer that is to be processed by the semiconductor processing tool 2900 to be passed into the corresponding satellite chamber structure 2903b from the center chamber structure 2903a (or vice versa). Each passage 2905 may also, in some implementations, be equipped with a slit valve 2907 or similar openable and closable mechanism that may be switched between two states-one in which that passage 2905 is sealed off and another in which that passage 2905 is unsealed to allow fluid flow (and wafer transit) therethrough. The center chamber structure 2903a and the satellite chamber structures 2903b may, in some implementations, be machined out of a single piece of material, i.e., have a continuous structure. In other implementations, however, the center chamber structure 2903a and the satellite chamber structures 2903b may be machined as separate components and then assembled together to form a larger chamber structure.

The satellite chamber structures 2903b may be used to house individual semiconductor wafers during processing operations performed using the semiconductor processing tool 2900. Accordingly, each satellite chamber structure 2903b may generally include a pedestal 2906 or other structure that is configured to support the semiconductor wafer during processing. The pedestal 2906 may, in some implementations, be supported relative to the corresponding satellite chamber structure 2903*b* by a wafer support actua-
tor 2908 which may be controlled to as to cause the pedestal
2906 to move up and down, e.g., to facilitate wafer loading
operations and/or position the wafer relative to a gas distri-
bution plate 2924 that may, during processing operations,
direct one or more process gases onto the wafer through a
plurality of gas distribution ports 2928. The gas distribution
plate 2924 may also be referred to as a showerhead; in the
depicted semiconductor processing tool 2900, the gas dis-
tribution plate 2924 is part of a "chandelier" showerhead in
which the gas distribution plate 2924 is supported within the
satellite chamber structure 2903*b* by a stem 2925. In other
implementations, similar to other examples discussed earlier
herein, the gas distribution plate 2924 may form, in effect,
a lid of the satellite chamber structure 2903*b* (a "flush-
mount" showerhead).

The gas distribution plate 2924 may be provided one or
more process gases by way of a gas distribution assembly
that includes, for example, one or more valves 2930 that
receive gas from a gas distribution system 2942.

The depicted example semiconductor processing tool
2900 also includes a top plate assembly 2916 that is, similar
to earlier-discussed top plate assemblies, transitionable
between at least a first configuration and a second configu-
ration. In the first configuration, which is shown in FIG. 29,
the top plate assembly 2916 is engaged with the satellite
chamber structures 2903*b* so as to seal the openings 2912.
The top plate assembly 2916 may, in the first configuration,
be engaged with a seal or seals 2914 that may provide a
gas-tight seal interface between the top plate assembly 2916
and the satellite chamber structures 2903*b*. In the depicted
implementation, the top plate assembly 2916 is also shown
in the first configuration as being engaged with the center
chamber structure 2903*a* so as to seal an opening thereof. It
will be understood, however, that in some implementations
the top plate assembly 2916 may not seal the center chamber
structure 2903*a*. For example, the center chamber structure
2903*a* may be sealed by a separate lid component that
remains sealed regardless of what configuration the top plate
assembly 2916 is in.

The top plate assembly may include a top plate 2918 that
supports one or more other components of the top plate
assembly 2916, e.g., valves 2930, electronics, gas supply
systems, etc.

Figure 30:
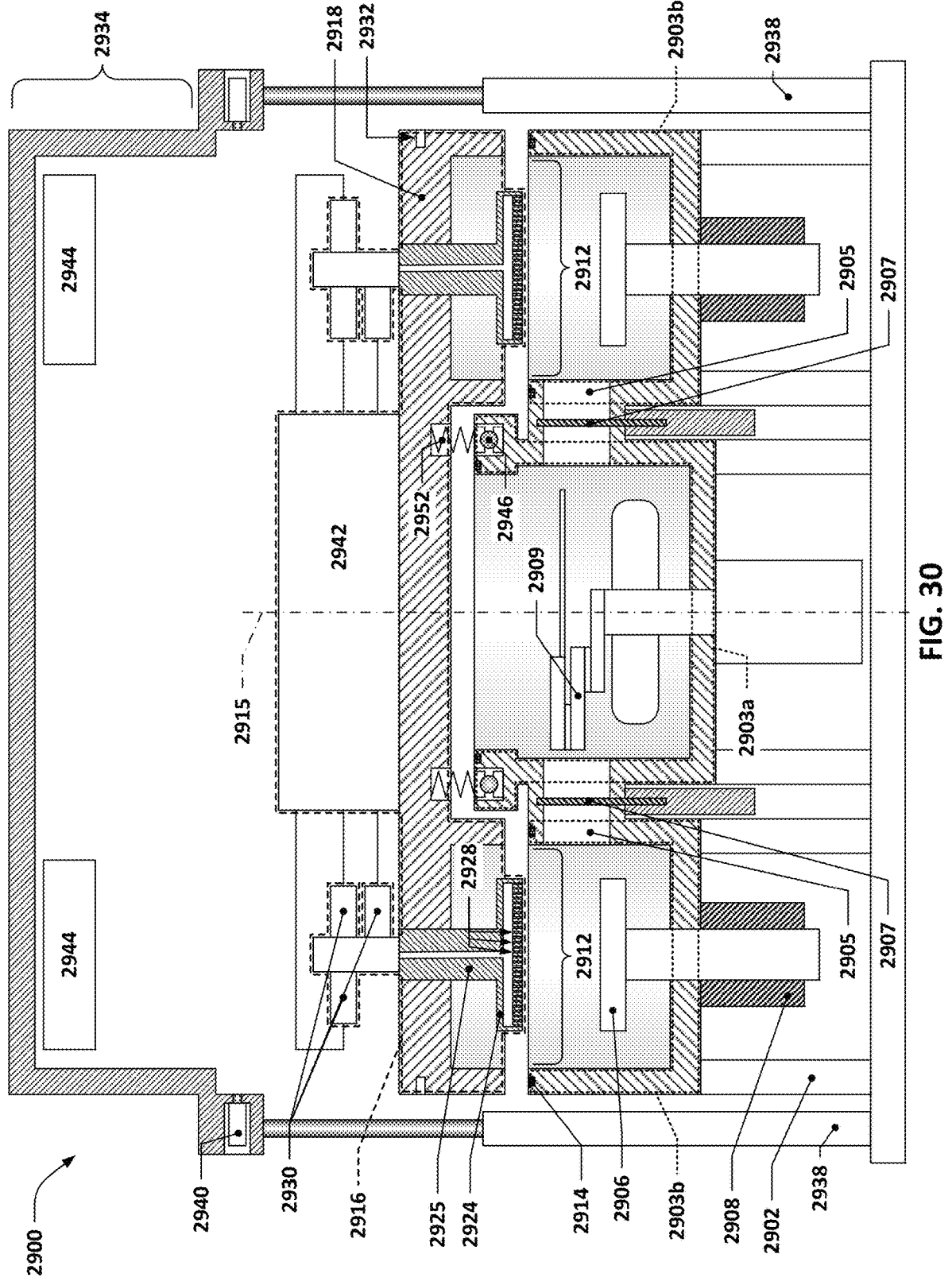
FIG. 30 depicts the example semiconductor processing tool of FIG. 29 but with a top plate assembly in a second configuration.

FIG. 30 depicts the top plate assembly 2916 of the
semiconductor processing tool 2900 in the second configu-
ration. In the second configuration, the top plate assembly
2916 has been caused to lift off of the satellite chamber
structures 2903*b* by operation of a vertical displacement
mechanism or mechanisms 2952. The vertical displacement
mechanism(s) 2952 may be configured so as to cause the top
plate assembly 2916 to displace vertically by at least a
distance sufficient to allow the top plate assembly 2916 to
rotate about an axis 2915 without having components that
are supported by the top plate assembly 2916 and normally
within the satellite chamber structures 2903*b* collide with
the walls of the satellite chamber structures 2903*b* (such
components may, in some cases, be moved into a particular
position relative to the remaining elements of the top plate
assembly 2916 prior to such rotation about the axis 2915—
for example, the gas distribution plates 2924 may be caused
to move upward so as to more easily clear the edges of the
satellite chamber structures 2903*b*).

When the top plate assembly 2916 is in the second
configuration, the top plate assembly 2916 may be supported
by the vertical displacement mechanism(s) 2952 and a
rotational bearing mechanism 2946. The rotational bearing mechanism 2946 may be configured to allow the top plate
assembly 2916 to rotate relative to the center chamber
structure 2903*a* and the satellite chamber structures 2903*b*
between at least a first rotational position and a second
rotational position. The rotational bearing mechanism 2946
may be supported by the center chamber structure 2903*a* or
positioned at any other suitable location that is within a
reference circle that generally lies within the innermost
interior edges of the satellite chamber structures 2903*b*.

In some implementations, the semiconductor processing
tool 2900 may further include a top assembly 2934 that may
cover all or part of the top plate assembly 2916. The top
assembly 2934 may, for example include further compo-
nents, such as radio frequency generators 2944 (or, as shown
in earlier examples the gas distribution system 2942), elec-
tronics, etc. In some implementations with a top assembly
2934, the top assembly 2934 may include locking actuators
2940, e.g., solenoids, screws, or other manually or electroni-
cally controlled devices, that may interface with lift features
2932 on the top plate assembly 2916 when in an actuated or
locked position, thereby causing the top plate assembly 2916
to be locked to the top assembly 2934 and movable there-
with. When the locking actuators 2940 are in a retracted or
unlocked position, they may allow the top assembly 2934 to
be raised without the top assembly 2934 lifting the top plate
assembly 2916 (although the vertical displacement mecha-
nism 2952 may cause the top plate assembly 2916 to move
vertically upward in conjunction with upward movement of
the top assembly 2934). Vertical lift actuators 2938 may be
provided to provide vertical translation capability to the top
assembly 2934 (and the top plate assembly 2916 when the
locking actuators 2940 are engaged). The vertical lift actua-
tors 2938 may be mounted to a portion of a base or
framework 2902 that supports the center chamber structure
2903*a* and the satellite chamber structures 29*b*.

Figure 31:
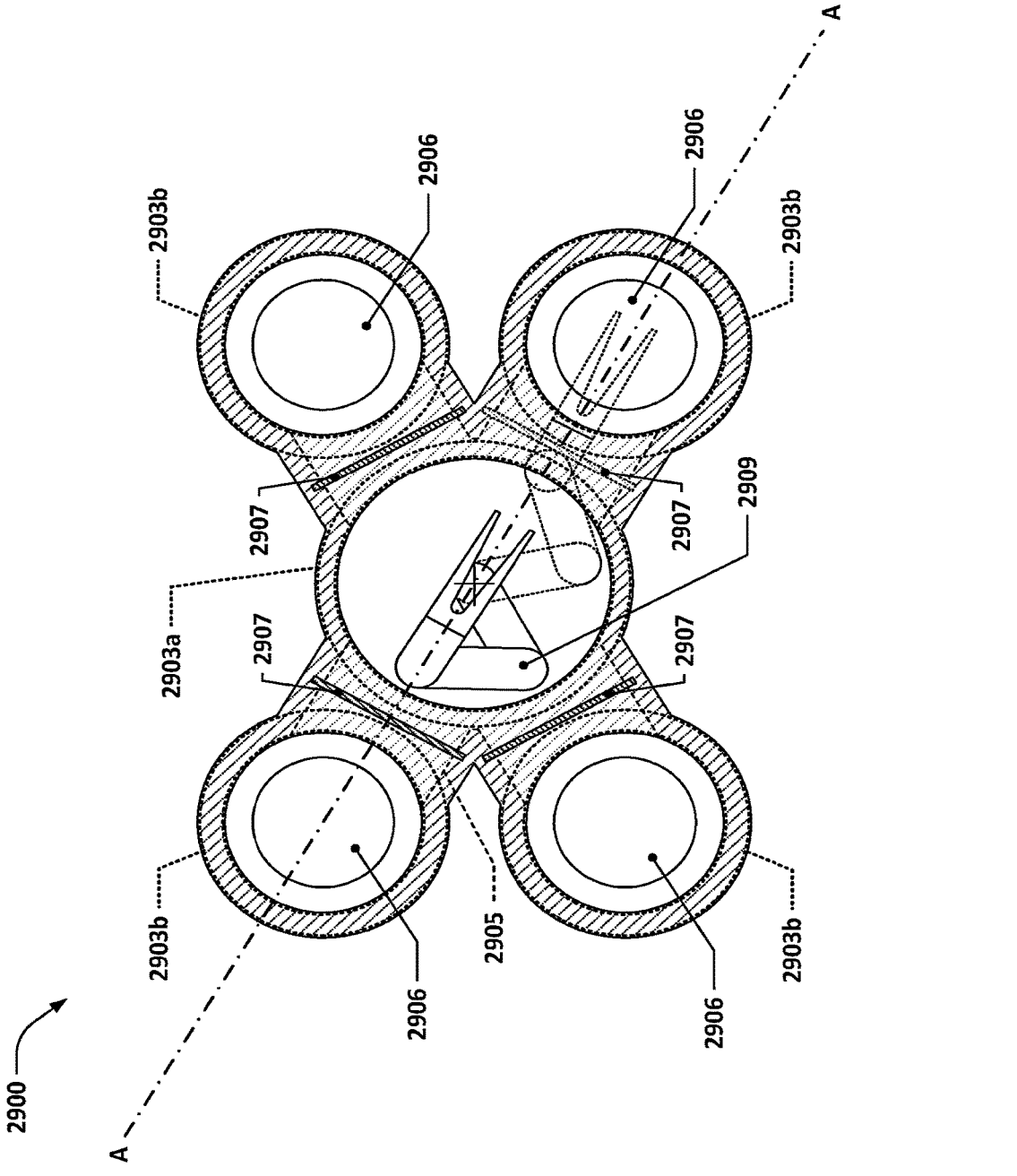
FIG. 31 depicts a top view of the semiconductor processing tool of FIG. 29.

FIG. 31 depicts a plan view of the semiconductor pro-
cessing tool 2900 of FIGS. 29 and 30. In FIG. 31, the top
plate assembly 2916—and components mounted thereto or
thereabove—has been omitted so as to better illustrate the
arrangement of the satellite chamber structures 2903*b* about
the center chamber structure 2903*a*. The wafer handling
robot 2909 is also shown in a retracted and extended (dotted
lines) position. As can be seen, the wafer handling robot
2909, when suitably rotated in order to align it with any
given passage 2905 to a satellite chamber structure 2903*b*,
may be caused to extend into each of the satellite chamber
structures 2903*b*. As can be seen, slit valves 2907 may
extend across the passages 2905 to prevent fluid flow
between the satellite chamber structures 2903*b* and the
center chamber structure 2903*a* (the slit valve 2907 in the
lower right corner has been retracted to the open state to
allow the wafer handling robot 2909 to extend an end
effector into the satellite chamber structure 2903*b* at the
lower right. The line A-A nominally shows a cross-sectional
plane that represents the sectioning plane of FIGS. 29 and
30.

As can be seen, the satellite chamber structures 2903*b* are
arranged in a non-orthogonal "X" arrangement, e.g., cen-
tered along two axes that pass through the center of the
center chamber structure 2903*a* and that are at an oblique
angle to one another. However, other arrangements of such
semiconductor processing tools 2900 may include satellite
chamber structures 2903*b* that are arranged in an orthogonal
"+" shape or even more than four satellite chamber struc-
tures 2903*b* arranged about the center chamber structure
2903*a*.

Figure 32:
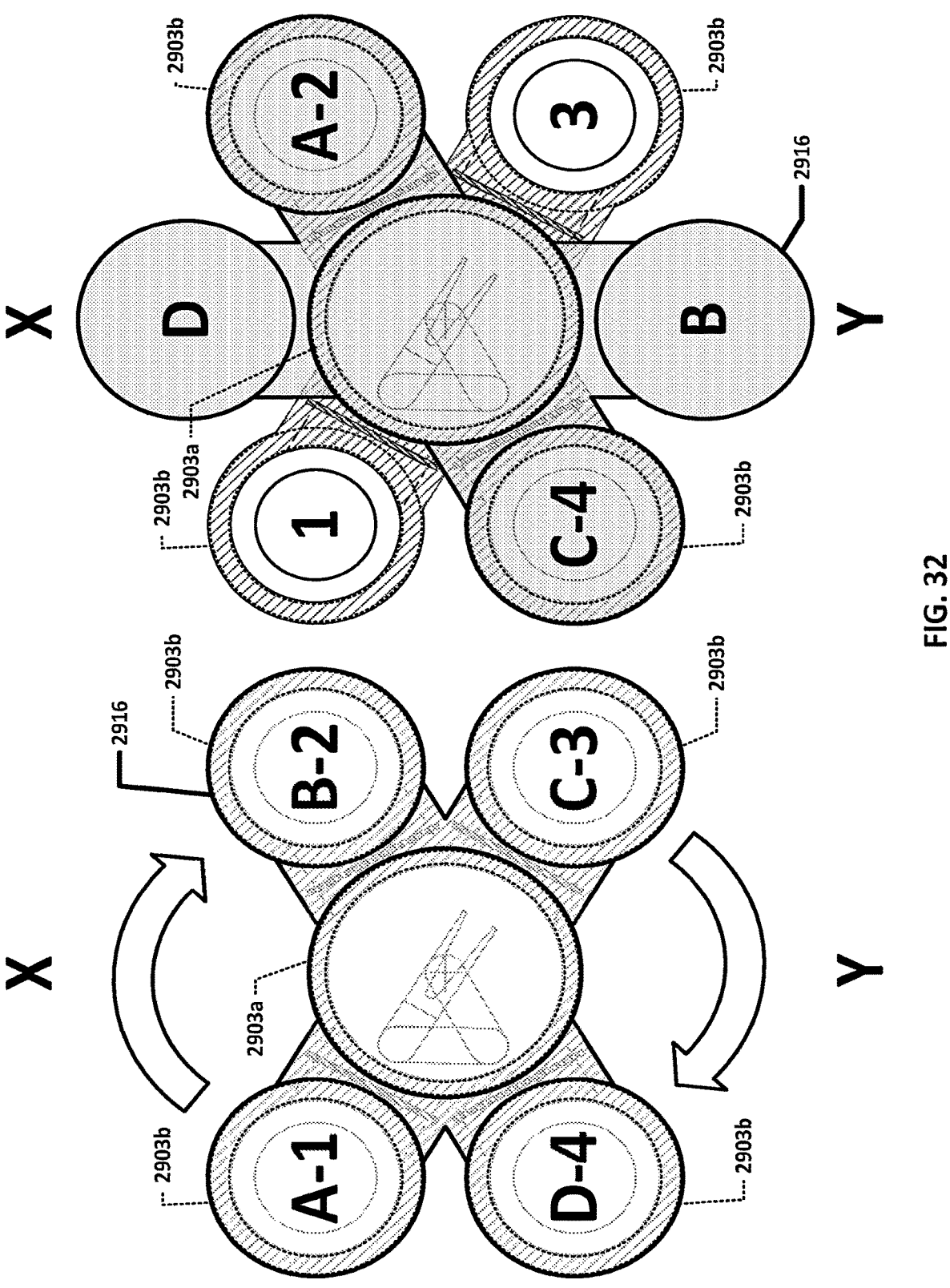
FIG. 32 depicts a top view of the semiconductor processing tool of FIG. 29 with the top plate assembly rotated into a second rotational position.

FIG. 32 depicts top views of the example semiconductor processing tool 2900 when the top plate assembly 2916 (now shown in outline in heavy solid lines and with some degree of shading) in two different rotational positions (as it may be transitioned between when in the second configuration). As can be seen at left in FIG. 32, when the top plate assembly 2916 is in the first rotational position, portions of the top plate assembly 2916 may be positioned above each of the satellite chamber structures 2903*b*. Each of satellite chamber structures 2903*b* 1-4 has a corresponding portion A-D of the top plate assembly 2916 positioned thereabove in the first rotational position.

As can be seen at right in FIG. 32, the top plate assembly 2916 has been rotated 120° so as to cause portions A and C of the top plate assembly 2916 to be positioned over satellite chamber structures 2903*b* 2 and 4, respectively. The portion B of the top plate assembly 2916 is positioned in the gap between the satellite chamber structures 2903*b* 3 and 4, while the portion D is positioned in the gap between the satellite chambers structures 2903*b* numbered 1 and 2. This may, for example, prove advantageous when the semiconductor processing tool is, for example, connected with additional equipment on side X that blocks easy personnel access to portions of the top plate assembly 2916 located on side X but otherwise accessible on side Y. For example, this may allow equipment that is mounted to the top plate assembly 2916 on portion B to be rotated into a position at location Y that allows for easier access to components mounted to portion B. It will be understood that each such portion may be similarly accessed through appropriate rotation of the top plate assembly 2916.

Figure 33:
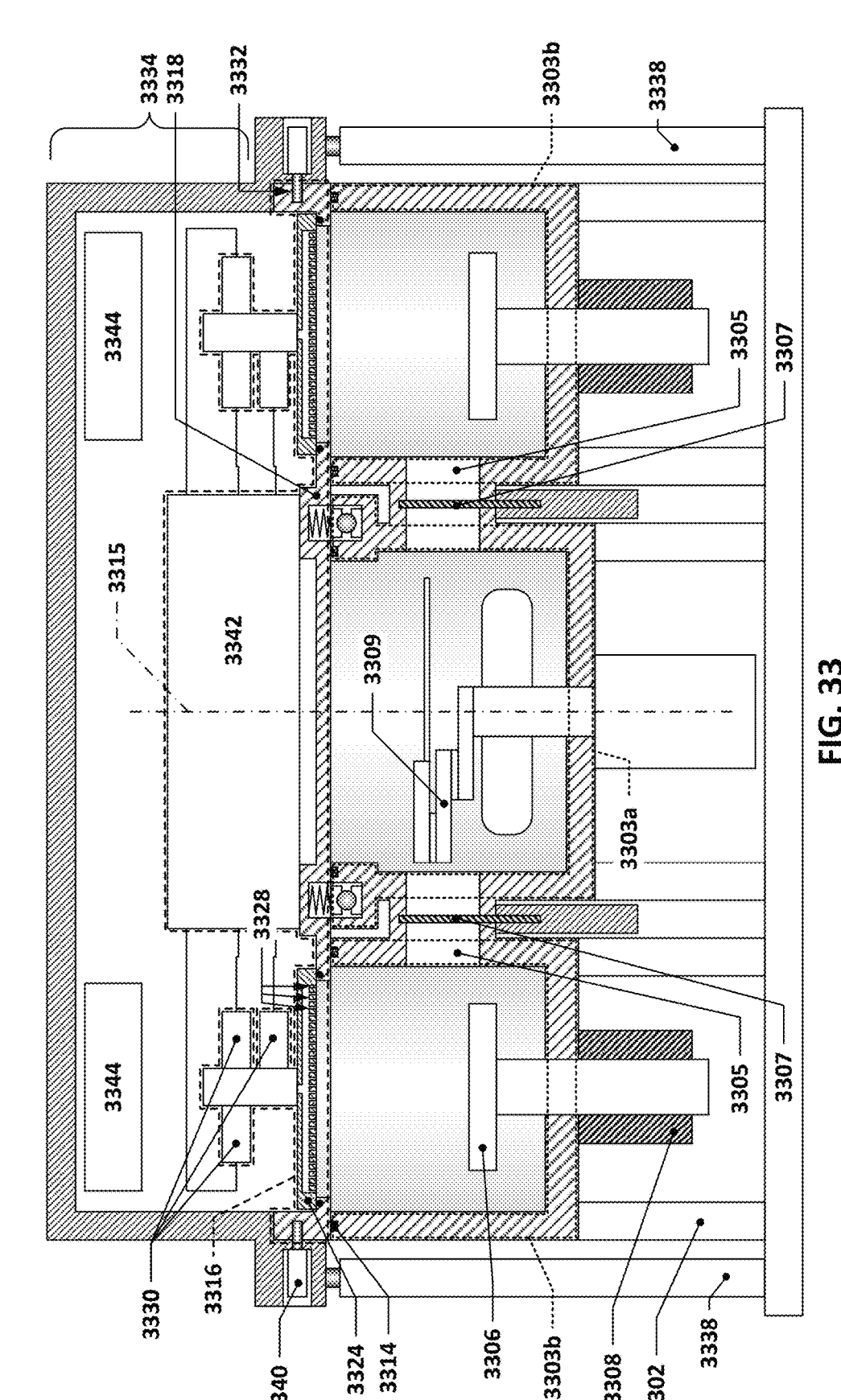
FIG. 33 depicts another example of a semiconductor processing tool having a center chamber structure and a plurality of satellite chamber structures.

FIG. 33 depicts another semiconductor processing tool 3300 that is similar, in many respects, to the example semiconductor processing tool 2900 of FIG. 29. It will be understood that, in the interest of brevity, a full description of the elements of the semiconductor processing tool 3300 is not provided in view of the earlier description of corresponding elements in the semiconductor processing tool 2900. It is to be further understood that the description of elements in FIG. 29 that share the same last two digits as corresponding elements in FIG. 33 (and 34) are equally applicable to those corresponding elements in FIG. 33 (and 34) unless otherwise indicated below.

Whereas the semiconductor processing tool 2900 featured chandelier-type showerheads with gas distribution plates 2924 that were suspended within the satellite chamber structures 2903*b* by way of stems 2925, the semiconductor processing tool 3300 features flush-mount gas distribution faceplates 3324 that are mounted to the top plate 3318, thereby sealing apertures in the top plate 3318. The top plate 2918 similarly included apertures, but those apertures were used to allow the stems 2925 to pass through the top plate 2918.

Figure 34:
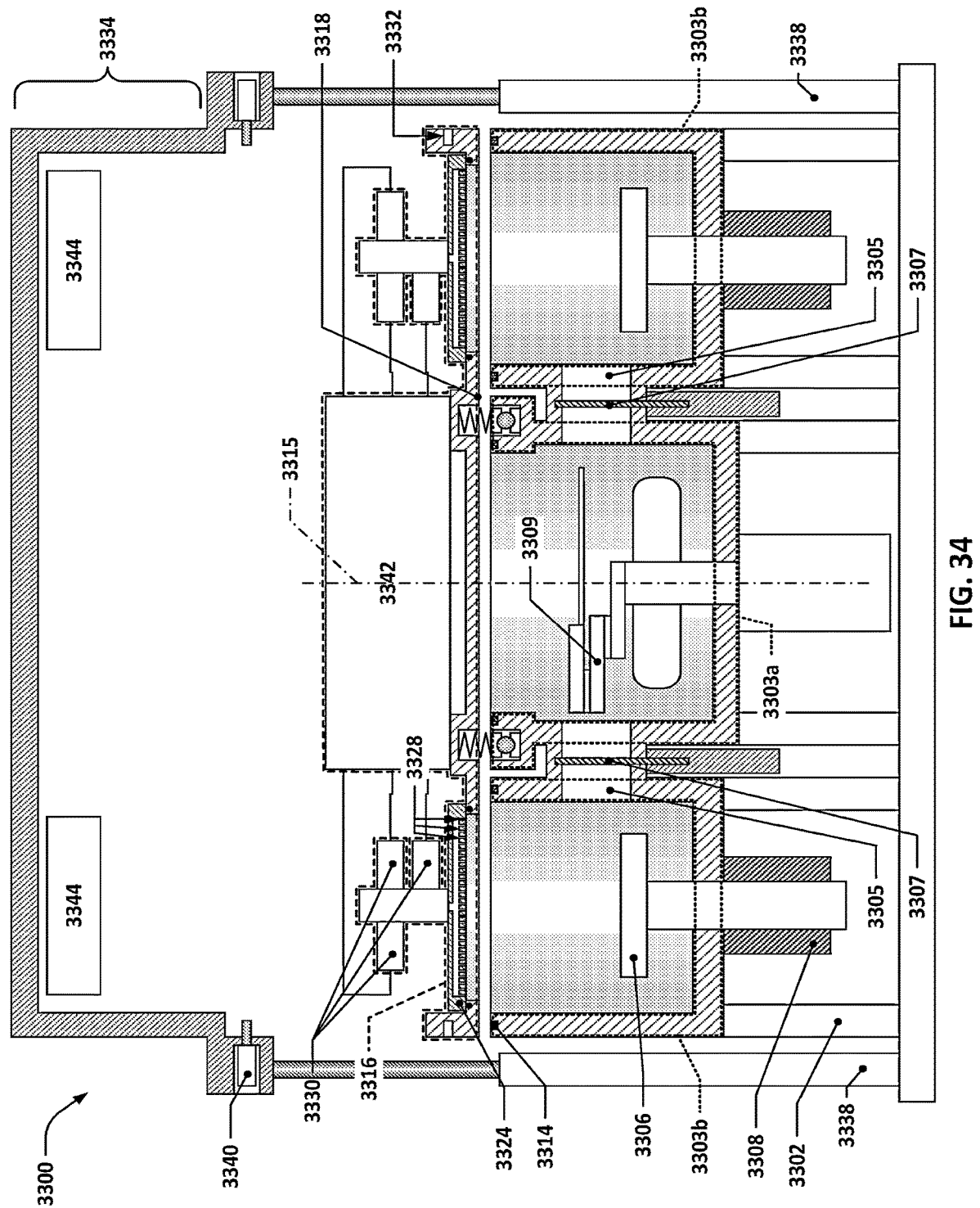
FIG. 34 depicts the example semiconductor processing tool of FIG. 33 but with a top plate assembly in a second configuration.

FIG. 34 shows the top plate assembly 3316 in the second configuration. As can be seen, the amount of vertical displacement of the top plate assembly 3316 that may be needed and/or the thickness of the top plate 3318 may be reduced as compared with a system that uses chandelier-type showerheads since the showerheads may be mounted so as to not be able to potentially collide with the satellite chamber structure 3303*b* walls. It will be understood that other implementations discussed herein, e.g., with respect to FIGS. 5 through 28, may also be implemented so as to use a top plate assembly having chandelier or flush-mount showerheads. Moreover, the various pieces of equipment that may be mounted to or supported by the top plate assembly and/or the top assembly (if present) may vary in various implementations.

In some implementations, a controller may be provided as part of a multi-station chamber or tool, which may be part of the above-described examples. Such systems can comprise semiconductor processing equipment, including the processing tool or tools and/or chamber or chambers such as are described above, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the equipment disclosed herein, including, for example, the vertical lift actuators, active vertical displacement mechanisms, or other equipment. For example, the controller may control the vertical lift actuators to move the top assembly between the seated position and one or more first elevated positions, or may control the vertical lift mechanisms to similar move between different heights to allow for transition of the top plate assembly between the first configuration and the second configuration.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include multi-station plasma etch chambers or modules, multi-station deposition chambers or modules, multi-station spin-rinse chambers or modules, multi-station metal plating chambers or modules, multi-station clean chambers or modules, multi-station bevel edge etch chambers or modules, multi-station physical vapor deposition (PVD) chambers or modules, multi-station chemical vapor deposition (CVD) chambers or modules, multi-station atomic layer deposition (ALD) chambers or modules, multi-station atomic layer etch (ALE) chambers or modules, multi-station ion implantation chambers or modules, multi-station track chambers or modules, or any other systems with multi-station semiconductor processing chambers that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, the term "set" or "subset" should not be viewed, in itself, as necessarily encompassing a plurality of items—it will be understood that a set or a subset can encompass only one member or multiple members (unless the context indicates otherwise).

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood.

Terms such as "about," "approximately," "substantially," "nominal," or the like, when used in reference to quantities or similar quantifiable properties, are to be understood to be inclusive of values within ±10% of the values or relationship specified (as well as inclusive of the actual values or relationship specified), unless otherwise indicated.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure. In particular, the present disclosure is directed to at least the following numbered implementations, which are not to be understood to not be an exclusive or limiting list of implementations; other implementations will be evident from the disclosure as a whole.

Implementation 1: A semiconductor processing apparatus including:

a chamber housing having an opening in an upper surface thereof, wherein the opening is defined by an interior edge that extends around the opening;

a plurality of pedestals positioned at different locations within an interior volume of the chamber housing;

a top plate assembly that is sized to cover the opening and that is configured to be able to be transitioned between at least a first configuration and a second configuration; and a rotational bearing mechanism configured to support the top plate assembly at least when the top plate assembly is in the second configuration, wherein:

the top plate assembly, in the first configuration, is engaged with the chamber housing so as to seal the opening, and the top plate assembly, in the second configuration, is positioned further from the chamber housing than in the first configuration, supported by the rotational bearing mechanism, and able to rotate about a vertical axis between at least a first rotational position and a second rotational position.

Implementation 2: The semiconductor processing apparatus of implementation 1, wherein:

the top plate assembly includes a top plate with a plurality of apertures therethrough, and each pedestal aligns with a corresponding different one of the apertures when the top plate assembly is in the first rotational position.

Implementation 3: The semiconductor processing apparatus of implementation 2, further including a plurality of gas distribution assemblies, each gas distribution assembly mounted to the top plate so as to seal one of the apertures and having a plurality of gas distribution ports located on a surface thereof facing toward the pedestals when the top plate assembly is in either the first configuration or the second configuration and also in the first rotational position.

Implementation 4: The semiconductor processing apparatus of implementation 1, wherein the plurality of pedestals includes four pedestals arranged in a square pattern.

Implementation 5: The semiconductor processing apparatus of implementation 1, wherein at least a center of each pedestal in the plurality of pedestals overlaps with the opening when viewed from above and wherein each pedestal is configured to support a wafer during semiconductor processing operations performed within the chamber housing.

Implementation 6: The semiconductor processing apparatus of implementation 1, wherein:

the rotational bearing mechanism includes a first portion and a second portion that are rotatable relative to each other, the semiconductor processing apparatus further includes one or more vertical displacement mechanisms configured to exert, either directly or indirectly, a total upward force on the top plate assembly that is greater than the weight of the top plate assembly during transition of the top plate assembly from the first configuration to the second configuration, and the first portion, the second portion, and the one or more vertical displacement mechanisms are compressively loaded by the top plate assembly at least when the top plate assembly is in the second configuration.

Implementation 7: The semiconductor processing apparatus of implementation 6, wherein the one or more vertical displacement mechanisms include one or more springs.

Implementation 8: The semiconductor processing apparatus of implementation 7, wherein the one or more springs are a plurality of compression springs that are distributed around the opening at locations outside of the opening.

Implementation 9: The semiconductor processing apparatus of implementation 7, wherein the one or more springs include a circumferential wave spring that encircles the opening.

Implementation 10: The semiconductor processing apparatus of implementation 6, wherein the one or more vertical displacement mechanisms include one or more screw features.

Implementation 11: The semiconductor processing apparatus of implementation 6, wherein the one or more vertical displacement mechanisms include a plurality of linear actuators.

Implementation 12: The semiconductor processing apparatus of implementation 1, further including a detent system including one or more engagement mechanisms and one or more receiver features, wherein:

one of a) the one or more engagement mechanisms and b) the one or more receiver features is fixedly mounted with respect to the top plate assembly and the other of a) of the one or more engagement mechanisms and b) the one or more receiver features is fixedly mounted with respect to the chamber housing, each engagement mechanism is configured to transition between an engaged configuration and a disengaged configuration, and the one or more engagement mechanisms and the one or more receiver features are positioned such that when the top plate assembly is in the first rotational position, at least one of the one or more engagement mechanisms i) is configured to be able to be transitioned from the disengaged configuration to the engaged configuration, ii) is engaged with one of the one or more receiver features when in the engaged configuration, and iii) prevents the top plate assembly from rotating relative to the chamber housing while engaged with the receiver feature of the one or more receiver features.

Implementation 13: The semiconductor processing apparatus of implementation 1, further including:

a top assembly;

one or more vertical lift actuators;

one or more locking actuators; and one or more lift features, wherein:

the one or more lift features are part of the top plate assembly, the one or more vertical lift actuators are configured to vertically translate the top assembly between at least a seated position and a first elevated position, the one or more locking actuators are positioned so as to be releasably engageable with the one or more lift features when the top assembly is in the seated position, and the top plate assembly translates with the top assembly when the top assembly is translated from the seated position to the first elevated position by the one or more vertical lift actuators and the one or more locking features are engaged with the one or more lift features.

Implementation 14: The semiconductor processing apparatus of implementation 13, further including:

a support structure that is part of the top plate assembly and extends upward from the top plate assembly; and a bearing seat that is part of the top assembly, wherein:

the one or more vertical lift actuators are further configured to also vertically translate the top assembly between the first elevated position and a second elevated position higher than the first elevated position, the rotational bearing mechanism is located in between the bearing seat and an uppermost end of the support structure, the rotational bearing mechanism is compressively loaded by the bearing seat and the support structure during translation of the top assembly between the first elevated position and the second elevated position, and the top plate assembly is in the second configuration when the top assembly is at the second elevated position and not supporting the top plate assembly.

Implementation 15: A semiconductor processing apparatus including:

a chamber housing having a seal interface on a bottom surface thereof;

a bottom plate assembly that is positioned beneath the chamber housing, sized to cover the seal interface, and configured to be able to be transitioned between at least a first configuration and a second configuration;

a plurality of pedestals positioned at different locations at least partially within an interior volume of the chamber housing when the bottom plate assembly is in the first configuration; and a rotational bearing mechanism configured to support the bottom plate assembly at least when the bottom plate assembly is in the second configuration, wherein:

the bottom plate assembly, in the first configuration, is engaged with the seal interface of the chamber housing, and the bottom plate assembly, in the second configuration, is positioned further from the chamber housing than in the first configuration, supported by the rotational bearing mechanism, and able to rotate about a vertical axis between at least a first rotational position and a second rotational position.

Implementation 16: The semiconductor processing apparatus of implementation 15, wherein the bottom plate assembly supports the plurality of pedestals.

Implementation 17: The semiconductor processing apparatus of implementation 16, further including a plurality of gas distribution assemblies, each gas distribution assembly having a plurality of gas distribution ports located on a surface thereof facing toward, and centered above, a corresponding one of the pedestals when the bottom plate assembly is in at least the first rotational position.

Implementation 18: The semiconductor processing apparatus of implementation 15, wherein the plurality of pedestals includes four pedestals arranged in a square pattern.

Implementation 19: The semiconductor processing apparatus of implementation 15, wherein:

the rotational bearing mechanism includes a first portion and a second portion that are rotatable relative to each other, the semiconductor processing apparatus further includes one or more vertical displacement mechanisms configured to exert, either directly or indirectly, a total upward force on the bottom plate assembly that is greater than the weight of the bottom plate assembly during transition of the bottom plate assembly from the first configuration to the second configuration, and the first portion, the second portion, and the one or more vertical displacement mechanisms are compressively loaded by the bottom plate assembly in both the first configuration and the second configuration.

Implementation 20: The semiconductor processing apparatus of implementation 19, wherein the one or more vertical displacement mechanisms include one or more springs.

Implementation 21: The semiconductor processing apparatus of implementation 20, wherein the one or more springs are a plurality of compression springs that are distributed around the bottom plate assembly at locations outside of a region defined by the seal interface.

Implementation 22: The semiconductor processing apparatus of implementation 20, wherein the one or more springs include a circumferential wave spring that encircles the seal interface.

Implementation 23: The semiconductor processing apparatus of implementation 19, wherein the one or more vertical displacement mechanisms include one or more screw features.

Implementation 24: The semiconductor processing apparatus of implementation 19, wherein the one or more vertical displacement mechanisms include a plurality of linear actuators.

Implementation 25: The semiconductor processing apparatus of implementation 15, further including a detent system including one or more engagement mechanisms and one or more receiver features, wherein:

one of a) the one or more engagement mechanisms and b) the one or more receiver features is fixedly mounted with respect to the bottom plate assembly and the other of a) of the one or more engagement mechanisms and b) the one or more receiver features is fixedly mounted with respect to the chamber housing, each engagement mechanism is configured to transition between an engaged configuration and a disengaged configuration, and the one or more engagement mechanisms and the one or more receiver features are positioned such that when the bottom plate assembly is in the first rotational position, at least one of the one or more engagement mechanisms i) is configured to be able to be transitioned from the disengaged configuration to the engaged configuration, ii) is engaged with one of the one or more receiver features when in the engaged configuration, and iii) prevents the bottom plate assembly from rotating relative to the chamber housing while engaged with the receiver feature of the one or more receiver features.

Implementation 26: The semiconductor processing apparatus of implementation 15, further including:

a rotational bearing mechanism support structure; and one or more bottom plate vertical lift mechanisms, wherein:

the rotational bearing mechanism is interposed between the bottom plate and the rotational bearing mechanism support structure, the rotational bearing mechanism support structure is interposed between the rotational bearing mechanism and the one or more bottom plate vertical lift mechanisms, and the one or more bottom plate vertical lift mechanisms are configured to translate at least the rotational bearing mechanism support structure and the rotational bearing mechanism between positions associated with the first configuration and the second configuration.

Implementation 27: A semiconductor processing apparatus including:

a chamber housing having an opening in an upper surface thereof, wherein the opening is defined by an interior edge that extends around the opening;

a pedestal positioned within an interior volume of the chamber housing;

a top plate assembly that is sized to cover the opening and that is configured to be able to be transitioned between at least a first configuration and a second configuration; and a rotational bearing mechanism configured to support the top plate assembly at least when the top plate assembly is in the second configuration, wherein:

the top plate assembly, in the first configuration, is engaged with the chamber housing so as to seal the opening, and the top plate assembly, in the second configuration, is positioned further from the chamber housing than in the first configuration, supported by the rotational bearing mechanism, and able to rotate about a vertical axis between at least a first rotational position and a second rotational position.

Implementation 28: The semiconductor processing apparatus of implementation 27, wherein the top plate assembly includes a plurality of gas distribution ports located on a surface thereof facing toward the pedestal when the top plate assembly is in either the first configuration or the second configuration and also in the first rotational position.

Implementation 29: The semiconductor processing apparatus of implementation 27, wherein:

the rotational bearing mechanism includes a first portion and a second portion that are rotatable relative to each other, the semiconductor processing apparatus further includes one or more vertical displacement mechanisms configured to exert, either directly or indirectly, a total upward force on the top plate assembly that is greater than the weight of the top plate assembly during transition of the top plate assembly from the first configuration to the second configuration, and the first portion, the second portion, and the one or more vertical displacement mechanisms are compressively loaded by the top plate assembly at least when the top plate assembly is in the second configuration.

Implementation 30: The semiconductor processing apparatus of implementation 29, wherein the one or more vertical displacement mechanisms include one or more springs.

Implementation 31: The semiconductor processing apparatus of implementation 30, wherein the one or more springs are a plurality of compression springs that are distributed around the opening at locations outside of the opening.

Implementation 32: The semiconductor processing apparatus of implementation 30, wherein the one or more springs include a circumferential wave spring that encircles the opening.

Implementation 33: The semiconductor processing apparatus of implementation 29, wherein the one or more vertical displacement mechanisms include one or more screw features.

Implementation 34: The semiconductor processing apparatus of implementation 29, wherein the one or more vertical displacement mechanisms include a plurality of linear actuators.

Implementation 35: The semiconductor processing apparatus of implementation 27, further including a detent system including one or more engagement mechanisms and one or more receiver features, wherein:

one of a) the one or more engagement mechanisms and b) the one or more receiver features is fixedly mounted with respect to the top plate assembly and the other of a) of the one or more engagement mechanisms and b) the one or more receiver features is fixedly mounted with respect to the chamber housing, each engagement mechanism is configured to transition between an engaged configuration and a disengaged configuration, and the one or more engagement mechanisms and the one or more receiver features are positioned such that when the top plate assembly is in the first rotational position, at least one of the one or more engagement mechanisms i) is configured to be able to be transitioned from the disengaged configuration to the engaged configuration, ii) is engaged with one of the one or more receiver features when in the engaged configuration, and iii) prevents the top plate assembly from rotating relative to the chamber housing while engaged with the receiver feature of the one or more receiver features.

Implementation 36: A semiconductor processing apparatus including:

a center chamber structure;

a wafer handling robot positioned within the center chamber structure;

a plurality of satellite chamber structures arranged around the center chamber structure, each satellite chamber structure:

connected with the center chamber structure via a corresponding passage sized to allow a wafer to be passed from the center chamber structure and into that satellite chamber structure by the wafer handling robot, and having a corresponding opening;

a top plate assembly that extends over the satellite chamber structures and is configured to be transitionable between at least a first configuration and a second configuration; and a rotational bearing mechanism configured to support the top plate assembly at least when the top plate assembly is in the second configuration, wherein:

the top plate assembly, in the first configuration, is engaged with each of the satellite chamber structures so as to seal the openings thereof, and the top plate assembly, in the second configuration, is positioned further from the satellite chamber structures than in the first configuration, supported by the rotational bearing mechanism, and able to rotate about a vertical axis between at least a first rotational position and a second rotational position.

Implementation 37: The semiconductor processing apparatus of implementation 36, wherein:

the top plate assembly includes a top plate and has a plurality of apertures therethrough, and each aperture aligns with a corresponding different one of the satellite chamber structures when the top plate assembly is in the first rotational position.

Implementation 38: The semiconductor processing apparatus of implementation 37, further including a plurality of gas distribution assemblies, each gas distribution assembly mounted to the top plate so as to seal one of the apertures and having a plurality of gas distribution ports located on a surface thereof facing towards an interior volume of a corresponding one of the satellite chamber structures when the top plate assembly is in either the first configuration and the first rotational position or in the second configuration and the first rotational position.

Implementation 39: The semiconductor processing apparatus of implementation 37, further including a plurality of gas distribution assemblies, each gas distribution assembly having a stem that extends through one of the apertures and a gas distributor with a plurality of gas distribution ports located within a volume defined, at least in part, by a corresponding one of the satellite chamber structures and the top plate assembly when the top plate assembly is in either the first configuration and the first rotational position or in the second configuration and the first rotational position.

Implementation 40: The semiconductor processing apparatus of implementation 36, wherein there are four satellite chamber structures arranged in a non-orthogonal X configuration centered on the center chamber structure.

Implementation 41: The semiconductor processing apparatus of implementation 36, wherein there are four satellite chamber structures arranged in a + configuration centered on the center chamber structure.

Implementation 42: The semiconductor processing apparatus of implementation 36, wherein there are more than four satellite chamber structures arranged around the center chamber structure.

Implementation 43: The semiconductor processing apparatus of implementation 36, wherein:

the rotational bearing mechanism includes a first portion and a second portion that are rotatably connected, the semiconductor processing apparatus further includes one or more vertical displacement mechanisms configured to exert, either directly or indirectly, a total upward force on the top plate assembly that is greater than the weight of the top plate assembly during transition of the top plate assembly from the first configuration to the second configuration, and the first portion, the second portion, and the one or more vertical displacement mechanisms are compressively loaded by the top plate assembly at least when the top plate assembly is in the second configuration.

Implementation 44: The semiconductor processing apparatus of implementation 43, wherein the one or more vertical displacement mechanisms include one or more springs.

Implementation 45: The semiconductor processing apparatus of implementation 44, wherein the one or more springs are a plurality of compression springs that are distributed along the rotational bearing mechanism.

Implementation 46: The semiconductor processing apparatus of implementation 45, wherein the one or more springs include a circumferential wave spring that is concentric with an axis of rotation of the rotational bearing mechanism.

Implementation 47: The semiconductor processing apparatus of implementation 43, wherein the one or more vertical displacement mechanisms include one or more screw features.

Implementation 48: The semiconductor processing apparatus of implementation 43, wherein the one or more vertical displacement mechanisms include a plurality of linear actuators.

Implementation 49: The semiconductor processing apparatus of implementation 36, further including a detent system including one or more engagement mechanisms and one or more receiver features, wherein:

one of a) the one or more engagement mechanisms and b) the one or more receiver features is fixedly mounted with respect to the top plate assembly and the other of a) of the one or more engagement mechanisms and b) the one or more receiver features is fixedly mounted with respect to the center chamber structure, each engagement mechanism is configured to transition between an engaged configuration and a disengaged configuration, and the one or more engagement mechanisms and the one or more receiver features are positioned such that when the top plate assembly is in the first rotational position, at least one of the one or more engagement mechanisms i) is configured to be able to be transitioned from the disengaged configuration to the engaged configuration, ii) is engaged with one of the one or more receiver features when in the engaged configuration, and iii) prevents the top plate assembly from rotating relative to the center chamber structure while engaged with the receiver feature of the one or more receiver features.

Implementation 50: The semiconductor processing apparatus of implementation 36, further including:

a top assembly;

one or more vertical lift actuators;

one or more locking actuators; and one or more lift features, wherein:

the one or more lift features are part of the top plate assembly, the one or more vertical lift actuators are configured to vertically translate the top assembly between at least a seated position and a first elevated position, the one or more locking actuators are positioned so as to be releasably engageable with the one or more lift features when the top assembly is in the seated position, and the top plate assembly translates with the top assembly when the top assembly is translated from the seated position to the first elevated position by the one or more vertical lift actuators and the one or more locking features are engaged with the one or more lift features.

Implementation 51: The semiconductor processing apparatus of implementation 50, further including:

a support structure that is part of the top plate assembly and extends upward from the top plate assembly; and a bearing seat that is part of the top assembly, wherein:

the one or more vertical lift actuators are further configured to also vertically translate the top assembly between the first elevated position and a second elevated position higher than the first elevated position, the rotational bearing mechanism is located in between the bearing seat and an uppermost end of the support structure, the rotational bearing mechanism is compressively loaded by the bearing seat and the support structure during translation of the top assembly between the first elevated position and the second elevated position, and the top plate assembly is in the second configuration when the top assembly is at the second elevated position and not supporting the top plate assembly.

What is claimed is:

1. A semiconductor processing apparatus comprising:

a chamber housing having an opening in an upper surface thereof, wherein the opening is defined by an interior edge that extends around the opening;

a plurality of pedestals positioned at different locations within an interior volume of the chamber housing;

a top plate assembly that is sized to cover the opening and that is configured to be able to be transitioned between at least a first configuration and a second configuration; and a rotational bearing mechanism configured to support the top plate assembly at least when the top plate assembly is in the second configuration, wherein:

the top plate assembly, in the first configuration, is engaged with the chamber housing so as to seal the opening, and the top plate assembly, in the second configuration, is positioned further from the chamber housing than in the first configuration, supported by the rotational bearing mechanism, and able to rotate about an axis centered between the pedestals and between at least a first rotational position and a second rotational position.

2. The semiconductor processing apparatus of claim 1, wherein:

the top plate assembly includes a top plate with a plurality of apertures therethrough, and each pedestal aligns with a corresponding different one of the apertures when the top plate assembly is in the first rotational position.

3. The semiconductor processing apparatus of claim 2, further comprising a plurality of gas distribution assemblies, each gas distribution assembly mounted to the top plate so as to seal one of the apertures and having a plurality of gas distribution ports located on a surface thereof facing toward the pedestals when the top plate assembly is in either the first configuration or the second configuration and also in the first rotational position.

4. The semiconductor processing apparatus of claim 1, wherein the plurality of pedestals includes four pedestals arranged in a square pattern.

5. The semiconductor processing apparatus of claim 1, wherein at least a center of each pedestal in the plurality of pedestals overlaps with the opening when viewed from above and wherein each pedestal is configured to support a wafer during semiconductor processing operations performed within the chamber housing.

6. The semiconductor processing apparatus of claim 5, wherein:

the top plate assembly includes a top plate with a plurality of apertures therethrough, and each pedestal aligns with a corresponding different one of the apertures when the top plate assembly is in the first rotational position.

7. The semiconductor processing apparatus of claim 6, further comprising a plurality of gas distribution assemblies, each gas distribution assembly mounted to the top plate so as to seal one of the apertures and having a plurality of gas distribution ports located on a surface thereof facing toward the pedestals when the top plate assembly is in either the first configuration or the second configuration and also in the first rotational position.

8. The semiconductor processing apparatus of claim 1, wherein:

the rotational bearing mechanism includes a first portion and a second portion that are rotatable relative to each other, the semiconductor processing apparatus further comprises one or more vertical displacement mechanisms configured to exert, either directly or indirectly, a total upward force on the top plate assembly that is greater than the weight of the top plate assembly during transition of the top plate assembly from the first configuration to the second configuration, and the first portion, the second portion, and the one or more vertical displacement mechanisms are compressively loaded by the top plate assembly at least when the top plate assembly is in the second configuration.

9. The semiconductor processing apparatus of claim 8, wherein the one or more vertical displacement mechanisms include one or more springs.

10. The semiconductor processing apparatus of claim 9, wherein the one or more springs are a plurality of compression springs that are distributed around the opening at locations outside of the opening.

11. The semiconductor processing apparatus of claim 9, wherein the one or more springs include a circumferential wave spring that encircles the opening.

12. The semiconductor processing apparatus of claim 8, wherein the one or more vertical displacement mechanisms include one or more screw features.

13. The semiconductor processing apparatus of claim 8, wherein the one or more vertical displacement mechanisms include a plurality of linear actuators.

14. The semiconductor processing apparatus of claim 8, wherein:

the top plate assembly includes a top plate with a plurality of apertures therethrough, and each pedestal aligns with a corresponding different one of the apertures when the top plate assembly is in the first rotational position.

15. The semiconductor processing apparatus of claim 14, further comprising a plurality of gas distribution assemblies, each gas distribution assembly mounted to the top plate so as to seal one of the apertures and having a plurality of gas distribution ports located on a surface thereof facing toward the pedestals when the top plate assembly is in either the first configuration or the second configuration and also in the first rotational position.

16. The semiconductor processing apparatus of claim 1, further comprising a detent system including one or more engagement mechanisms and one or more receiver features, wherein:

one of a) the one or more engagement mechanisms and b) the one or more receiver features is fixedly mounted with respect to the top plate assembly and the other of a) of the one or more engagement mechanisms and b) the one or more receiver features is fixedly mounted with respect to the chamber housing, each engagement mechanism is configured to transition between an engaged configuration and a disengaged configuration, and the one or more engagement mechanisms and the one or more receiver features are positioned such that when the top plate assembly is in the first rotational position, at least one of the one or more engagement mechanisms i) is configured to be able to be transitioned from the disengaged configuration to the engaged configuration, ii) is engaged with one of the one or more receiver features when in the engaged configuration, and iii) prevents the top plate assembly from rotating relative to the chamber housing while engaged with the receiver feature of the one or more receiver features.

17. The semiconductor processing apparatus of claim 1, further comprising:

a top assembly;

one or more vertical lift actuators;

one or more locking actuators; and one or more lift features, wherein:

the one or more lift features are part of the top plate assembly, the one or more vertical lift actuators are configured to vertically translate the top assembly between at least a seated position and a first elevated position, the one or more locking actuators are positioned so as to be releasably engageable with the one or more lift features when the top assembly is in the seated position, and the top plate assembly translates with the top assembly when the top assembly is translated from the seated position to the first elevated position by the one or more vertical lift actuators and the one or more locking features are engaged with the one or more lift features.

18. The semiconductor processing apparatus of claim 17, further comprising:

a support structure that is part of the top plate assembly and extends upward from the top plate assembly; and a bearing seat that is part of the top assembly, wherein:

the one or more vertical lift actuators are further configured to also vertically translate the top assembly between the first elevated position and a second elevated position higher than the first elevated position, the rotational bearing mechanism is located in between the bearing seat and an uppermost end of the support structure, the rotational bearing mechanism is compressively loaded by the bearing seat and the support structure during translation of the top assembly between the first elevated position and the second elevated position, and the top plate assembly is in the second configuration when the top assembly is at the second elevated position and not supporting the top plate assembly.

19. The semiconductor processing apparatus of claim 17, wherein:

the top plate assembly includes a top plate with a plurality of apertures therethrough, and each pedestal aligns with a corresponding different one of the apertures when the top plate assembly is in the first rotational position.

20. The semiconductor processing apparatus of claim 19, further comprising a plurality of gas distribution assemblies, each gas distribution assembly mounted to the top plate so as to seal one of the apertures and having a plurality of gas distribution ports located on a surface thereof facing toward the pedestals when the top plate assembly is in either the first configuration or the second configuration and also in the first rotational position.

* * * * *